(12) United States Patent
Kim et al.

(10) Patent No.: US 11,538,973 B2
(45) Date of Patent: Dec. 27, 2022

(54) DISPLAY DEVICE AND METHOD OF FABRICATING THE SAME

(71) Applicant: Samsung Display Co., Ltd., Yongin-si (KR)

(72) Inventors: Kyung Bae Kim, Yongin-si (KR); Mee Hye Jung, Yongin-si (KR); Chong Chul Chai, Yongin-si (KR)

(73) Assignee: SAMSUNG DISPLAY CO. LTD., Yongin-si (KR)

( * ) Notice: Subject to any disclaimer, the term of this patent is extended or adjusted under 35 U.S.C. 154(b) by 207 days.

(21) Appl. No.: 16/891,016

(22) Filed: Jun. 2, 2020

(65) Prior Publication Data
US 2020/0403131 A1    Dec. 24, 2020

(30) Foreign Application Priority Data
Jun. 21, 2019    (KR) .................... 10-2019-0074277

(51) Int. Cl.
*H01L 33/62* (2010.01)
*H01L 33/24* (2010.01)
(Continued)

(52) U.S. Cl.
CPC .............. *H01L 33/62* (2013.01); *G09G 3/32* (2013.01); *H01L 25/0753* (2013.01); *H01L 33/005* (2013.01); *H01L 33/14* (2013.01); *H01L 33/24* (2013.01); *G09G 2310/0267* (2013.01); *G09G 2310/0275* (2013.01)

(58) Field of Classification Search
CPC ... H01L 33/62; H01L 25/0753; H01L 33/005; H01L 33/14; H01L 33/24; H01L 25/167; H01L 33/44; H01L 33/20; H01L 27/15; H01L 27/156; H01L 27/124; H01L 27/1259; G09G 3/32; G09G 2310/0267; G09G 2310/0275; G09G 2300/0426
See application file for complete search history.

(56) References Cited

U.S. PATENT DOCUMENTS 8,785,937 B2 * 7/2014 Lee ..................... H01L 27/3248
257/59
10,008,645 B2    6/2018 Bonar et al.
(Continued)

FOREIGN PATENT DOCUMENTS

KR    10-2017-0094930    8/2017
KR    10-1968592    4/2019

*Primary Examiner* — Victor A Mandala
(74) *Attorney, Agent, or Firm* — Kile Park Reed & Houtteman PLLC

(57) ABSTRACT

A display device includes a substrate and pixels. The substrate includes: a display area including pixel areas, each including a first area and a second area; and a non-display area enclosing at least one side of the display area. The pixels are disposed on the pixel areas, each pixel including light emitting elements. Each pixel further includes: a pixel circuit part disposed on the first area and including at least one transistor and at least one capacitor; and a display element part disposed on the second area and including an emission area to emit light. Each of the pixel circuit part and the display element part has a multi-layer structure including one or more conductive layers and one or more insulating layers. At least one layer of the pixel circuit part and at least one layer of the display element part are disposed in a same layer.

19 Claims, 35 Drawing Sheets

(51) Int. Cl.
*G09G 3/32* (2016.01)
*H01L 33/00* (2010.01)
*H01L 25/075* (2006.01)
*H01L 33/14* (2010.01)

(56) References Cited

U.S. PATENT DOCUMENTS

| | | | |
|---|---|---|---|
| 10,373,985 B2 | 8/2019 | Kim et al. | |
| 2012/0007083 A1* | 1/2012 | You | H01L 29/41733 |
| | | | 257/E33.012 |
| 2012/0104397 A1* | 5/2012 | Choi | H01L 27/3265 |
| | | | 438/151 |
| 2013/0015456 A1* | 1/2013 | You | H01L 27/124 |
| | | | 257/E33.053 |
| 2013/0112975 A1* | 5/2013 | Choi | H01L 27/1259 |
| | | | 438/34 |
| 2013/0112976 A1* | 5/2013 | Kim | H01L 27/3288 |
| | | | 257/66 |
| 2013/0119388 A1* | 5/2013 | Lee | H01L 51/5265 |
| | | | 438/34 |
| 2013/0119392 A1* | 5/2013 | Park | H01L 27/326 |
| | | | 438/34 |
| 2013/0126882 A1* | 5/2013 | You | H01L 27/124 |
| | | | 257/E21.409 |
| 2013/0134424 A1* | 5/2013 | Kim | H01L 29/4908 |
| | | | 257/E21.409 |
| 2013/0153915 A1* | 6/2013 | Choi | H01L 51/5265 |
| | | | 257/89 |
| 2013/0313529 A1* | 11/2013 | Kim | H01L 27/1255 |
| | | | 438/34 |
| 2014/0042394 A1* | 2/2014 | Lee | H01L 29/786 |
| | | | 438/34 |
| 2014/0084264 A1* | 3/2014 | Lee | H01L 51/50 |
| | | | 438/34 |
| 2014/0346460 A1* | 11/2014 | Kang | H01L 27/3279 |
| | | | 438/23 |
| 2014/0346461 A1* | 11/2014 | Kim | H01L 29/66765 |
| | | | 257/40 |
| 2014/0353619 A1* | 12/2014 | Park | H01L 27/3265 |
| | | | 438/34 |
| 2015/0084008 A1* | 3/2015 | Park | H01L 27/3276 |
| | | | 438/34 |
| 2015/0108450 A1* | 4/2015 | Son | H01L 27/3276 |
| | | | 257/40 |
| 2017/0179092 A1 | 6/2017 | Sasaki et al. | |
| 2019/0074324 A1 | 3/2019 | Kim et al. | |
| 2019/0206972 A1* | 7/2019 | Park | H01L 27/1225 |
| 2021/0210612 A1* | 7/2021 | Kimura | H01L 27/1288 |

* cited by examiner

PXL1(PXA1)

PXL1(PXA1)

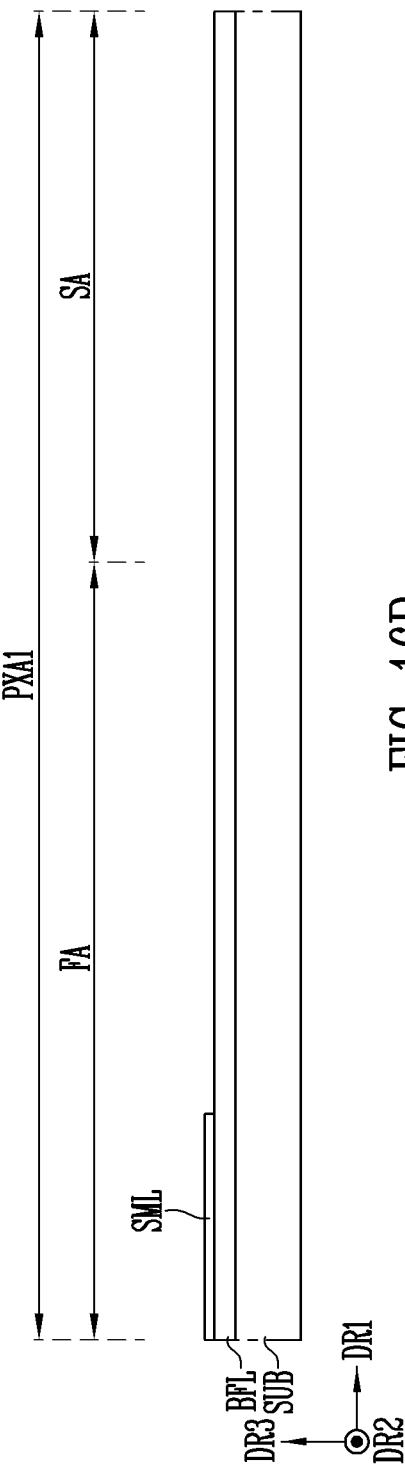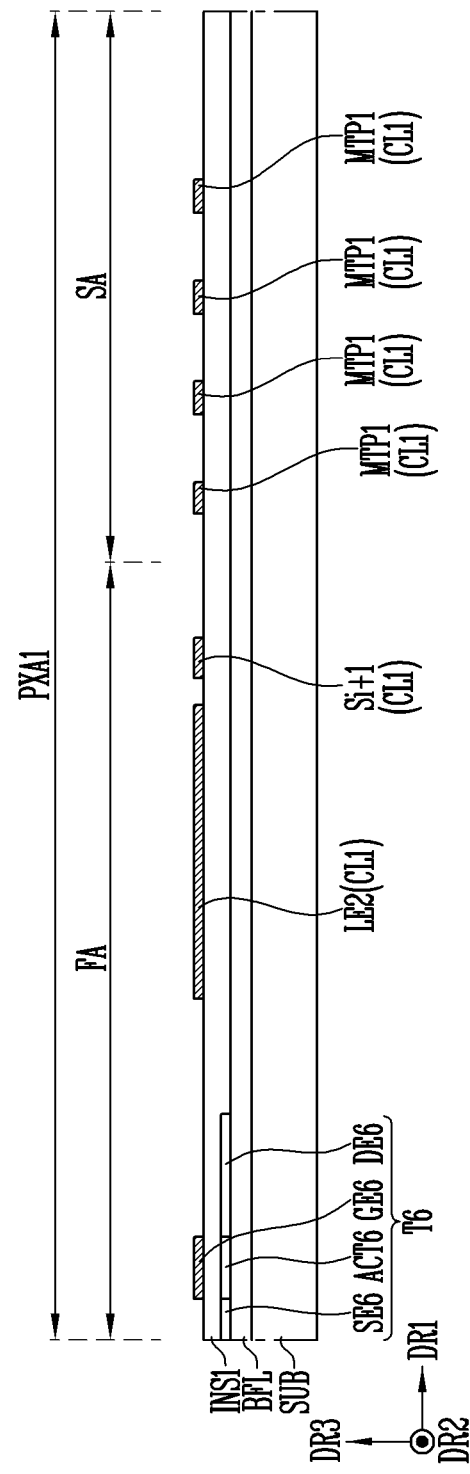

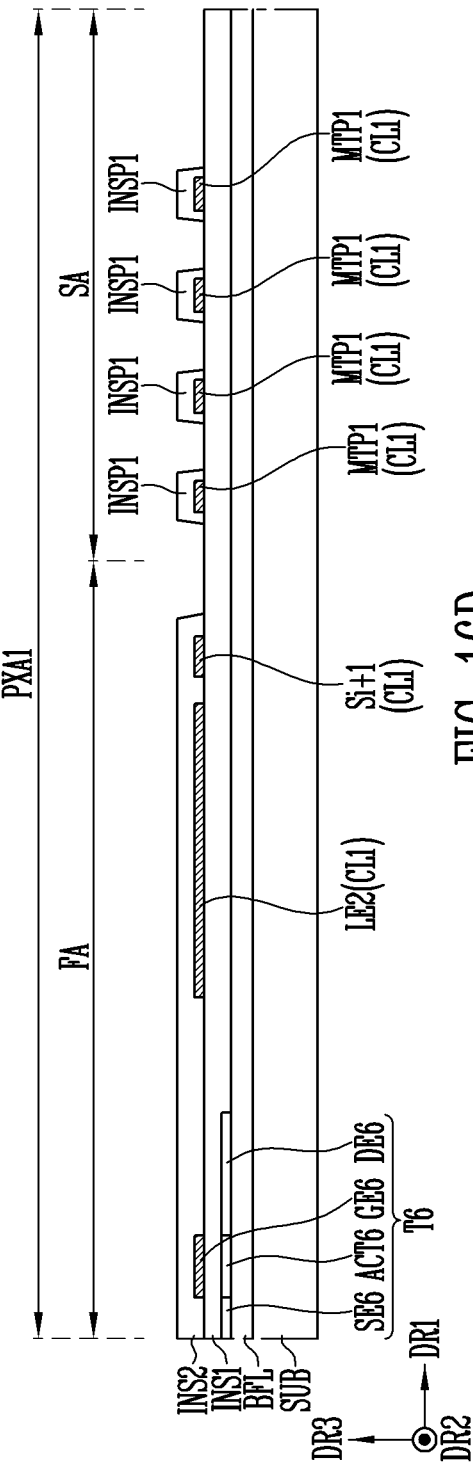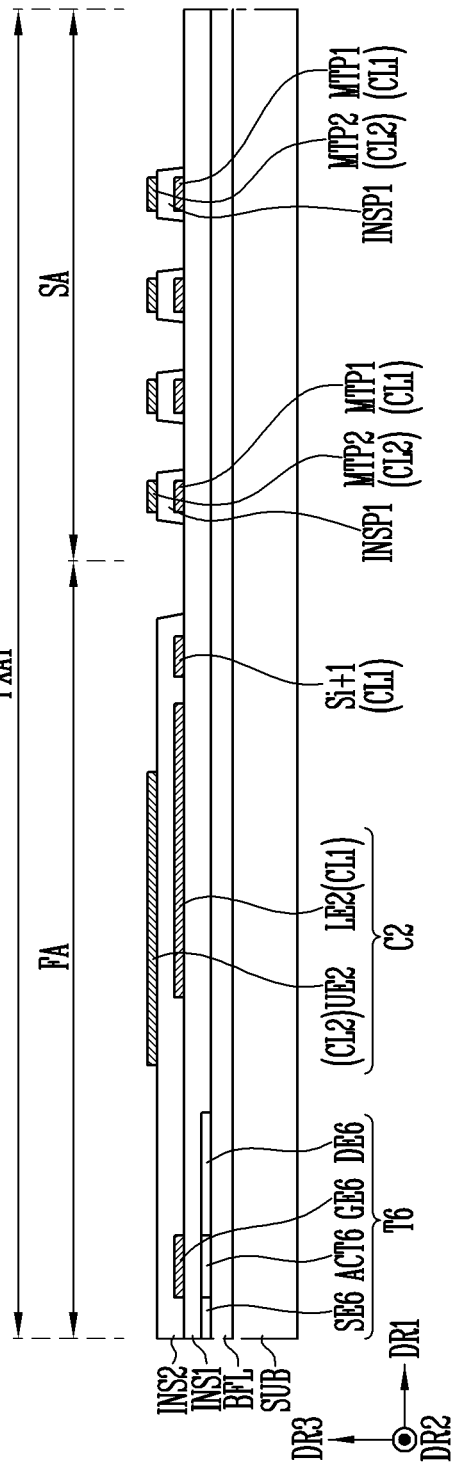

DISPLAY DEVICE AND METHOD OF FABRICATING THE SAME

CROSS-REFERENCE TO RELATED APPLICATION

This application claims priority to and the benefit of Korean Patent Application No. 10-2019-0074277, filed Jun. 21, 2019, which is hereby incorporated by reference for all purposes as if fully set forth herein.

BACKGROUND

Field

Various embodiments generally relate to a display device and a method of fabricating the display device.

Discussion

A light emitting diode (LED) may have relatively satisfactory durability even under poor environmental conditions, and have excellent performance in terms of lifetime and luminance characteristics. To apply the LED to a lighting device, a display device, or the like, the LED is typically coupled an electrode so that the voltage of a power supply may be applied to the LED. With regard to application purposes of the LED, a method of reducing space for the electrode, and a method of fabricating the LED, various research on arrangement relationships between the LED and the electrode has been conducted.

The above information disclosed in this section is only for understanding the background of the inventive concepts, and, therefore, may contain information that does not form prior art.

SUMMARY

Some aspects are capable of providing a display device in which light emitting elements are intensively disposed in a target area so that light output efficiency may be enhanced and a number of masks to fabricate the display device is reduced so that a process of fabricating the display device may be facilitated.

Some aspects are capable of providing a method of fabricating a display device in which light emitting elements are intensively disposed in a target area so that light output efficiency may be enhanced and a number of masks to fabricate the display device is reduced so that a process of fabricating the display device may be facilitated.

Additional aspects will be set forth in the detailed description which follows, and, in part, will be apparent from the disclosure, or may be learned by practice of the inventive concepts.

According to some aspects, a display device includes a substrate and pixels. The substrate includes a display area and a non-display area. The display area includes pixel areas, each pixel area among the pixel areas including a first area and a second area. The non-display area encloses at least one side of the display area. The pixels are disposed on the pixel areas. Each pixel among the pixels includes light emitting elements. Each pixel among the pixel further includes a pixel circuit part and a display element part. The pixel circuit part is disposed on the first area. The pixel circuit part includes at least one transistor and at least one capacitor. The display element part is disposed on the second area. The display element part includes an emission area configured to emit light. Each of the pixel circuit part and the display element part has a multi-layer structure including one or more conductive layers and one or more insulating layers. At least one layer of the pixel circuit part and at least one layer of the display element part are disposed in a same layer.

According to some aspects, a method of manufacturing a display device includes forming a pixel including a pixel area. The pixel area includes first and second areas. Forming the pixel includes: forming, in the first area, a pixel circuit part including at least one transistor and at least one capacitor; and forming, in the second area, a display element part including light emitting elements. Each of the pixel circuit part and the display element part has a multi-layer structure including one or more conductive layers and one or more insulating layers. At least one layer of the pixel circuit part and at least one layer of the display element part are formed through a same process.

According to various aspects, a pixel circuit part and a display element part may be disposed on an identical surface of a substrate, whereby a thickness of a display device may be reduced.

Furthermore, in various embodiments, components included in a pixel circuit part and components included in a display element part may be formed through a same process, whereby a process of fabricating a display device may be facilitated.

The foregoing general description and the following detailed description are explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

FIGS. 16A, 16B, 16C, 16D, 16E, 16F, 16G, 16H, 16I, 16J, and 16K are sectional views of the first pixel of FIG. 9 at various stages of manufacture according to some embodiments.

DETAILED DESCRIPTION OF THE ILLUSTRATED EMBODIMENTS

Figure 1A:
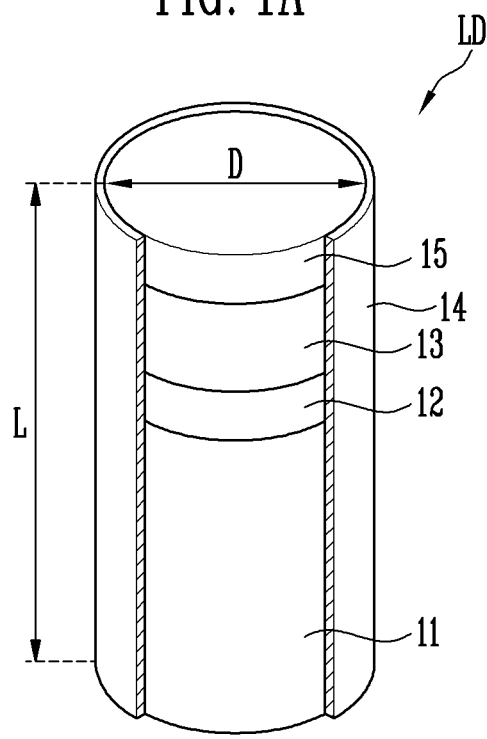
FIG. 1A is a perspective view schematically illustrating a light emitting element according to an embodiment.

In the following description, for the purposes of explanation, numerous specific details are set forth in order to provide a thorough understanding of various embodiments. As used herein, the terms "embodiments" and "implementations" are used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 1B:
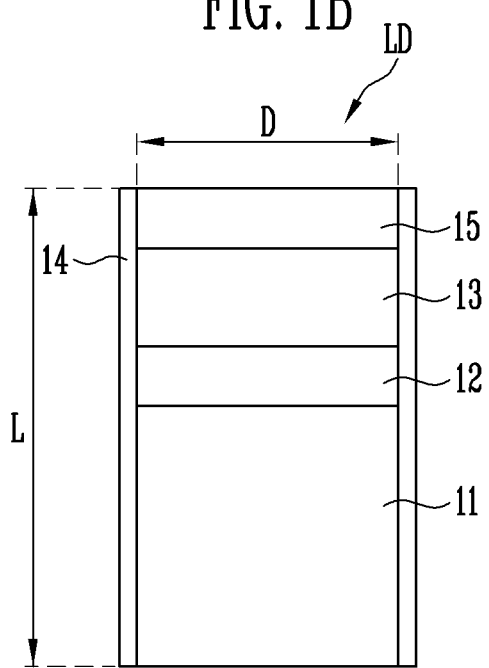
FIG. 1B is a sectional view illustrating the light emitting element of FIG. 1A according to an embodiment.
Figure 2A:
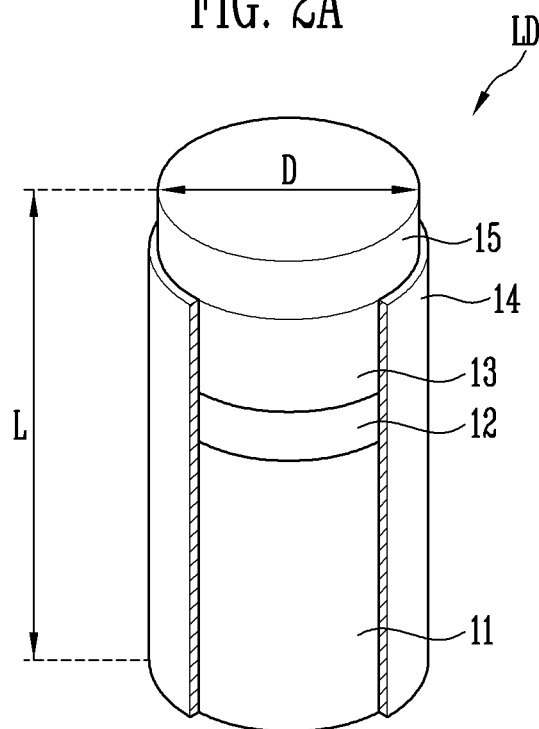
FIG. 2A is a perspective view schematically illustrating a light emitting element according to an embodiment.
Figure 2B:
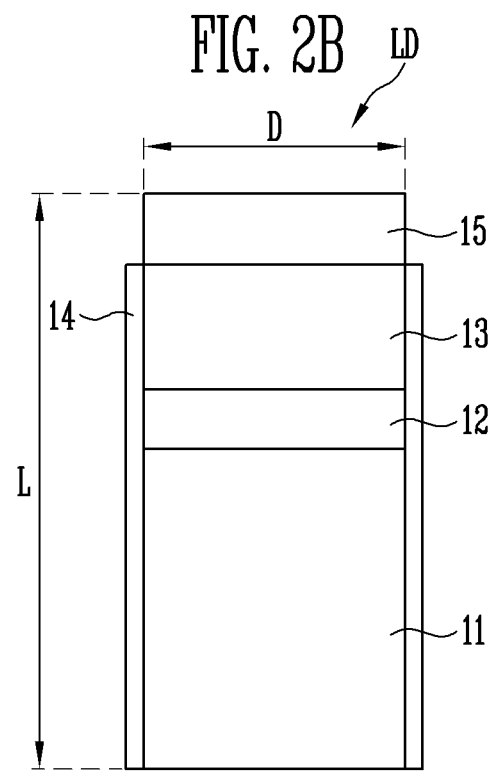
FIG. 2B is a sectional view illustrating the light emitting element of FIG. 2A according to an embodiment.
Figure 3A:
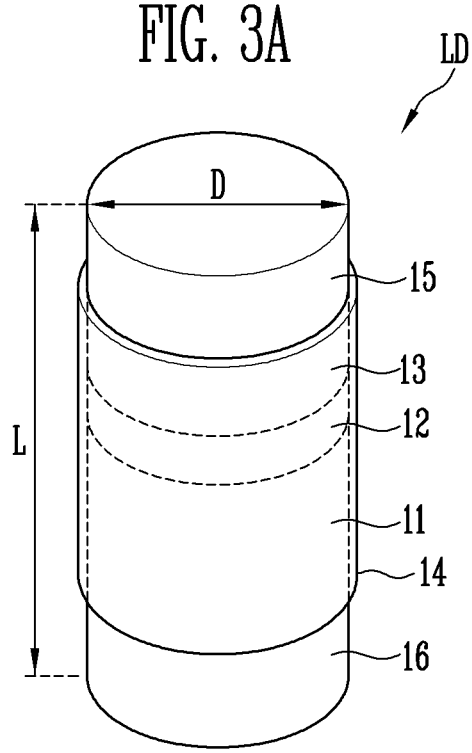
FIG. 3A is a perspective view schematically illustrating a light emitting element according to an embodiment.
Figure 3B:
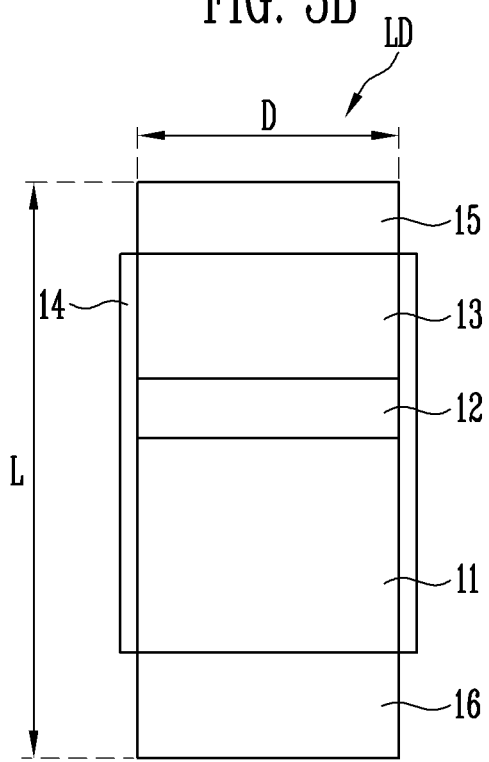
FIG. 3B is a sectional view illustrating the light emitting element of FIG. 3A according to an embodiment.
Figure 4A:
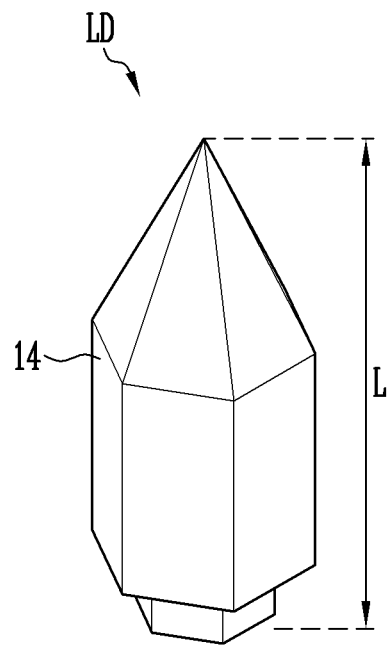
FIG. 4A is a perspective view schematically illustrating a light emitting element according to an embodiment.
Figure 4B:
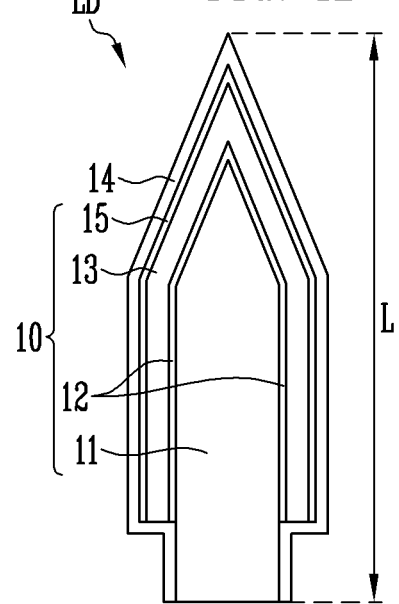
FIG. 4B is a sectional view illustrating the light emitting element of FIG. 4A according to an embodiment.

FIG. 1A is a perspective view schematically illustrating a light emitting element LD according to an embodiment. FIG. 1B is a sectional view illustrating the light emitting element LD of FIG. 1A according to an embodiment. FIG. 2A is a perspective view schematically illustrating a light emitting element LD according to an embodiment. FIG. 2B is a sectional view illustrating the light emitting element LD of FIG. 2A according to an embodiment. FIG. 3A is a perspective view schematically illustrating a light emitting element LD according to an embodiment. FIG. 3B is a sectional view illustrating the light emitting element LD of FIG. 3A according to an embodiment. FIG. 4A is a perspective view schematically illustrating a light emitting element LD according to an embodiment. FIG. 4B is a sectional view illustrating the light emitting element LD of FIG. 4A according to an embodiment.

For the sake of explanation, a light emitting element LD fabricated by an etching method will be described with reference to FIGS. 1A, 1B, 2A, 2B, 3A, and 3B, and then a light emitting element LD fabricated by a growth method will be described with reference to FIGS. 4A and 4B. In an embodiment, the type and/or shape of the light emitting element LD is not limited to the embodiments illustrated in FIGS. 1A, 1B, 2A, 2B, 3A, 3B, 4A, and 4B.

Referring to FIGS. 1A, 1B, 2A, 2B, 3A, and 3B, the light emitting element LD may include a first semiconductor layer 11, a second semiconductor layer 13, and an active layer 12 interposed between the first and second semiconductor layers 11 and 13. For example, the light emitting element LD may be implemented as an emissive stack formed by successively stacking the first semiconductor layer 11, the active layer 12, and the second semiconductor layer 13.

In an embodiment, the light emitting element LD may be formed in a shape extending in one direction. If the direction in which the light emitting element LD extends is defined as a longitudinal direction, the light emitting element LD may have a first end and a second end in the extension direction. Any one of the first and second semiconductor layers 11 and 13 may be disposed on one end of the light emitting element LD, and the other one of the first and second semiconductor layers 11 and 13 may be disposed on the other end of the light emitting element LD.

The light emitting element LD may have various shapes. For example, the light emitting element LD may have a rod-like shape or a bar-like shape extending in the longitudinal direction (i.e., to have an aspect ratio greater than 1). In an embodiment, a length L of the light emitting element LD with respect to the longitudinal direction may be greater than a diameter (D, or a width of a cross-section) thereof. The light emitting element LD may include a light emitting diode fabricated to have a small size, e.g., with a length L and/or a diameter D corresponding to a microscale or a nanoscale. In various embodiments, the shape of the light emitting element LD may be changed so as to meet requirements (or design conditions) of a lighting device or a self-emissive display device.

The first semiconductor layer 11 may include, for example, at least one n-type semiconductor layer. For instance, the first semiconductor layer 11 may include an n-type semiconductor layer which includes any one semiconductor material, such as at least one of InAlGaN, GaN, AlGaN, InGaN, AlN, and InN, and is doped with a first conductive dopant, such as Si, Ge, or Sn. However, the material forming the first semiconductor layer 11 is not limited to these materials, and the first semiconductor layer 11 may be formed of various other materials.

The active layer 12 may be disposed on the first semiconductor layer 11 and have a single or multiple quantum well structure. The location of the active layer 12 may be changed in various ways depending on the type of the light emitting element LD. The active layer 12 may emit light having a wavelength ranging from 400 nm to 900 nm, and use a double heterostructure. In an embodiment, a cladding layer (not shown) doped with a conductive dopant may be formed on and/or under the active layer 12. For example, the cladding layer may be formed of an ALGaN layer or an InALGaN layer. In an embodiment, a material, such as AlGaN or AlInGaN, may be used to form the active layer 12, and various other materials may be used to form the active layer 12.

If an electric field of a predetermined voltage or more is applied to opposite ends of the light emitting element LD, the light emitting element LD emits light by coupling of electron-hole pairs in the active layer 12. Since light emission of the light emitting element LD can be controlled based on the foregoing principle, the light emitting element LD may be used as a light source of various light emitting devices as well as a pixel of the display device.

The second semiconductor layer 13 may be disposed on the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes any one semiconductor material of InAlGaN, GaN, AlGaN, InGaN, AlN, and InN, and is doped with a second conductive dopant such as Mg. However, the material forming the second semiconductor layer 13 is not limited to this, and the second semiconductor layer 13 may be formed of various other materials.

In an embodiment, the first semiconductor layer 11 and the second semiconductor layer 13 may have different widths (or thicknesses) with respect to the longitudinal direction (L) of the light emitting element LD. For example, the first semiconductor layer 11 may have a width (or a thickness) greater than that of the second semiconductor layer 13 with respect to the longitudinal direction (L) of the light emitting element LD. Hence, as illustrated in FIGS. 1A to 3B, the active layer 12 of the light emitting element LD may be disposed at a position closer to an upper surface of the second semiconductor layer 13 than to a lower surface of the first semiconductor layer 11.

In an embodiment, the light emitting element LD may further include an additional electrode 15 disposed on the second semiconductor layer 13, as well as including the first semiconductor layer 11, the active layer 12, and the second semiconductor layer 13. In an embodiment, as shown in FIGS. 3A and 3B, the light emitting element LD may further include an additional electrode 16 disposed on one end of the first semiconductor layer 11, e.g., a lower end of first semiconductor layer 11.

Although each of the additional electrodes 15 and 16 may be formed of an ohmic contact electrode, embodiments are not limited thereto. Furthermore, each of the additional electrodes 15 and 16 may include metal or a metal oxide. For example, at least one of chrome (Cr), titanium (Ti), aluminum (Al), gold (Au), nickel (Ni), indium tin oxide (ITO), and an oxide or alloy thereof may be used alone or in combination with each other. However, embodiments are not limited thereto.

Materials included in the respective additional electrodes 15 and 16 may be equal to or different from each other. The additional electrodes 15 and 16 may be transparent or semitransparent. Therefore, light generated from the light emitting element LD may pass through the additional electrodes 15 and 16 and then be emitted outside the light emitting element LD. In some embodiments, in the case where light generated from the light emitting element LD is emitted outside the light emitting element LD through a region other than the opposite ends of the light emitting element LD rather than passing through the additional electrodes 15 and 16, the additional electrodes 15 and 16 may include opaque metal.

In an embodiment, the light emitting element LD may further include an insulating layer 14. However, in some embodiments, the insulating layer 14 may be omitted, or may be provided to cover only some of the first semiconductor layer 11, the active layer 12, and the second semiconductor layer 13.

The insulating layer 14 may prevent (or mitigate) the active layer 12 from short-circuiting due to making contact with a conductive material except the first semiconductor layer 11 and the second semiconductor layer 13. Furthermore, thanks to the insulating layer 14, occurrence of a defect on the surface of the light emitting element LD may be reduced (e.g., minimized), whereby the lifetime and efficiency of the light emitting element LD may be improved. In a case where a plurality of light emitting elements LD are disposed in close contact with each other, the insulating layer 14 may prevent (or mitigate) an undesired short-circuit from occurring between the light emitting elements LD. Whether the insulating layer 14 is provided is not limited so long as the active layer 12 can be prevented from short-circuiting with external conductive material.

As illustrated in FIGS. 1A and 1B, the insulating layer 14 may be provided in a shape enclosing an overall outer circumferential surface of the emissive stack including the first semiconductor layer 11, the active layer 12, the second semiconductor layer 13, and the additional electrode 15. For the sake of explanation, FIG. 1A illustrates the insulating layer 14 with a portion being removed. The first semiconductor layer 11, the active layer 12, the second semiconductor layer 13, and the additional electrode 15 that are included in the light emitting element LD may be enclosed by the insulating layer 14.

Although in the above-mentioned embodiment the insulating layer 14 has been described as enclosing the overall outer circumferential surface of the first semiconductor layer 11, the active layer 12, the second semiconductor layer 13, and the additional electrode 15, embodiments are not limited thereto.

In some embodiments, such as illustrated in FIGS. 2A and 2B, the insulating layer 14 may enclose the outer circumferential surfaces of the first semiconductor layer 11, the active layer 12, and the second semiconductor layer 13, and may not enclose the outer circumferential surface of the additional electrode 15 disposed on the second semiconductor layer 13, or may enclose only a portion of the outer circumferential surface of the additional electrode 15 without enclosing another portion of the outer circumferential surface of the additional electrode 15. Here, the insulating layer 14 may allow at least the opposite ends of the light emitting element LD to be exposed to the outside. For example, the insulating layer 14 may allow not only the additional electrode 15 disposed on one end of the second semiconductor layer 13, but also one end of the first semiconductor layer 11 to be exposed to the outside. In an embodiment, such as illustrated in FIGS. 3A and 3B, in the case where the additional electrodes 15 and 16 are disposed on the respective opposite ends of the light emitting element LD, the insulating layer 14 may allow at least a portion of each of the additional electrodes 15 and 16 to be exposed to the outside. Alternatively, in some embodiments, the insulating layer 14 may not be provided.

In an embodiment, the insulating layer 14 may include a transparent insulating material. For example, the insulating layer 14 may include at least one insulating material selected from the group consisting of $SiO_2$, $Si_3N_4$, $Al_2O_3$, and $TiO_2$, but it is not limited thereto. In other words, various materials having insulating properties may be employed.

If the insulating layer 14 is provided on the light emitting element LD, the active layer 12 may be prevented from short-circuiting with a first and/or second electrode (not illustrated). Furthermore, thanks to the insulating layer 14, occurrence of a defect on the surface of the light emitting element LD may be minimized, whereby the lifetime and efficiency of the light emitting element LD may be improved. In the case where a plurality of light emitting elements LD are disposed in close contact with each other, the insulating layer 14 may prevent an undesired short-circuit from occurring between the light emitting elements LD.

The light emitting element LD described above may be employed as a light source for various display devices. The light emitting element LD may be fabricated through a surface treatment process. For example, the light emitting element LD may be surface-treated so that, when a plurality of light emitting elements LD are mixed with a fluidic solution (or solvent) and then supplied to each emission area (e.g., an emission area of each pixel or an emission area of each sub-pixel), the light emitting diodes LD can be evenly distributed rather than unevenly aggregating in the solution.

A light emitting device including at least one of the light emitting elements LD described above may be used in various devices including a display device that utilizes a light source. For instance, in the case where a plurality of light emitting elements LD are disposed in the emission area of each pixel of a display panel, the light emitting elements LD may be used as a light source of the pixel. However, the application field of the light emitting element LD is not limited to the above-mentioned examples. For example, the light emitting element LD may also be used in various devices such as a lighting device, which utilizes a light source.

Next, a light emitting element LD fabricated by the growth method will be described with reference to FIGS. 4A and 4B.

The following description of the light emitting element LD fabricated by the growth method will be focused on differences from the above-mentioned embodiments, and components of the light emitting element LD that are not separately explained in the following description may comply with that of the preceding embodiments. To this end, the same reference numerals will be used to designate the same components, and similar reference numerals will be used to designate similar components.

Referring to FIGS. 4A and 4B, the light emitting element LD according to an embodiment may include a first semiconductor layer 11, a second semiconductor layer 13, and an active layer 12 interposed between the first and second semiconductor layers 11 and 13. In some embodiments, the light emitting element LD may include an emission pattern 10 having a core-shell structure. The emission pattern 10 may include a first semiconductor layer 11 disposed in a central portion of the light emitting element LD, an active layer 12 that encloses at least one side of the first semiconductor layer 11, a second semiconductor layer 13 that encloses at least one side of the active layer 12, and an additional electrode 15 that encloses at least one side of the second semiconductor layer 13.

The light emitting element LD may be formed in a poly-pyramid shape extending in one direction. For example, the light emitting element LD may have a hexagonal pyramid shape. If the direction in which the light emitting element LD extends is defined as a longitudinal direction (L), the light emitting element LD may have a first end (or a lower end) and a second end (or an upper end) in the longitudinal direction (L). A portion of any one of the first and second semiconductor layers 11 and 13 on the first end (or the lower end) of the light emitting element LD may be exposed. A portion of another one of the first and second semiconductor layers 11 and 13 on the second end (or the upper end) of the light emitting element LD may be exposed. For example, a portion of the first semiconductor layer 11 on the first end (or the lower end) of the light emitting element LD may be exposed, and a portion of the second semiconductor layer 13 on the second end (or the upper end) of the light emitting element LD may be exposed. In an embodiment, in the case where the light emitting element LD includes the additional electrode 15, a portion of the additional electrode 15 that encloses at least one side of the second semiconductor layer 13 on the second end (or the upper end) of the light emitting element LD may be exposed.

In an embodiment, the first semiconductor layer 11 may be disposed in a core, e.g., a central (or middle) portion, of the light emitting element LD. The light emitting element LD may have a shape corresponding to the shape of the first semiconductor layer 11. For instance, if the first semiconductor layer 11 has a hexagonal pyramid shape, the light emitting element LD and the emission pattern 10 each may also have a hexagonal pyramid shape.

The active layer 12 may be provided and/or formed in a shape enclosing the outer circumferential surface of the first semiconductor layer 11 in the longitudinal shape (L) of the light emitting element LD. In detail, the active layer 12 may be provided and/or formed in a shape enclosing an area of the first semiconductor layer 11, other than a lower end of the opposite ends of the first semiconductor layer 11, in the longitudinal direction (L) of the light emitting element LD.

The second semiconductor layer 13 may be provided and/or formed in a shape enclosing the active layer in the longitudinal direction (L) of the light emitting element LD, and may include a semiconductor layer having a type different from that of the first semiconductor layer 11. For example, the second semiconductor layer 13 may include at least one p-type semiconductor layer.

In an embodiment, the light emitting element LD may include the additional electrode 15 that encloses at least one side of the second semiconductor layer 13. The additional electrode 15 may be an ohmic contact electrode electrically coupled to the second semiconductor layer 13, but embodiments are not limited thereto.

As described above, the light emitting element LD may have a hexagonal pyramid shape with the opposite ends protruding outward, and may be implemented as the emission pattern 10 with a core-shell structure including the first semiconductor layer 11 provided in the central portion thereof, the active layer 12 which encloses the first semiconductor layer 11, the second semiconductor layer 13 which encloses the active layer 12, and the additional electrode 15 which encloses the second semiconductor layer 13. The first semiconductor layer 11 may be disposed on the first end (or the lower end) of the light emitting element LD having a hexagonal pyramid shape, and the additional electrode 15 may be disposed on the second end (or the upper end) of the light emitting element LD.

In an embodiment, the light emitting element LD may further include an insulating layer 14 provided on the outer circumferential surface of the emission pattern 10 having a core-shell structure. The insulating layer 14 may include transparent insulating material.

Figure 5A:
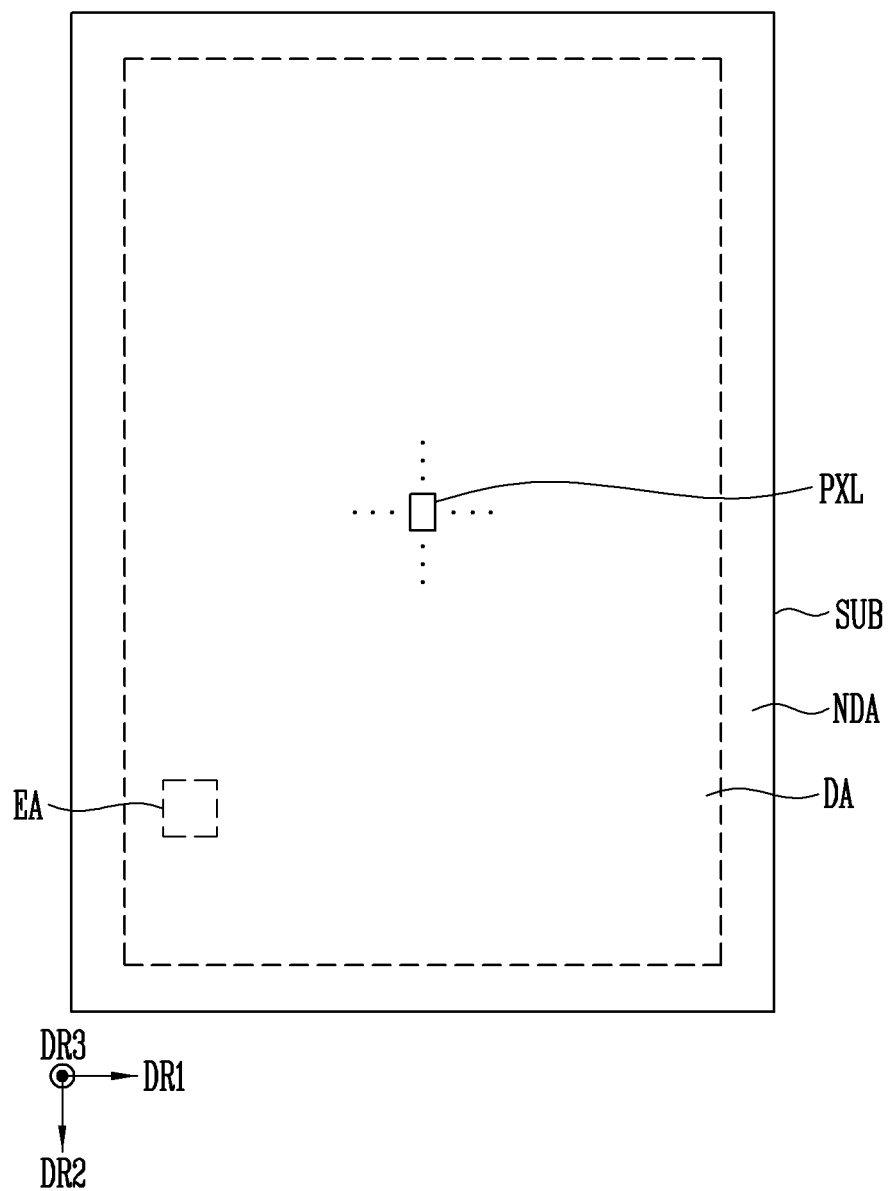
FIG. 5A illustrates a display device, and more particularly, a schematic plan view of a display device using, as a light source, any one of the light emitting elements illustrated in FIGS. 1A, 1B, 2A, 2B, 3A, 3B, 4A, and 4B according to an embodiment.

FIG. 5A illustrates a display device, and more particularly, a schematic plan view of a display device using, as a light source, any one of the light emitting elements illustrated in FIGS. 1A, 1B, 2A, 2B, 3A, 3B, 4A, and 4B according to an embodiment.

For the sake of explanation, FIG. 5A schematically illustrates the structure of the display device, focused on a display area on which an image is displayed. In some embodiments, although not illustrated, at least one driving circuit (e.g., a scan driver and a data driver) and/or a plurality of lines may be further provided in the display device.

Referring to FIGS. 1A, 1B, 2A, 2B, 3A, 3B, 4A, 4B, and 5A, the display device according to some embodiments may include a substrate SUB, a plurality of pixels PXL that are provided on the substrate SUB and each of which includes at least one light emitting element LD, a driver (not illustrated) provided on the substrate SUB and configured to drive the pixels PXL, and a line part (not illustrated) provided to couple the pixels PXL to the driver.

Display devices may be classified into a passive-matrix type display device and an active-matrix type display device according to a driving method. For example, in the case where the display device in accordance with an embodiment is implemented as an active-matrix type, each of the pixels PXL may include a driving transistor configured to control the amount of current to be supplied to the light emitting element LD, and a switching transistor configured to transmit data signals to the driving transistor.

Some active-matrix type display devices may be capable of selectively turning on each pixel PXL taking into account the resolution, the contrast, and the working speed; however, embodiments are not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central portion of the display device, and the non-display area NDA may be disposed outside the display area DA, e.g., in a perimeter portion of the display device in such a way as to enclose the display area DA. The locations of the display area DA and the non-display area NDA are not limited to this, and the locations thereof may be changed.

The display area DA may be an area in which the pixels PXL for displaying an image are provided. The non-display area NDA may be an area in which the driver for driving the pixels PXL and some of the line part for coupling the pixels PXL to the driver are provided.

The display area DA may have various shapes. For example, the display area DA may be provided in a closed polygonal shape including linear sides. Alternatively, the display area DA may be provided in a circular and/or elliptical shape including a curved side. As a further alternative, the display device DA may be provided in various shapes, such as a semi-circular shape and a semi-elliptical shape including a linear side and a curved side.

The non-display area NDA may be provided on at least one side of the display area DA. In an embodiment, the non-display area NDA may enclose the periphery (or the edge) of the display area DA.

The substrate SUB may include transparent insulating material to allow light transmission.

The substrate SUB may be a rigid substrate. For example, the rigid substrate SUB may be at least one of a glass substrate, a quartz substrate, a glass ceramic substrate, and a crystalline glass substrate.

The substrate SUB may be a flexible substrate. Here, the flexible substrate SUB may be either a film substrate or a plastic substrate that includes a polymer organic material. For example, the flexible substrate SUB may include at least one of polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, materials constituting the substrate SUB may be changed, and include, for example, fiber reinforced plastic (FRP).

An area on the substrate SUB is provided as the display area DA in which the pixels PXL are disposed, and the other area thereof is provided as the non-display area NDA. For example, the substrate SUB may include the display area DA including a plurality of pixel areas on which the respective pixels PXL are formed, and the non-display area NDA disposed around the display area DA.

The pixels PXL may be disposed in the display area DA on the substrate SUB. In an embodiment, the pixels PXL may be arranged in the display area DA in a stripe or a pentile arrangement structure, but embodiments are not limited thereto.

Each of the pixels PXL may include at least one light emitting element LD configured to be driven in response to a corresponding scan signal and a corresponding data signal. The light emitting element LD may have a small size corresponding to a microscale or a nanoscale and may be coupled in parallel to light emitting elements LD disposed adjacent thereto, but embodiments are not limited thereto. The light emitting element LD may form a light source of the corresponding pixel PXL.

Each of the pixels PXL may include at least one light source driven by a predetermined signal (e.g., a scan signal and a data signal) and/or a predetermined power supply (e.g., a first driving power supply and a second driving power supply). For example, each of the pixels PXL may include a light emitting element LD, such as least one of the embodiments descried in association with FIGS. 1A to 4B, e.g., at least one subminiature light emitting element LD having a small size corresponding to a nanoscale or a microscale. However, in some embodiments, the type of the light emitting element LD that may be used as a light source of each of the pixels PXL is not limited thereto.

In an embodiment, the color, the type, and/or the number of pixels PXL are not particularly limited. For example, the color of light emitted from each pixel PXL may be changed in various ways.

The driver may provide a predetermined signal and a predetermined power supply to each of the pixels PXL through the line part, and thus, control the operation of the pixel PXL. For the sake of explanation, in FIG. 5A, the line part is omitted.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Figure 5B:
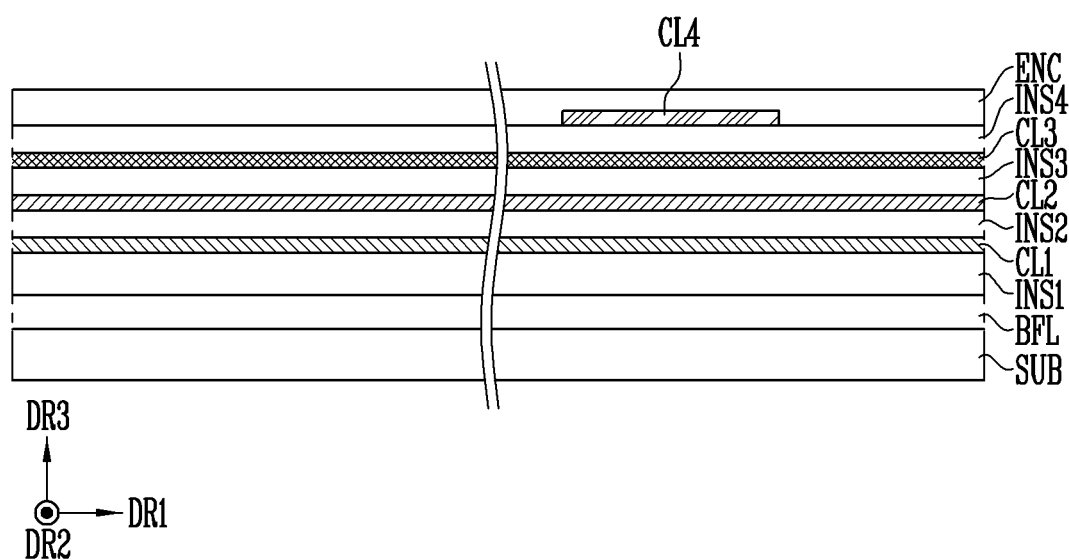
FIG. 5B is a schematic sectional view illustrating the display device of FIG. 5A according to an embodiment.

FIG. 5B is a schematic sectional view illustrating the display device of FIG. 5A according to an embodiment.

Referring to FIGS. 1A, 1B, 2A, 2B, 3A, 3B, 4A, 4B, 5A, and 5B, the display device in accordance with some embodiments may include the substrate SUB, first to fourth insulating layers INS1 to INS4 provided over the substrate SUB, and first to fourth conductive layers CL1 to CL4 provided over the substrate SUB.

The display device may further include an encapsulation layer ENC, which is provided over the fourth insulating layer INS4 and the fourth conductive layer CL4.

The first insulating layer INS1 may be provided and/or formed over the substrate SUB. In the case where a buffer layer BFL is provided on the substrate SUB, the first insulating layer INS1 may be provided and/or formed on the buffer layer BFL.

The first insulating layer INS1 may have a single-layer structure, or a multi-layer structure in which a plurality of layers are stacked in a thickness direction, e.g., the third direction DR3. The first insulating layer INS1 may be formed of an inorganic insulating layer including an inorganic material or an organic insulating layer including an organic material. The inorganic insulating layer may include, for example, at least one of aluminum oxide, titanium oxide, silicon oxide, silicon nitride, silicon oxynitride, zirconium oxide, and hafnium oxide. The organic insulating layer may include, for example, at least one of acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin.

The first conductive layer CL1 may be provided and/or formed on the first insulating layer INS1. The first conductive layer CL1 may have a single-layer structure or a multi-layer structure. The first conductive layer CL1 may include a conductive material. For example, the conductive material may include, e.g., a metal or transparent conductive oxide. In an embodiment, if the first conductive layer CL1 has a single-layer structure, the first conductive layer CL1 may include a metal layer or a transparent conductive layer. The metal layer may include at least one of molybdenum, silver, titanium, copper, and aluminum, or an alloy of at least one of them. The transparent conductive layer may include a transparent conductive oxide, such as at least one of indium tin oxide (ITO), indium zinc oxide (IZO), zinc oxide (ZnO), and indium tin zinc oxide (ITZO). In addition, the transparent conductive layer may include at least one of poly(3,4-ethylenedioxythiophene) (PEDOT), metal nanowires, and graphene.

If the first conductive layer CL1 has a multi-layer structure, the first conductive layer CL1 may include a plurality of metal layers. For example, the plurality of metal layers may form a three-layer structure of titanium/aluminum/titanium, but embodiments are not limited thereto. Alternatively, the first conductive layer CL1 may have a multi-layer structure including a single metal layer and a transparent conductive layer, or a multi-layer structure including a plurality of metal layers and a transparent conductive layer.

The second insulating layer INS2 may be provided and/or formed on the first conductive layer CL1 and covers the first conductive layer CL1. The second insulating layer INS2 may have a material equal to or different from that of the first insulating layer INS1. For example, the second insulating layer INS2 may include an inorganic insulating layer including an inorganic material, or an organic insulating layer including an organic material.

The second conductive layer CL2 may be provided and/or formed on the second insulating layer INS2. The second conductive layer CL2 may have a single-layer structure or a multi-layer structure. The second conductive layer CL2 may have a material equal to or different from that of the first conductive layer CL1. For example, the second conductive layer CL2 may include a conductive material.

The third insulating layer INS3 may be provided and/or formed on the second conductive layer CL2 and covers the second conductive layer CL2. The third insulating layer INS3 may have a material equal to or different from that of the first and second insulating layers INS1 and INS2. For example, the third insulating layer INS3 may include an inorganic insulating layer including an inorganic material, or an organic insulating layer including an organic material.

The third conductive layer CL3 may be provided and/or formed on the third insulating layer INS3. The third conductive layer CL3 may have a single-layer structure or a multi-layer structure. The third conductive layer CL3 may have a material equal to or different from that of the first and second conductive layers CL1 and CL2. For example, the third conductive layer CL3 may include a conductive material.

The fourth insulating layer INS4 may be provided and/or formed on the third conductive layer CL3 and covers the third conductive layer CL3. The fourth insulating layer INS4 may have a material equal to or different from that of the first to third insulating layers INS1 to INS3. For example, the fourth insulating layer INS4 may be formed of an organic insulating layer including an organic material.

The fourth conductive layer CL4 may be provided and/or formed on the fourth insulating layer INS4. The fourth conductive layer CL4 may have a single-layer structure or a multi-layer structure. The fourth conductive layer CL4 may have a material equal to or different from that of the first to third conductive layers CL1 to CL3. For example, the fourth conductive layer CL4 may include a conductive material.

The encapsulation layer ENC may be provided and/or formed on the fourth conductive layer CL4 and the fourth insulating layer INS4. The encapsulation layer ENC may be formed of a single layer or multiple layers. The encapsulation layer ENC may include a plurality of insulating layers that cover the light emitting elements LD included in the respective pixels PXL. The encapsulation layer ENC may include at least one inorganic layer and at least one organic layer. For example, the encapsulation layer ENC may have a structure formed by alternately stacking inorganic layers and organic layers.

FIGS. 6A, 6B, 6C, 6D, and 6E are various circuit diagrams illustrating electrical connection relationships of components included in a pixel illustrated in the display device of FIG. 5A according to some embodiments.

For example, FIGS. 6A to 6E illustrate different embodiments of electrical connection relationships between components included in a pixel PXL that may be employed in an active display device. However, the types of the components included in the pixel PXL to which embodiments may be applied are not limited thereto.

In FIGS. 6A to 6E, not only the components included in each of the pixels illustrated in FIG. 5A, but also an area in which the components are provided is embraced in the definition of the term "pixel PXL." In an embodiment, each pixel PXL illustrated in FIGS. 6A to 6E may be any one of the pixels PXL provided as part of the display device of FIG. 5A. The pixels PXL may have substantially the same or similar structure.

For the sake of explanation, an emission unit EMU including a plurality of light emitting elements LD coupled in parallel to each other will be described with reference to FIGS. 6A to 6D, and then an emission unit EMU including at least one serial stage having light emitting elements LD coupled in parallel to each other will be described with reference to FIG. 6E.

Referring to FIGS. 1A to 4B, 5A, 5B, and 6A to 6D, each pixel (PXL, hereinafter referred to as "pixel") may include an emission unit EMU configured to generate light having a luminance corresponding to a data signal. The pixel PXL may selectively further include a pixel circuit 144 configured to drive the emission unit EMU.

In an embodiment, the emission unit EMU may include a plurality of light emitting elements LD coupled between a first power supply line PL1 to which a first driving power supply VDD (e.g., first driving power supply VDD voltage) is applied and a second power supply line PL2 to which a second driving power supply VSS (e.g., second driving power supply VSS voltage) is applied. For example, the emission unit EMU may include a first electrode EL1 (or "first array electrode") coupled to the first driving power supply VDD via the pixel circuit 144 and the first power line PL1, a second electrode EL2 (or "second array electrode") coupled to the second driving power supply VSS through the second power supply line PL2, and a plurality of light emitting elements LD coupled in parallel to each other between the first and second electrodes EL1 and EL2. In an embodiment, the first electrode EL1 may be an anode electrode, and the second electrode EL2 may be a cathode electrode.

In an embodiment, each of the light emitting elements LD included in the emission unit EMU may include a first end coupled to the first driving power supply VDD through the first electrode ELL and a second end coupled to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value greater than or equal to a threshold voltage of the light emitting elements LD during an emission period of the pixel PXL.

As described above, the light emitting elements LD that are coupled in parallel to each other between the first electrode EL1 and the second electrode EL2 to which voltages having different potentials are respectively supplied may form respective valid light sources. The valid light sources may be collected to form the emission unit EMU of the pixel PXL.

The light emitting elements LD of the emission unit EMU may emit light having a luminance corresponding to a driving current supplied thereto through the pixel circuit 144. For example, during each frame period, the pixel circuit 144 may supply a driving current corresponding to a gray scale of corresponding frame data to the emission unit EMU. The driving current supplied to the emission unit EMU may be divided into the light emitting elements LD coupled in parallel to each other. Hence, each of the light emitting elements LD may emit light having a luminance corresponding to current applied thereto so that the emission unit EMU may emit light having a luminance corresponding to the driving current.

Figure 6A:
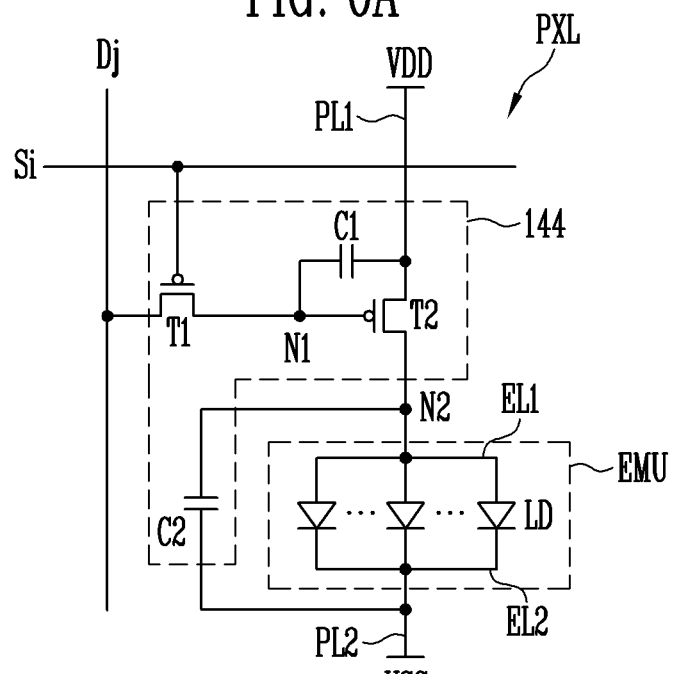
FIGS. 6A, 6B, 6C, 6D, and 6E are various circuit diagrams illustrating electrical connection relationships of components included in a pixel illustrated in the display device of FIG. 5A according to some embodiments.
Figure 6B:
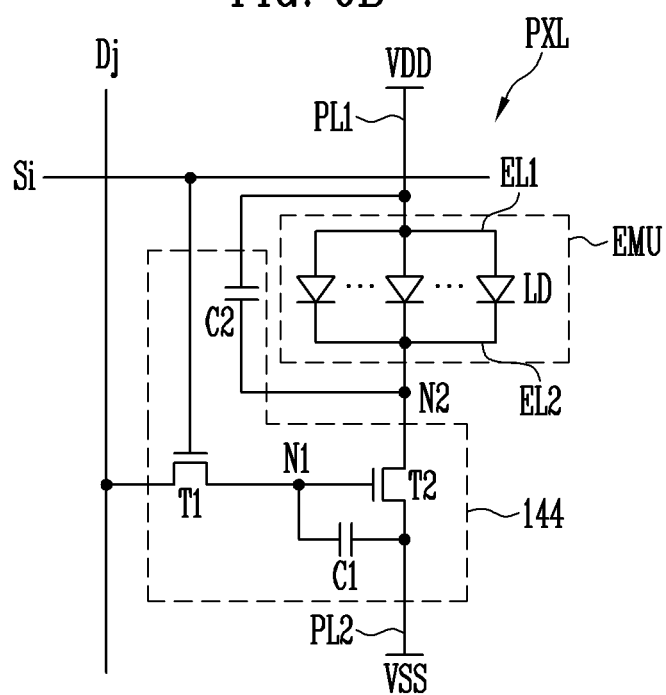
Figure 6C:
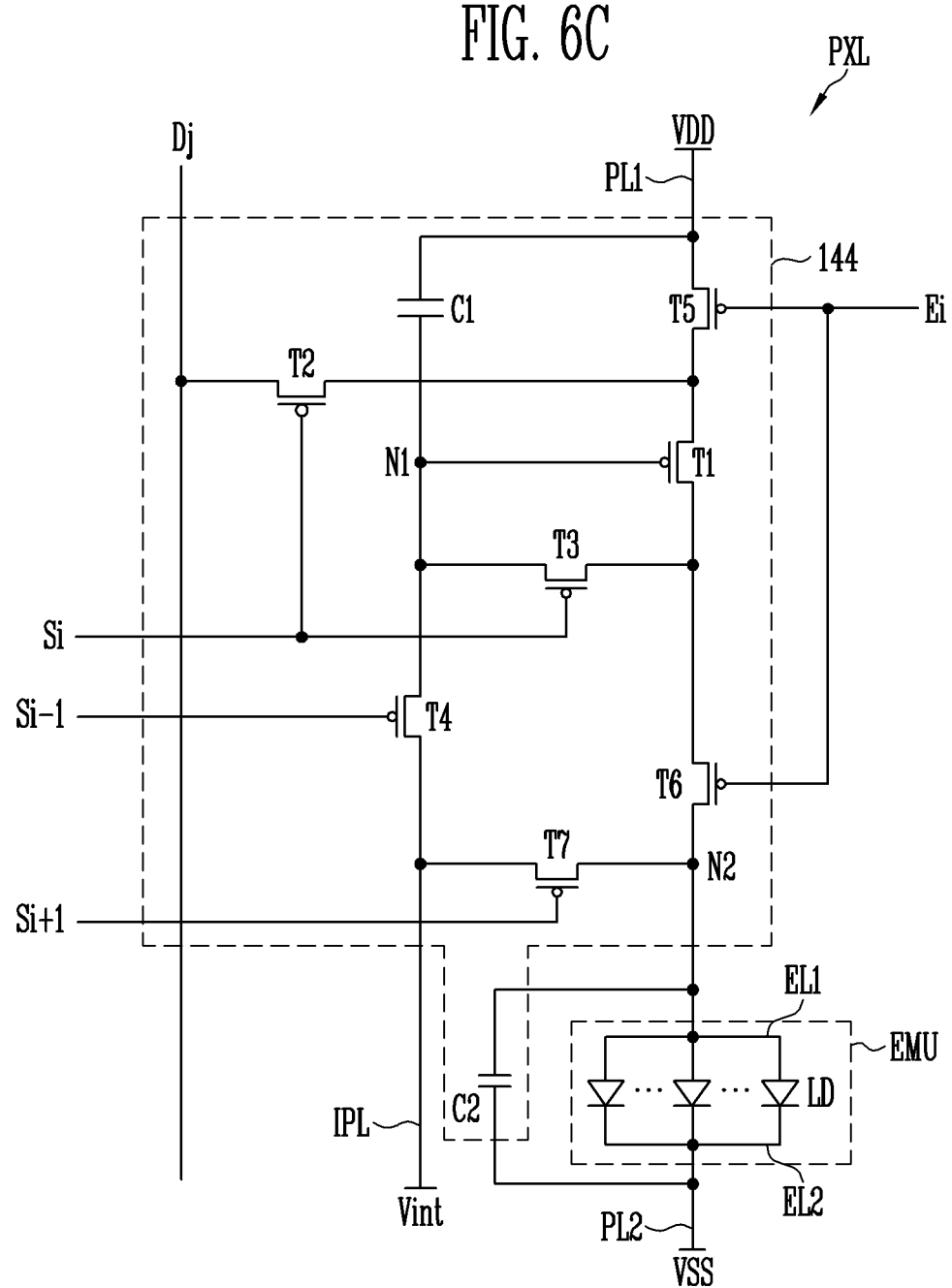
Figure 6D:
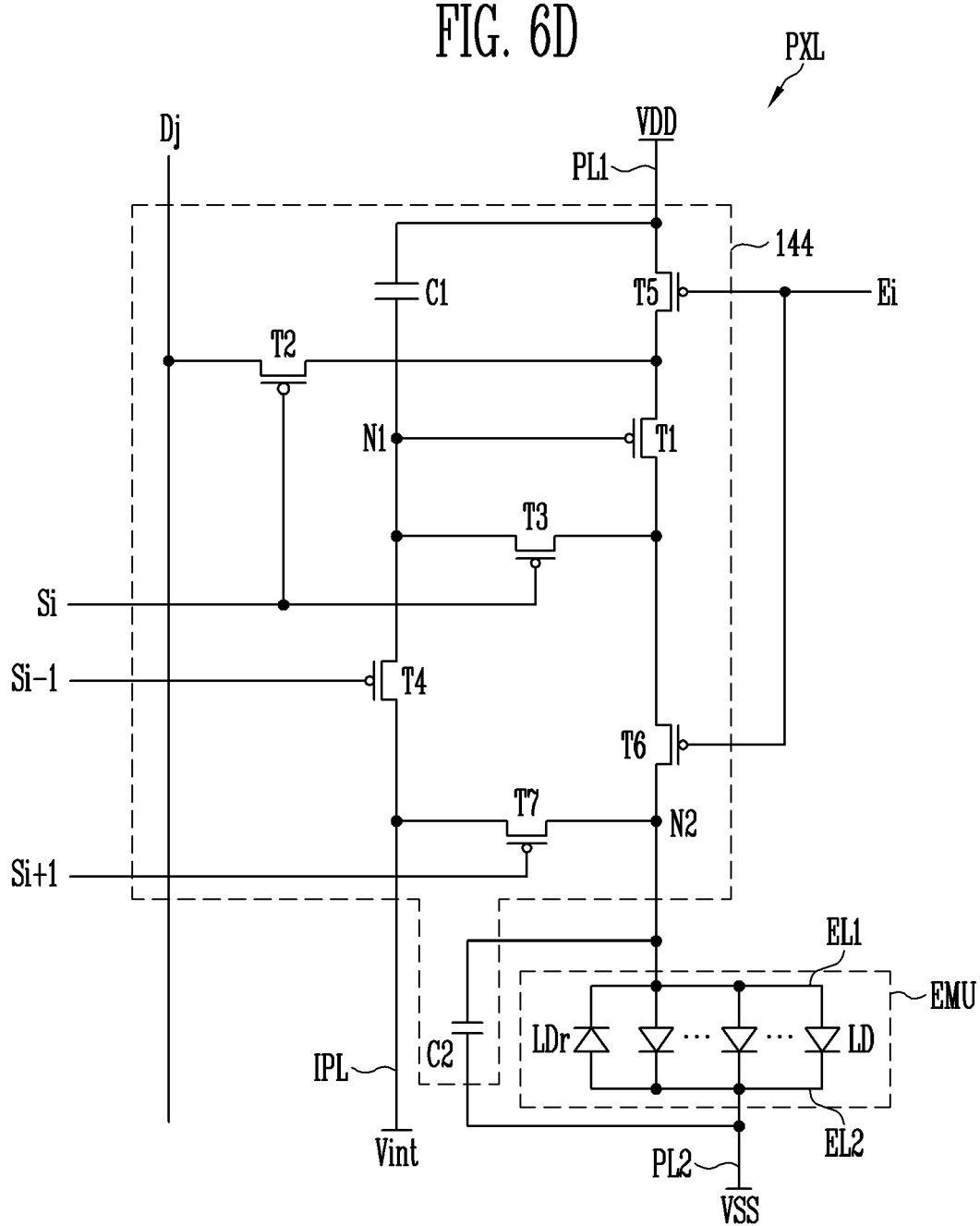
Figure 6E:
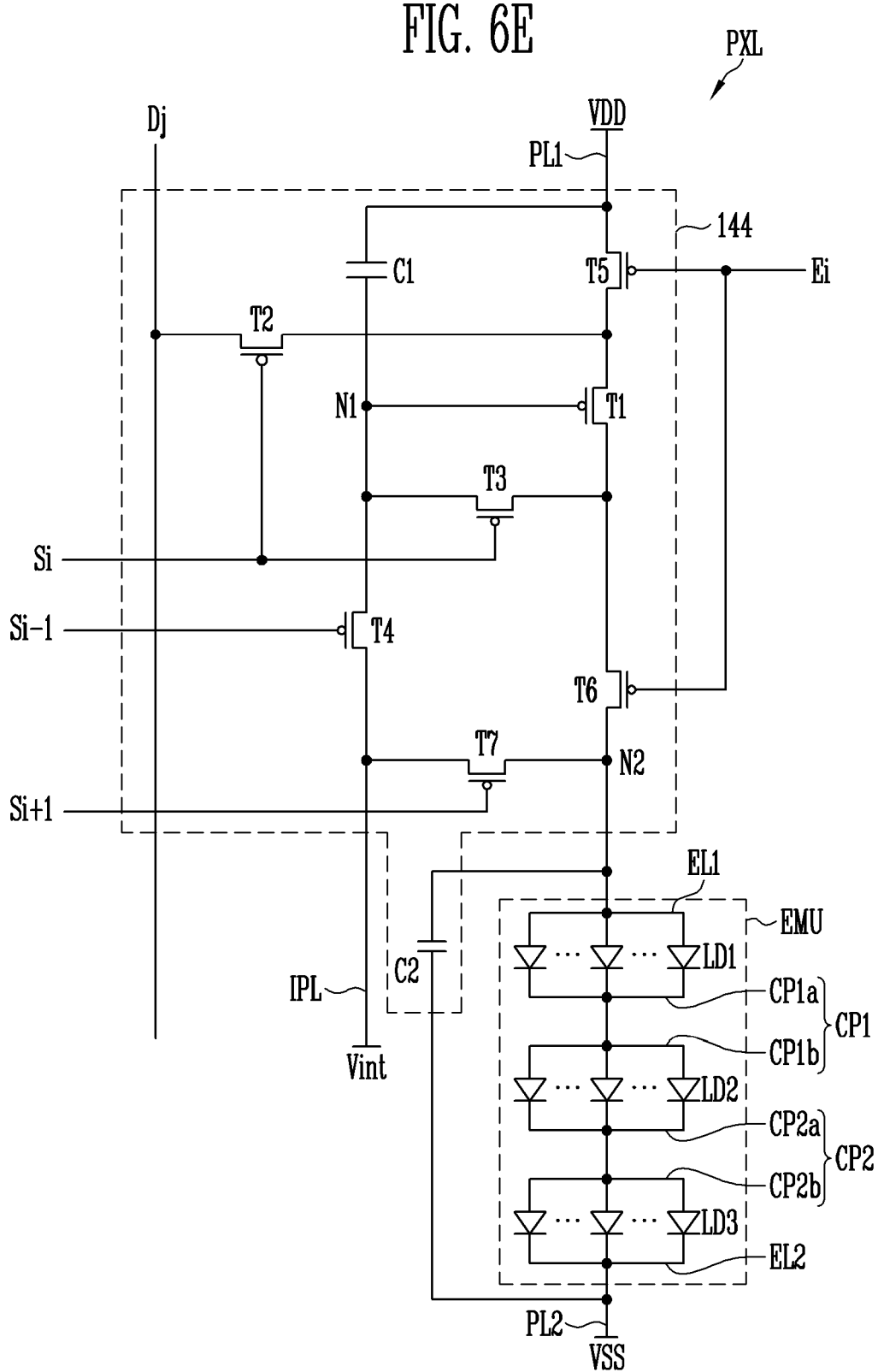

Although FIGS. 6A to 6D illustrate embodiments in which the light emitting elements LD are coupled in parallel to each other between the first and second driving power supplies VDD and VSS, but embodiments are not limited thereto. In an embodiment, the emission unit EMU may further include at least one invalid light source, as well as include the light emitting elements LD that form the respective valid light sources. For example, as illustrated in FIG. 6D, at least one reverse light emitting element LDr may be further coupled between the first and second electrodes EL1 and EL2 of the emission unit EMU. The reverse light emitting element LDr, along with the light emitting elements LD that form the valid light sources, may be coupled in parallel to each other between the first and second electrodes EL1 and EL2. Here, the reverse light emitting element LDr may be coupled between the first and second electrodes EL1 and EL2 in a direction opposite to that of the light emitting elements LD. Even when a predetermined driving voltage (e.g., a forward direction driving voltage) is applied between the first and second electrodes EL1 and EL2, the reverse light emitting element LDr remains deactivated. Hence, current substantially does not flow through the reverse light emitting element LDr.

The pixel circuit 144 may be coupled to a scan line Si and a data line Dj of the corresponding pixel PXL. For example, if the pixel PXL is disposed on an i-th row (where i is a natural number) and a j-th column (where j is a natural number) of the display area DA, the pixel circuit 144 of the pixel PXL may be coupled to an i-th scan line Si and a j-th data line Dj of the display area DA. In an embodiment, as illustrated in FIGS. 6A and 6B, the pixel circuit 144 may include first and second transistors T1 and T2 and first and second capacitors C1 and C2. The structure of the pixel circuit 144 is not limited to the embodiments illustrated in FIGS. 6A and 6B.

The first transistor (switching transistor) T1 may include a first terminal coupled to the data line Dj, and a second terminal coupled to a first node N1. Here, the first terminal and the second terminal of the first transistor T1 are different from each other, and, for example, if the first terminal is a source electrode, and the second terminal is a drain electrode. A gate electrode of the first transistor T1 may be coupled to the scan line Si.

When a scan signal having a voltage (e.g., a low-level voltage) capable of turning on the first transistor T1 is supplied from the scan line Si, the first transistor T1 is turned on to electrically couple the data line Dj with the first node N1. Here, a data signal of a corresponding frame is supplied to the data line Dj, whereby the data signal is transmitted to the first node N1. A first capacitor C1 may store the difference potential voltage between the first driving power supply VDD and the data signal voltage.

The second transistor (driving transistor) T2 may include a first terminal coupled to the first driving power supply VDD, and a second terminal electrically coupled to the first electrode EL1 for the light emitting elements LD. A gate electrode of the second transistor T2 may be coupled to the first node N1. The second transistor T2 may control the amount of driving current to be supplied to the light emitting elements LD in response to the voltage of the first node N1.

The first capacitor C1 may have a first electrode coupled to the first driving power supply VDD, and a second electrode coupled to the first node N1. The first capacitor C1 may charge a voltage corresponding to the difference voltage between the first driving power supply VDD and the data signal supplied to the first node N1, and maintain the charged voltage until a data signal of a subsequent frame is supplied.

The second capacitor C2 may have a first electrode coupled to the second node N2, and a second electrode coupled to the second power supply line PL2. The second capacitor C2 may reduce coupling of the light emitting elements LD of the emission unit EMU.

FIGS. 6A and 6B each illustrate the pixel circuit 144 including the first transistor T1 configured to transmit a data signal to the pixel PXL, the first capacitor C1 configured to store the data signal, the second transistor T2 configured to supply driving current to the light emitting elements LD in response to the data signal, and the second capacitor C2 configured to reduce coupling of the light emitting elements LD.

However, embodiments are not limited thereto, and the structure of the pixel circuit 144 may be changed in various ways. For example, the pixel circuit 144 may further include at least one transistor element, such as a transistor element configured to compensate for the threshold voltage of the second transistor T2, a transistor element configured to initialize the first node N1, and/or a transistor element configured to control an emission time of the light emitting elements LD, or other circuit elements, such as a boosting capacitor for boosting the voltage of the first node N1.

Furthermore, although in FIG. 6A the transistors, e.g., the first and second transistors T1 and T2, included in the pixel circuit 144 have been illustrated as being formed of P-type transistors, embodiments are not limited thereto. In other words, at least one of the first and second transistors T1 and T2 included in the pixel circuit 144 may be changed to an N-type transistor.

Referring to FIGS. 1A to 4B, 5A, and 6B, the first and second transistors T1 and T2 according to an embodiment may be formed of N-type transistors. The configuration and operation of the pixel circuit 144 illustrated in FIG. 6B, other than a change in connection positions of some components due to a change in the type of transistor, are similar to those of the pixel circuit 144 of FIG. 6A. Therefore, detailed descriptions pertaining to this will be omitted.

In an embodiment, the configuration of the pixel circuit 144 is not limited to the embodiments illustrated in FIGS. 6A and 6B. For example, the configuration of the pixel circuit 144 may be similar to that of embodiments illustrated in FIGS. 6C and 6D.

As illustrated in FIGS. 6C and 6D, the pixel circuit 144 may be coupled to a scan line Si and a data line Dj of the pixel PXL. For example, if the pixel PXL is disposed on an i-th row and a j-th column of the display area DA, the pixel circuit 144 of the pixel PXL may be coupled to an i-th scan line Si and a j-th data line Dj of the display area DA.

In an embodiment, the pixel circuit 144 may also be coupled to at least one scan line. For example, the pixel PXL disposed on the i-th row of the display area DA may also be coupled to an i–1-th scan line Si–1 and/or an i+1-th scan line Si+1. In an embodiment, the pixel circuit 144 may be coupled not only to the first and second driving power supplies VDD and VSS, but also to a third power supply. For example, the pixel circuit 144 may also be coupled to an initialization power supply Vint.

The pixel circuit 144 may include first to seventh transistors T1 to T7 and first and second capacitors C1 and C2.

The first transistor (driving transistor) T1 may include a first electrode, e.g., a source electrode, coupled to the first driving power supply VDD via the fifth transistor T5, and a second electrode, e.g., a drain electrode, coupled to first ends of light emitting elements LD via the sixth transistor T6. A gate electrode of the first transistor T1 may be coupled to a first node N1. The first transistor T1 may control driving current flowing between the first driving power supply VDD and the second driving power supply VSS via the light emitting elements LD in response to the voltage of the first node N1.

The second transistor (switching transistor) T2 may be coupled between the j-th data line Dj coupled to the pixel PXL and the source electrode of the first transistor T1. A gate electrode of the second transistor T2 may be coupled to the i-th scan line Si coupled to the pixel PXL. When a scan signal having a gate-on voltage (e.g., a low-level voltage) is supplied from the i-th scan line Si, the second transistor T2 is turned on to electrically couple the j-th data line Dj to the source electrode of the first transistor T1. Hence, if the second transistor T2 is turned on, a data signal supplied from the j-th data line Dj may be transmitted to the first transistor T1.

The third transistor T3 may be coupled between the drain electrode of the first transistor T1 and the first node N1. A gate electrode of the third transistor T3 may be coupled to the i-th scan line Si. When a scan signal having a gate-on voltage is supplied from the scan line Si, the third transistor T3 may be turned on to electrically couple the drain electrode of the first transistor T1 to the first node N1.

The fourth transistor T4 may be coupled between the first node N1 and an initialization power supply line IPL to which the initialization power supply Vint is to be applied. A gate electrode of the fourth transistor T4 may be coupled to a preceding scan line, e.g., the i–1-th scan line Si–1. When a scan signal having a gate-on voltage is supplied to the i–1-th scan line Si–1, the fourth transistor T4 may be turned on so that the voltage of the initialization power supply Vint may be transmitted to the first node N1. Here, the initialization power supply Vint may have a voltage less than or equal to the minimum voltage of the data signal.

The fifth transistor T5 may be coupled between the first driving power supply VDD and the first transistor T1. A gate electrode of the fifth transistor T5 may be coupled to a corresponding emission control line, e.g., an i-th emission control line Ei. The fifth transistor T5 may be turned off when an emission control signal having a gate-off voltage is supplied to the i-th emission control line Ei, and may be turned on in other cases.

The sixth transistor T6 is coupled between the first transistor T1 and the first ends of the light emitting elements LD. A gate electrode of the sixth transistor T6 may be coupled to the i-th emission control line Ei. The sixth transistor T6 may be turned off when an emission control signal having a gate-off voltage is supplied to the i-th emission control line Ei, and may be turned on in other cases.

The seventh transistor T7 may be coupled between the initialization power supply line IPL and the first ends of the light emitting elements LD. A gate electrode of the seventh transistor T7 may be coupled to any one of scan lines of a subsequent stage, e.g., may be coupled to the i+1-th scan line Si+1. When a scan signal having a gate-on voltage is supplied to the i+1-th scan line Si+1, the seventh transistor T7 may be turned on so that the voltage of the initialization power supply Vint may be supplied to the first ends of light emitting elements LD.

The first capacitor C1 may be coupled between the first driving power supply VDD and the first node N1. The first capacitor C1 may store a voltage corresponding to the difference voltage between the data signal voltage applied to the first node N1 during each frame period and the threshold voltage of the first transistor T1.

The second capacitor C2 may be coupled between a second node N2 and a second power supply line PL2. The second capacitor C2 may reduce coupling of the light emitting elements LD of the emission unit EMU.

Although in FIGS. 6C and 6D the transistors, e.g., the first to seventh transistors T1 to T7, included in the pixel circuit 144 have been illustrated as being formed of P-type transistors, embodiments are not limited thereto. For example, at least one of the first to seventh transistors T1 to T7 may be changed to an N-type transistor.

The structure of the pixel PXL that may be utilized in association with one or more embodiments is not limited to the embodiments illustrated in FIGS. 6A through 6D, and the pixel PXL may have various structures. In an embodiment, each pixel PXL may be configured in a passive light emitting display device, or the like. In this case, the pixel circuit 144 may be omitted, and the opposite ends of the light emitting elements LD included in the emission unit EMU may be directly coupled to the scan lines Si−1, Si, and Si+1, the data linen Dj, the first power supply line PL1 to which the first driving power supply VDD is to be applied, the second power supply line PL2 to which the second driving power supply VSS is to be applied, and/or a predetermined control line.

Although FIGS. 6A to 6D illustrate embodiments in which all light emitting elements LD of each emission unit EMU are coupled in parallel to each other, embodiments are not limited thereto. In an embodiment, the emission unit EMU may include at least one serial stage including a plurality of light emitting elements LD coupled in parallel to each other. In other words, such as illustrated in FIG. 6E, the emission unit EMU may have a serial/parallel mixed structure. Although in FIG. 6E only the light emitting elements LD coupled between the first and second driving power supplies VDD and VSS in the same direction have been illustrated as being included in the emission unit EMU, embodiments are not limited thereto. In an embodiment, the pixel PXL illustrated in FIG. 6E may also include at least one reverse light emitting element LDr. However, in the case where the light emitting elements LD are arranged in a biased arrangement manner, even when at least one reverse light emitting element LDr is disposed in the pixel PXL, the number of reverse light emitting elements LDr may be less than the number of valid light sources, i.e., light emitting elements LD, disposed in the pixel PXL in the forward direction. Hereinafter, an emission unit EMU in accordance with an embodiment of FIG. 6E will be described, focused on light emitting elements LD that form valid light sources of the emission unit EMU.

Referring to FIGS. 1A to 4B, 5A, and 6E, the emission unit EMU of the pixel PXL may include a plurality of serial stages that are successively coupled to each other between the first and second driving power supplies VDD and VSS. Each of the serial stages may include one or more light emitting elements LD that are coupled in the forward direction between two electrodes that constitute an electrode pair of the corresponding serial stage. For example, the emission unit EMU may include first to third serial stages that are successively coupled between the first and second driving power supplies VDD and VSS. Each of the first to third serial stages may include two electrodes EL1 and CP1a, CP1b and CP2a, or CP2b and EL2 that constitute an electrode pair of the corresponding serial stage, and a plurality of light emitting elements LD that are coupled in parallel to each other between the two electrodes EL1 and CP1a, CP1b and CP2a, or CP2b and EL2 in the forward direction, e.g., in the same direction.

The first serial stage may include a first electrode EL1 and a 1a-th connection electrode CP1a among the electrodes EL1 and CP1a, CP1b and CP2a, and CP2b and EL2 that constitute the electrode pairs included in the emission unit EMU, and at least one first light emitting element LD1 coupled between the first electrode EL1 and the 1a-th connection electrode CP1a. For example, the first serial stage may include the first electrode EL1 coupled to the first driving power supply VDD via the pixel circuit 144, the 1a-th connection electrode CP1a that forms the electrode pair of the first serial stage along with the first electrode EL1 and coupled to the second driving power supply VSS, and a plurality of first light emitting elements LD1 coupled between the first electrode EL1 and the 1a-th connection electrode CP1a. A first end (e.g., a second semiconductor layer or a P-type end) of each of the first light emitting element LD1 may be electrically coupled to the first electrode EL1 of the first serial stage, and a second end (e.g., a first semiconductor layer or an N-type end) thereof may be electrically coupled to the 1a-th connection electrode CP1a of the first serial stage. The first light emitting elements LD1 may be coupled in parallel to each other between the first electrode EL1 and the 1a-th connection electrode CP1a of the first serial stage. The first light emitting elements LD1 may be coupled in the same direction (e.g., in the forward direction) between the first and second driving power supplies VDD and VSS through the first electrode EL1 and the 1a-th connection electrode CP1a.

The second serial stage may include a 1b-th connection electrode CP1b and a 2a-th connection electrode CP2a among the electrodes EL1 and CP1a, CP1b and CP2a, and CP2b and EL2 that constitute the electrode pairs included in the emission unit EMU, and at least one second light emitting element LD2 coupled between the 1b-th connection electrode CP1b and the 2a-th connection electrode CP2a. For example, the second serial stage may include the 1b-th connection electrode CP1b coupled to the first driving power supply VDD via the pixel circuit 144 and the first serial stage, the 2a-th connection electrode CP2a that forms the electrode pair of the second serial stage along with the 1b-th connection electrode CP1b and is coupled to the second driving power supply VSS, and a plurality of second light emitting elements LD2 coupled between the 1b-th connection electrode CP1b and the 2a-th connection electrode CP2a. A first end (e.g., a first semiconductor layer or an N-type end) of each of the second light emitting element LD2 may be electrically coupled to the 1b-th connection electrode CP1b of the second serial stage, and a second end (e.g., a second semiconductor layer or a P-type end) thereof may be electrically coupled to the 2a-th connection electrode CP2a of the second serial stage. The second light emitting elements LD2 may be coupled in parallel to each other between the 1b-th connection electrode CP1b and the 2a-th connection electrode CP2a of the second serial stage. The second light emitting elements LD2 may be coupled in the same direction (e.g., in the forward direction) between the first and second driving power supplies VDD and VSS through the 1b-th connection electrode CP1b and the 2a-th connection electrode CP2a.

In an embodiment, the 1a-th connection electrode CP1a of the first serial stage and the 1b-th connection electrode CP1b of the second serial stage may be provided integrally with each other and coupled to each other. In other words, the 1a-th connection electrode CP1a of the first serial stage and the 1b-th connection electrode CP1b of the second serial stage may form a first connection electrode CP1 for electrically coupling the first serial stage with the second serial stage. As described above, in the case where the 1a-th connection electrode CP1a of the first serial stage and the 1b-th connection electrode CP1b of the second serial stage are provided integrally with each other, the 1a-th connection electrode CP1a and the 1b-th connection electrode CP1b may be respectively different areas of the first connection electrode CP1.

The third serial stage may include a 2b-th connection electrode CP2b and a second electrode EL2 among the electrodes EL1 and CP1a, CP1b and CP2a, and CP2b and EL2 that constitute the electrode pairs included in the emission unit EMU, and at least one third light emitting element LD3 coupled between the 2b-th connection electrode CP2b and the second electrode EL2. For example, the third serial stage may include the 2b-th connection electrode CP2b coupled to the first driving power supply VDD via the pixel circuit 144 and the first and second serial stages, the second electrode EL2 that forms the electrode pair of the third serial stage along with the 2b-th connection electrode CP2b and is coupled to the second driving power supply VSS, and a plurality of third light emitting elements LD3 coupled between the 2b-th connection electrode CP2b and the second electrode EL2. A first end (e.g., a second semiconductor layer or a P-type end) of each of the third light emitting element LD3 may be electrically coupled to the 2b-th connection electrode CP2b of the third serial stage, and a second end (e.g., a first semiconductor layer or an N-type end) thereof may be electrically coupled to the second electrode EL2 of the third serial stage. The third light emitting elements LD3 may be coupled in parallel to each other between the 2b-th connection electrode CP2b and the second electrode EL2 of the third serial stage. The third light emitting elements LD3 may be coupled in the same direction (e.g., in the forward direction) between the first and second driving power supplies VDD and VSS through the 2b-th connection electrode CP2b and the second electrode EL2.

In an embodiment, the 2a-th connection electrode CP2a of the second serial stage and the 2b-th connection electrode CP2b of the third serial stage may be provided integrally with each other and coupled to each other. In other words, the 2a-th connection electrode CP2a of the second serial stage and the 2b-th connection electrode CP2b of the third serial stage may form a second connection electrode CP2 for electrically coupling the second serial stage with the third serial stage. As described above, in the case where the 2a-th connection electrode CP2a of the second serial stage and the 2b-th connection electrode CP2b of the third serial stage are provided integrally with each other, the 2a-th connection electrode CP2a and the 2b-th connection electrode CP2b may be respectively different areas of the second connection electrode CP2.

As described above, in the case of the emission unit EMU including the light emitting elements LD coupled to each other in the serial/parallel mixed structure, driving current/voltage conditions may be easily adjusted according to specifications of a product to which the emission unit EMU is applied.

For instance, in the emission unit EMU including the light emitting elements LD coupled to each other in the serial/parallel mixed structure, the driving current thereof may be reduced, compared to that of the emission unit EMU including the light emitting elements LD coupled in parallel to each other. Furthermore, in the emission unit EMU including the light emitting elements LD coupled to each other in the serial/parallel mixed structure, driving voltages to be applied to the opposite ends of the emission unit EMU may be reduced, compared to that of the emission unit EMU including the light emitting elements LD coupled in parallel to each other. In the case where all of the light emitting elements LD are coupled in series, if at least one of the light emitting elements LD coupled in series to each other is not correctly coupled in the forward direction, a path along which the driving current is able to flow in the pixel PXL is blocked, whereby a black spot defect may be caused. On the other hand, in the case where the light emitting elements LD are coupled to each other in the serial/parallel mixed structure, even if some light emitting elements LD in each serial stage are not correctly coupled in the forward direction or defects occur in some light emitting elements LD, the driving current allowed to flow through the other light emitting elements LD of the corresponding serial stage. Therefore, defects of the pixel PXL may be prevented or mitigated.

In the foregoing embodiments, the pixel PXL including the emission unit EMU having a three-stage serial/parallel mixed structure has been described for illustrative purposes, but embodiments are not limited thereto. For example, a pixel PXL in accordance with an embodiment may include an emission unit EMU having a four- or more-stage serial/parallel mixed structure.

Figure 7:
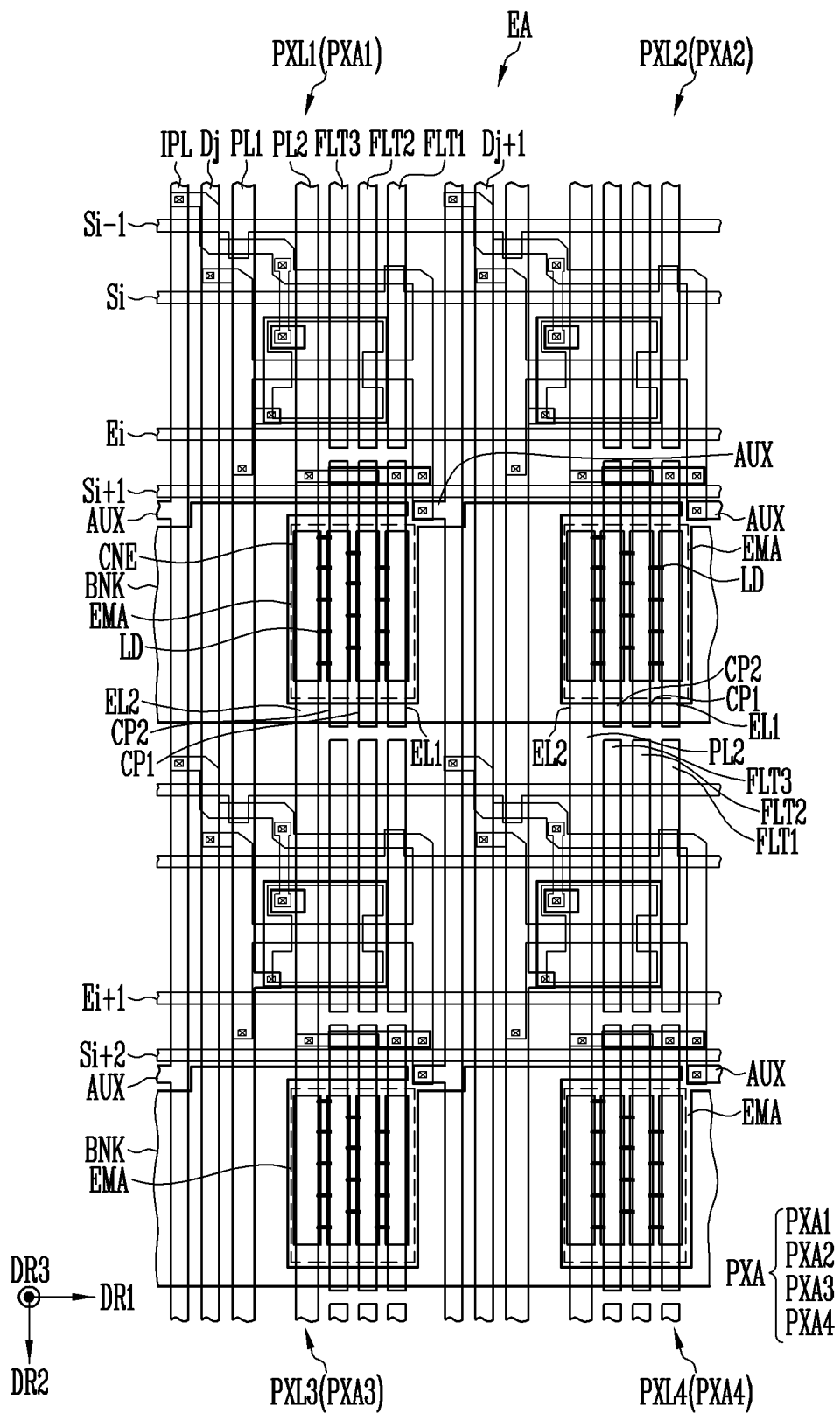
FIG. 7 is a plan view illustrating an enlargement of portion EA of FIG. 5A according to an embodiment.
Figure 8:
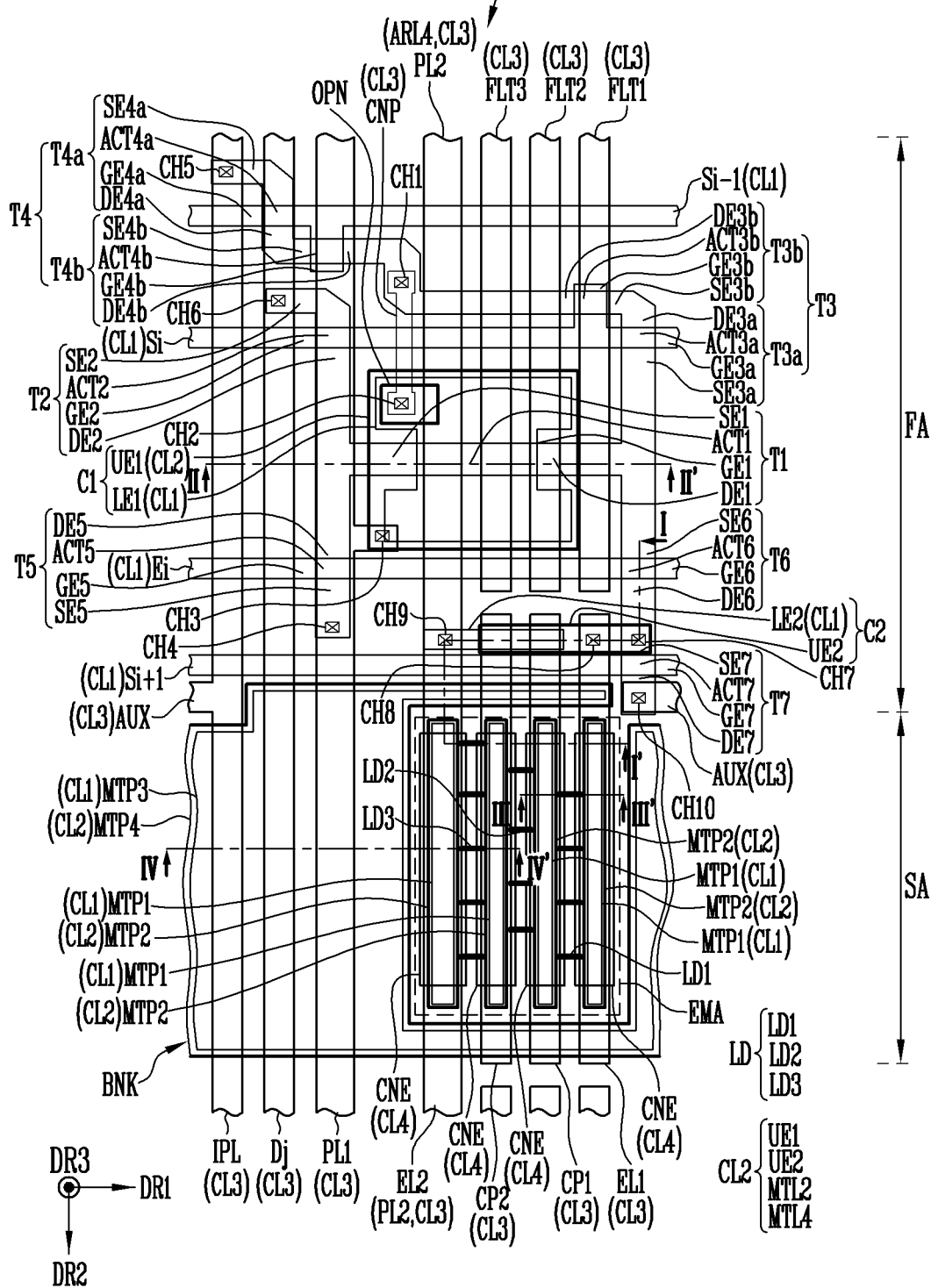
FIG. 8 is a plan view schematically illustrating a first pixel of FIG. 7 according to an embodiment.
Figure 9:
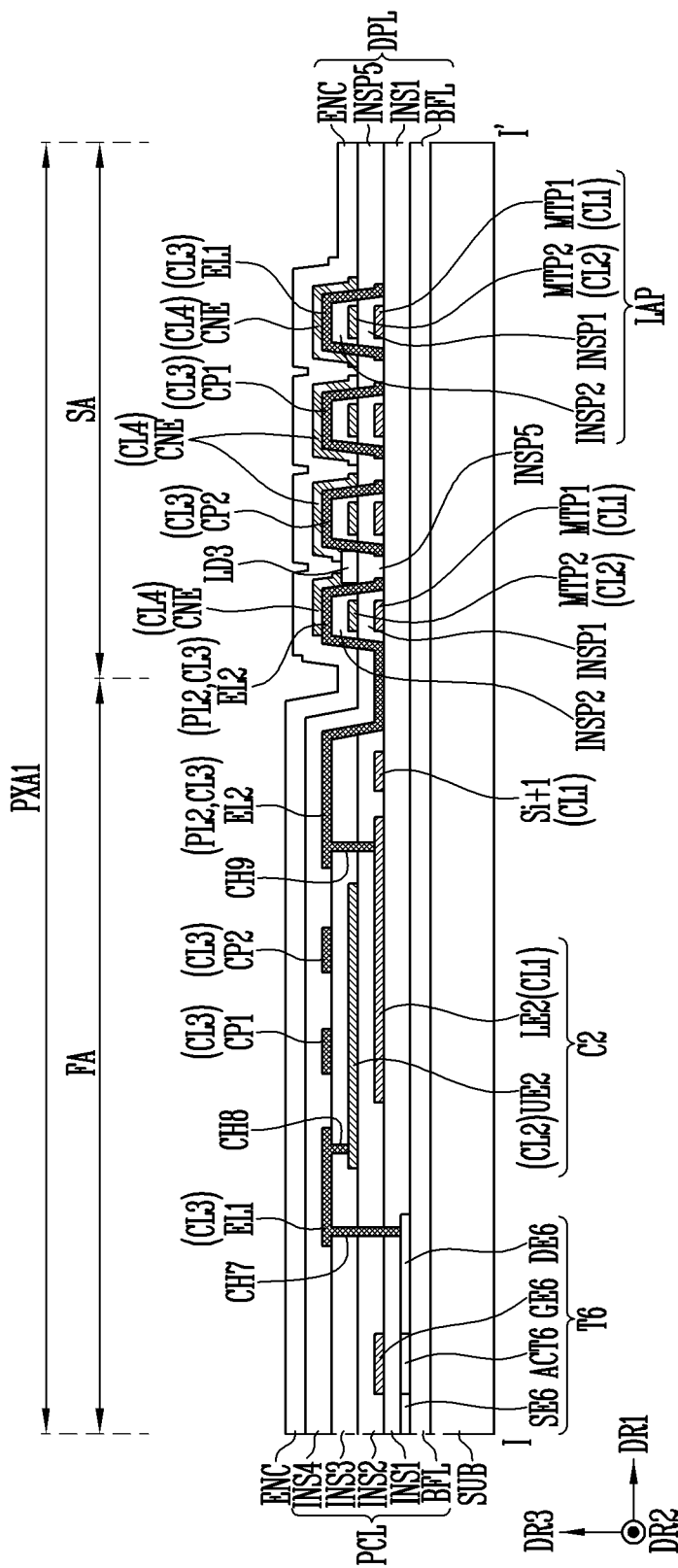
FIG. 9 is a sectional view taken along sectional line I-I' of FIG. 8 according to an embodiment.
Figure 10:
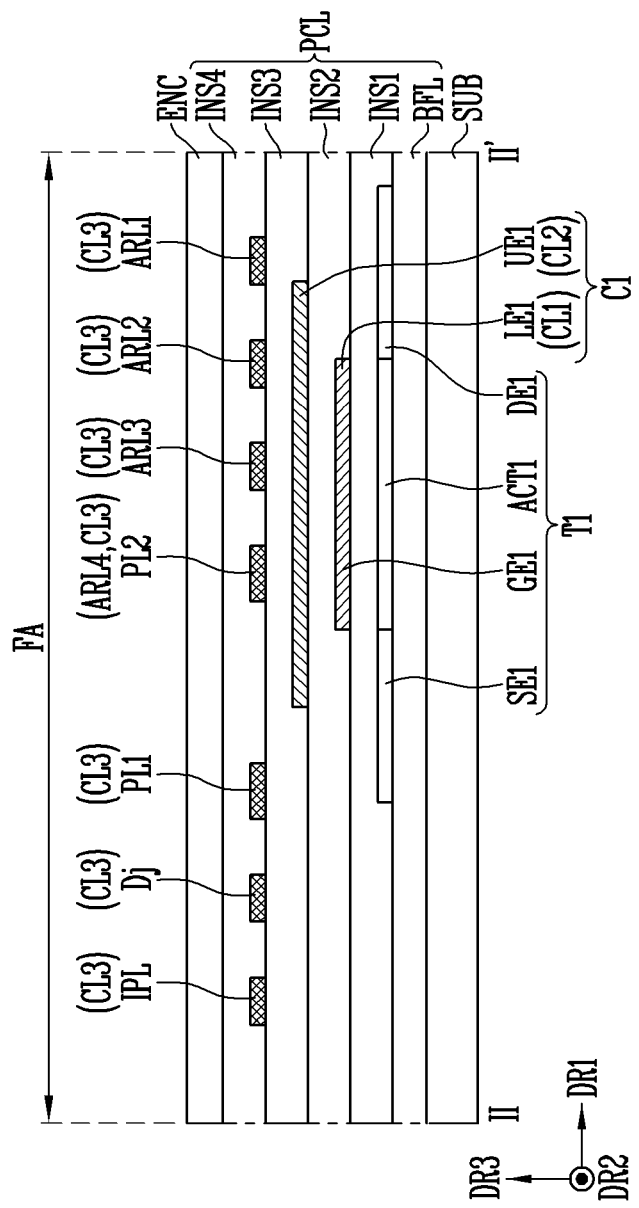
FIG. 10 is a sectional view taken along sectional line II-IF of FIG. 8 according to an embodiment.
Figure 11:
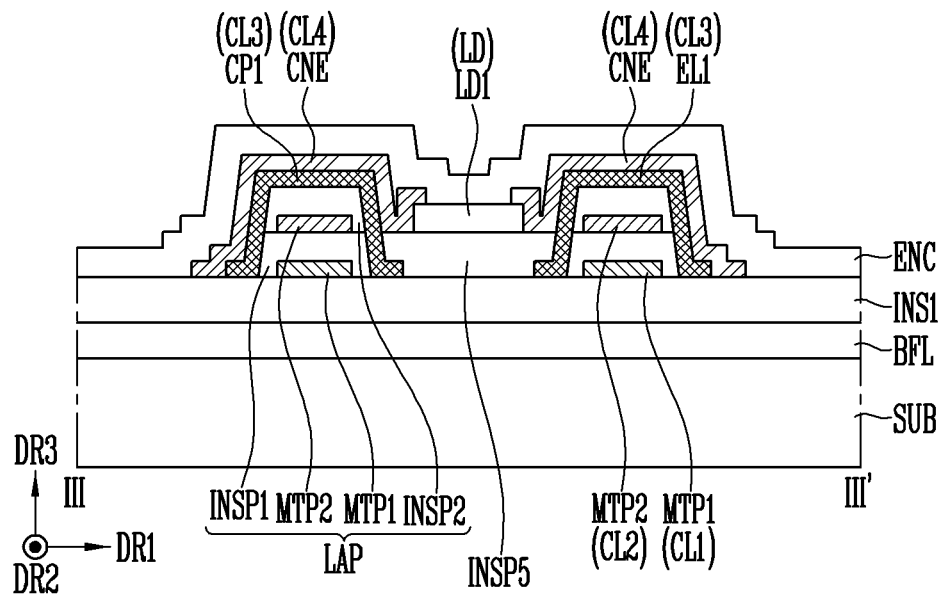
FIG. 11 is a sectional diagram taken along sectional line of FIG. 8 according to embodiment.
Figure 12:
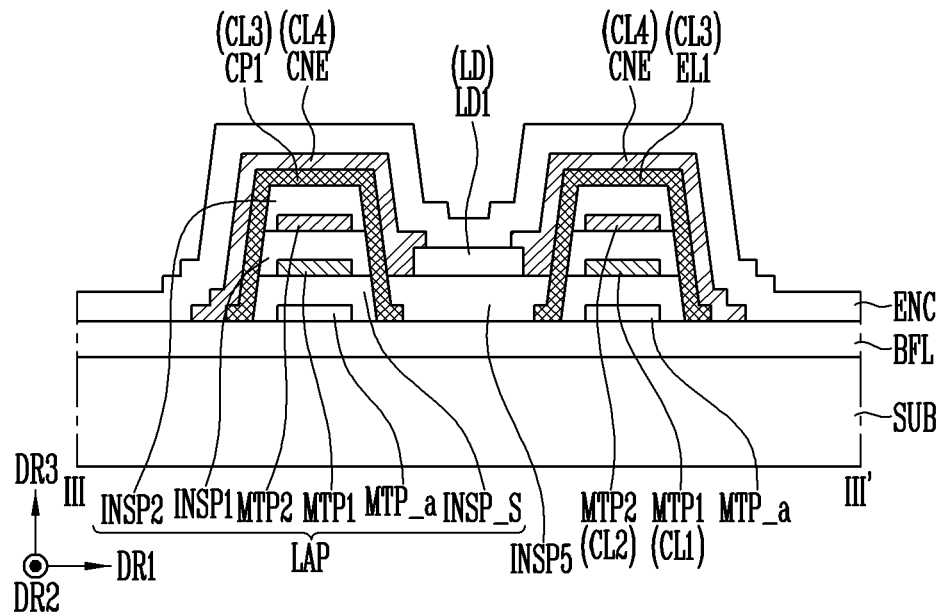
FIG. 12 illustrates a modified version of a stacking pattern of FIG. 11 and is a sectional view corresponding to sectional line of FIG. 8 according to an embodiment.
Figure 13:
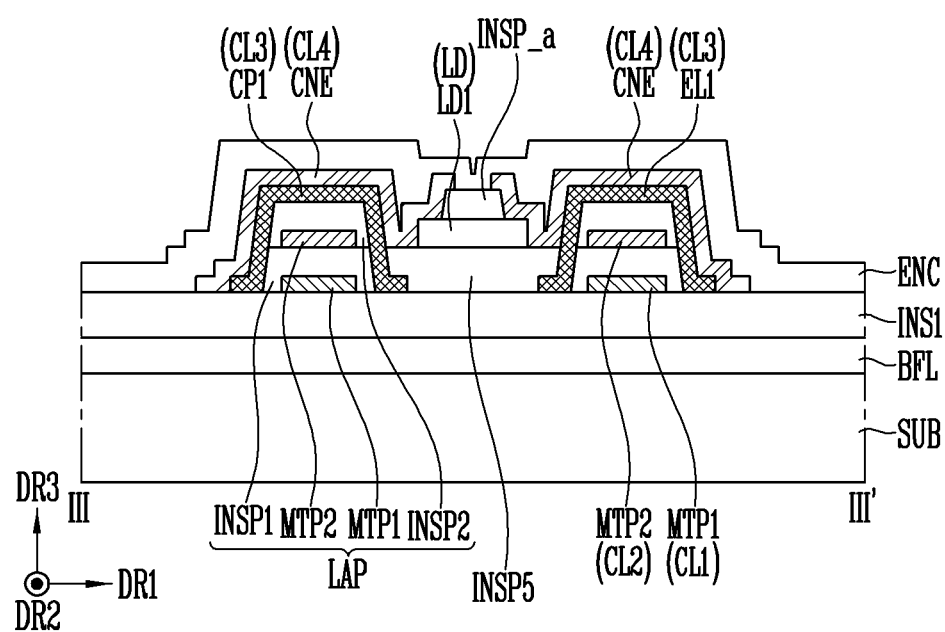
FIG. 13 illustrates an insulating pattern disposed on a light emitting element of FIG. 11 and is a sectional view corresponding to sectional line of FIG. 8 according to an embodiment.
Figure 14:
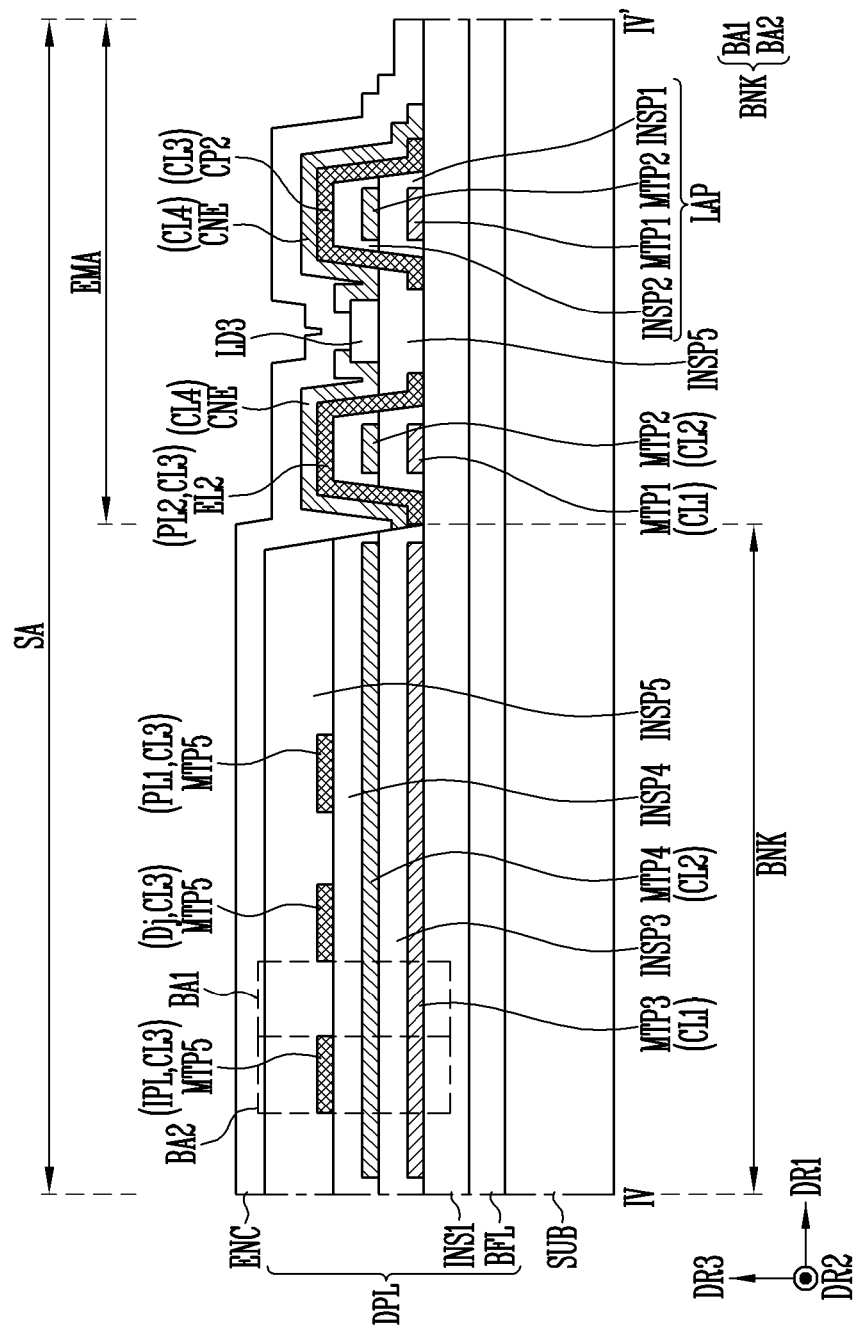
FIG. 14 is a sectional view taken along sectional line IV-IV' of FIG. 8 according to an embodiment.
Figure 15A:
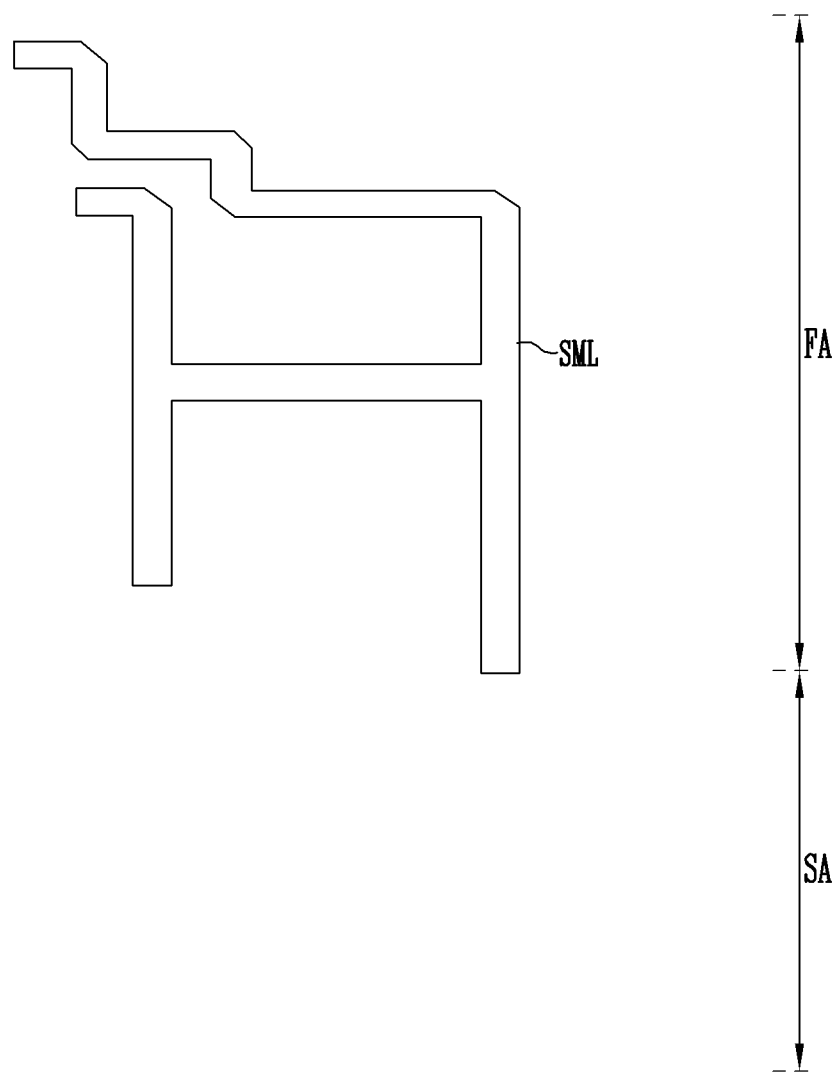
FIGS. 15A, 15B, 15C, 15D, 15E, 15F, and 15G are schematic plan views of the first pixel of FIG. 8 at various stages of manufacture according to some embodiments.
Figure 15B:
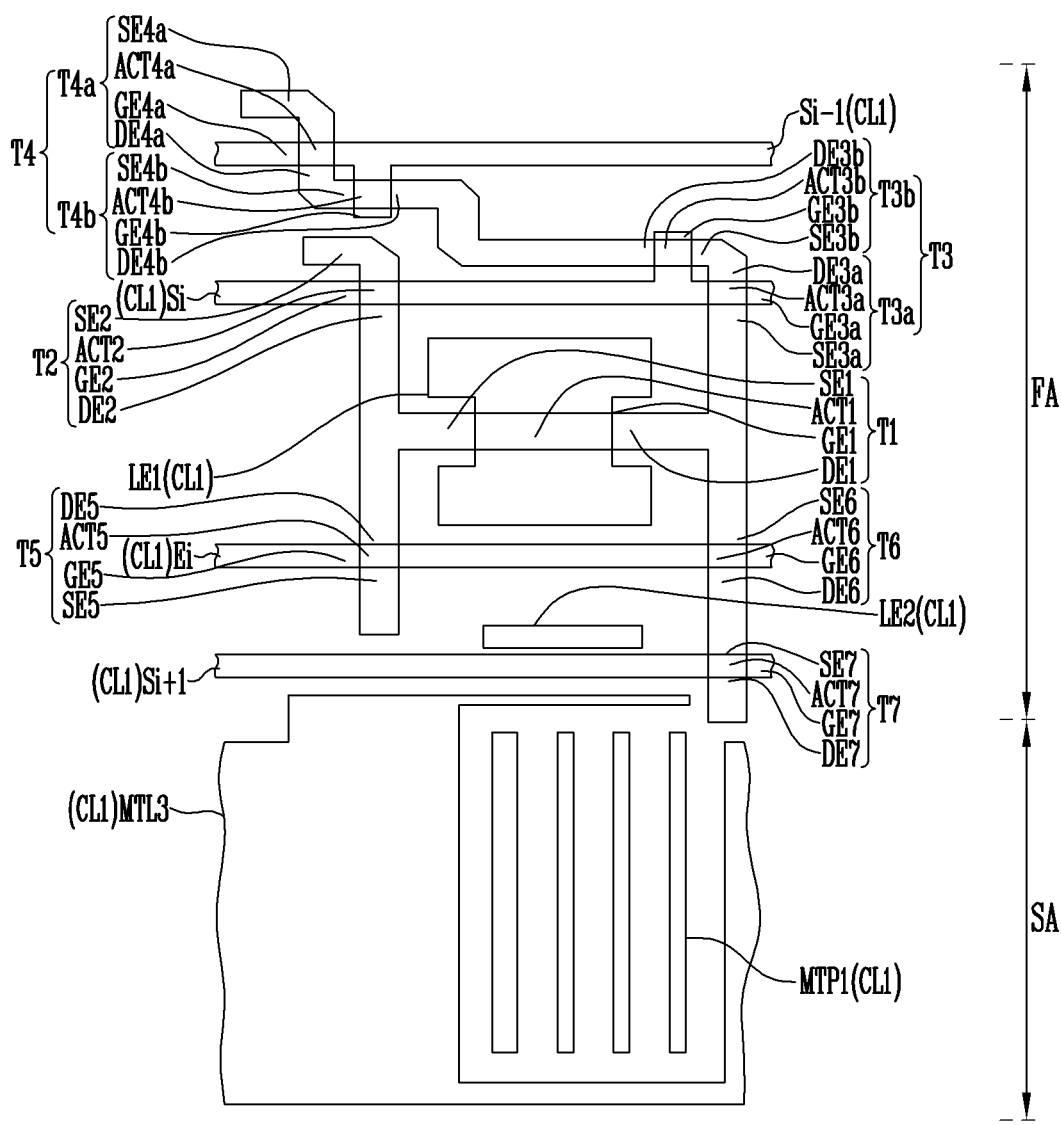
Figure 15B:
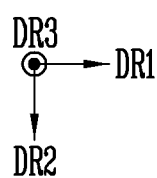
Figure 15C:
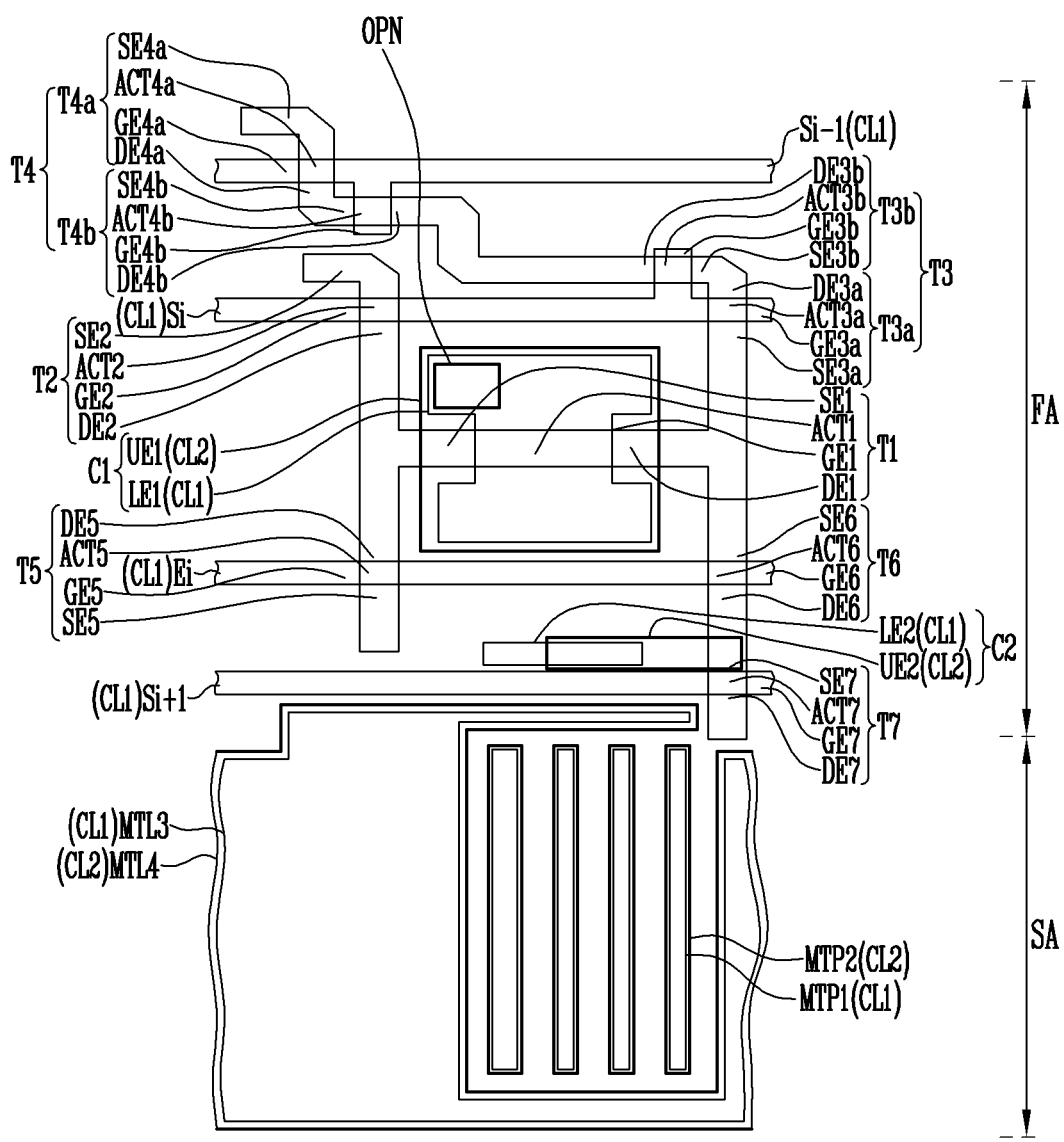
Figure 15D:
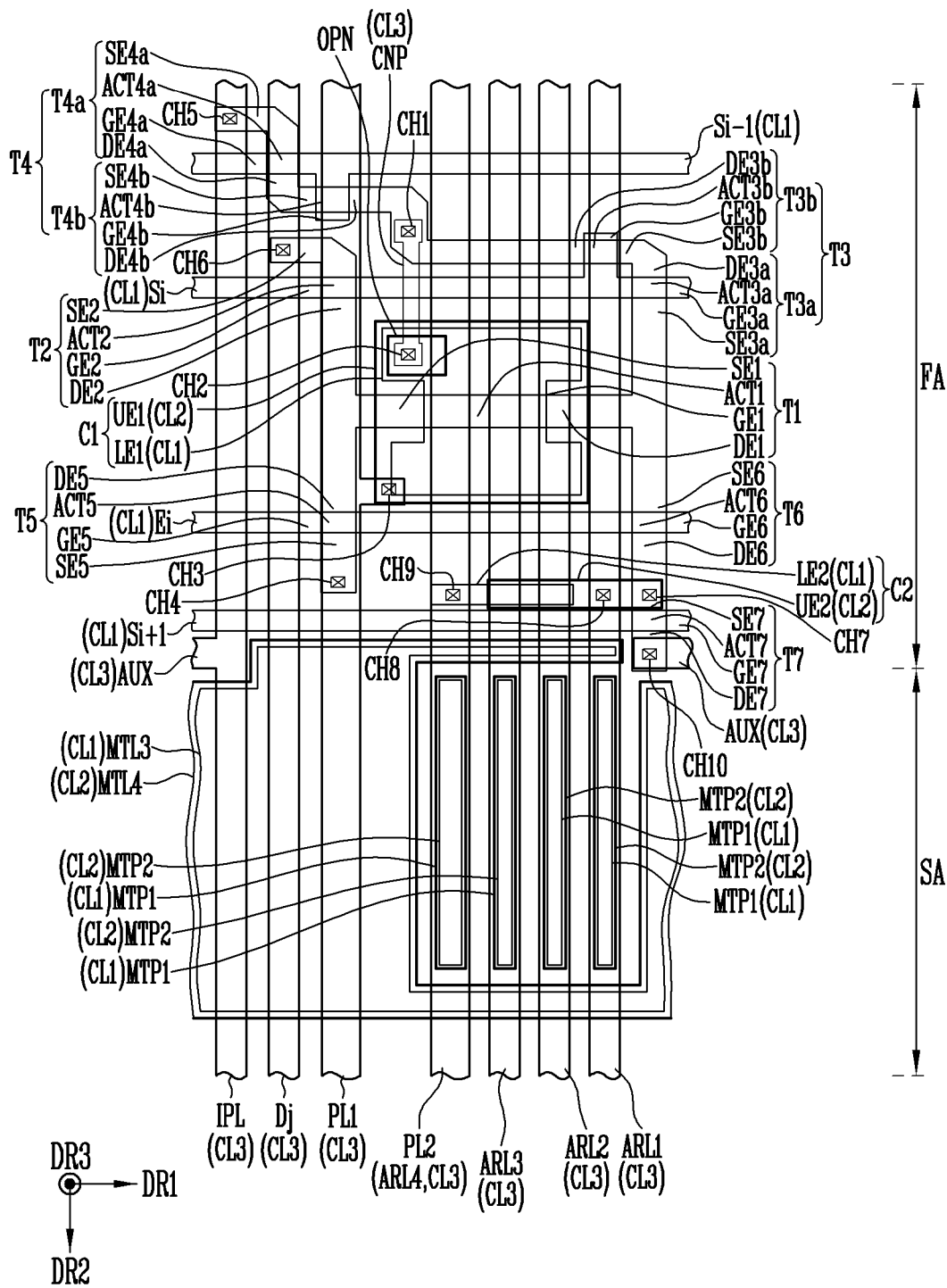
Figure 15E:
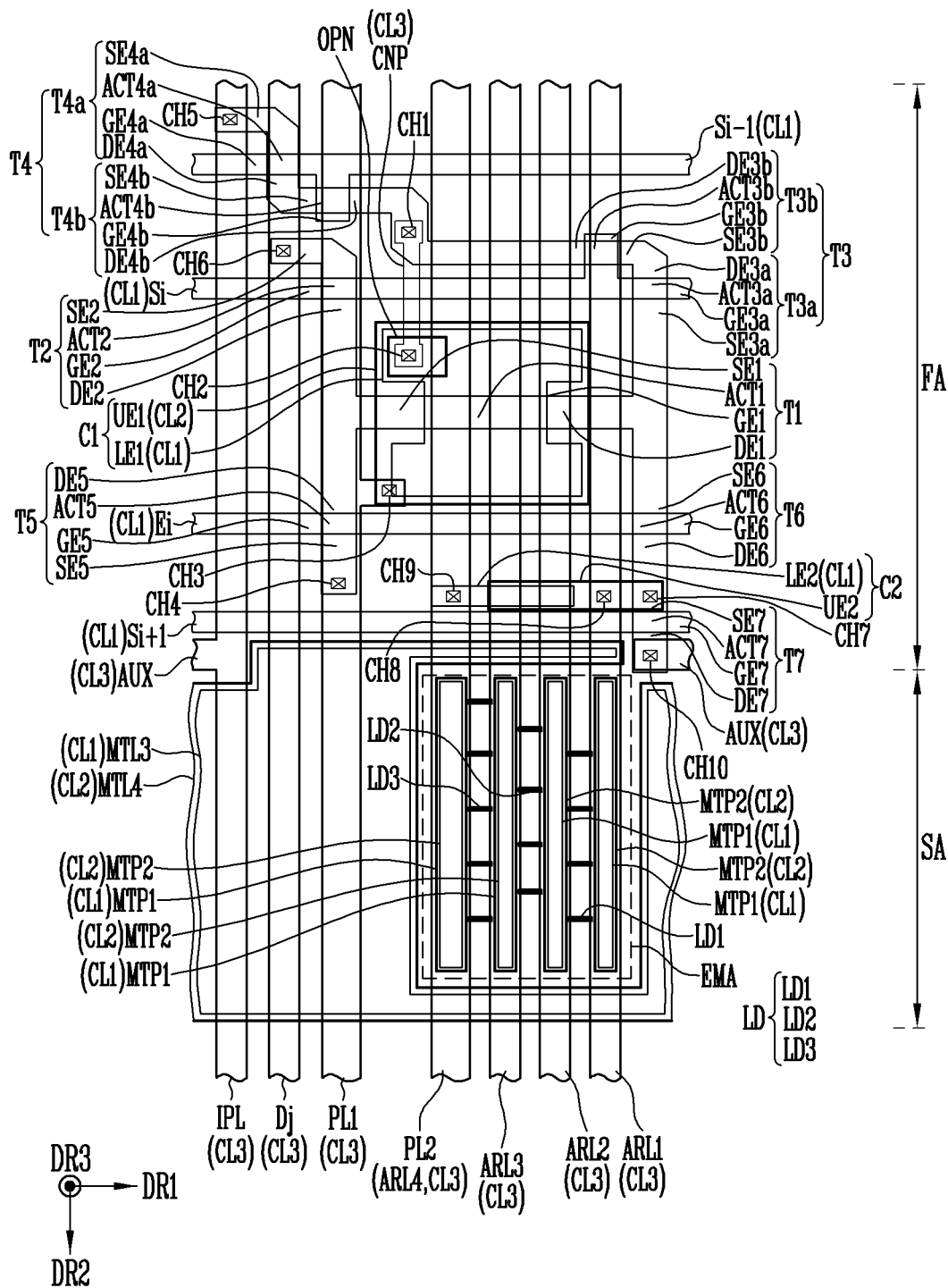
Figure 15F:
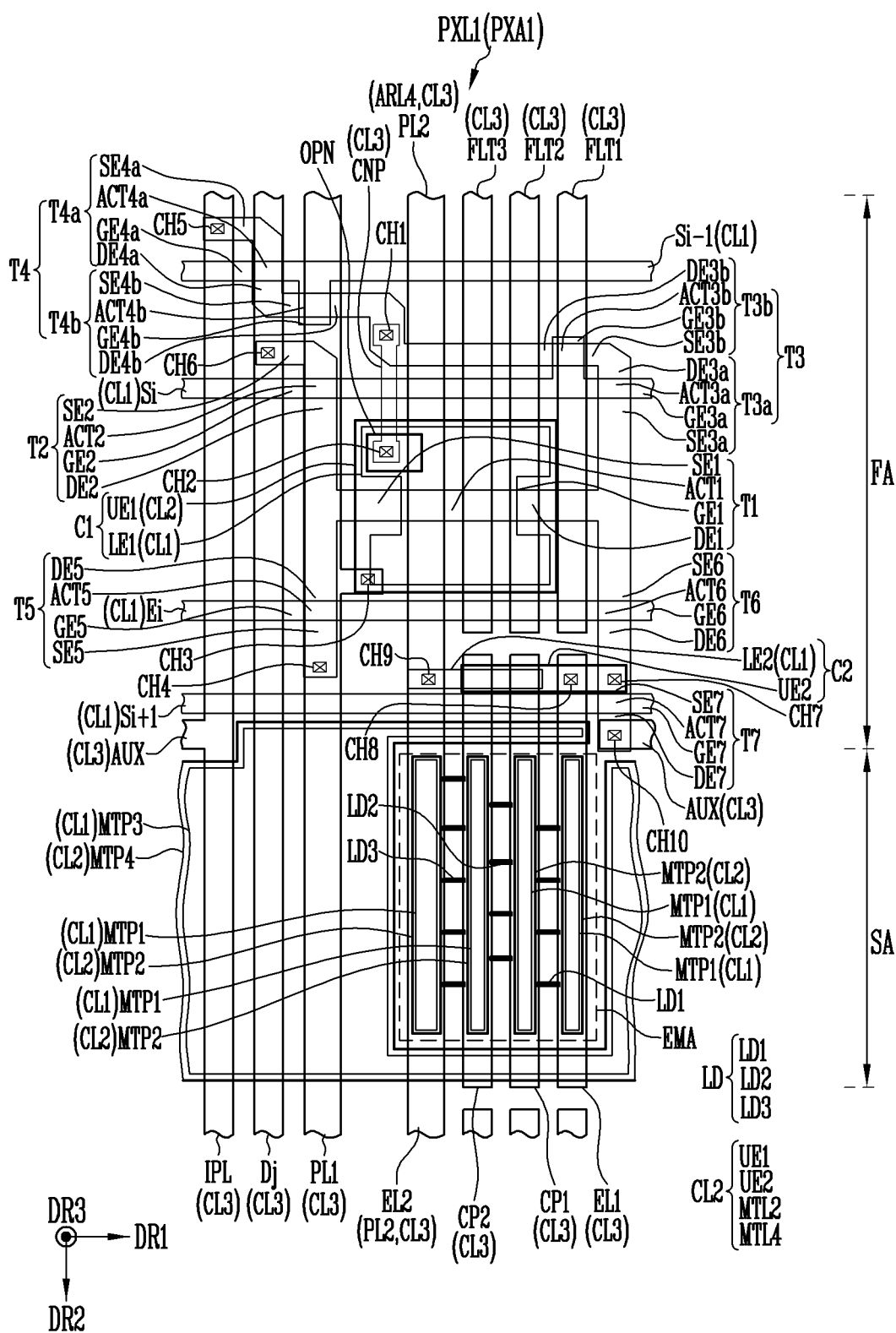
Figure 15G:
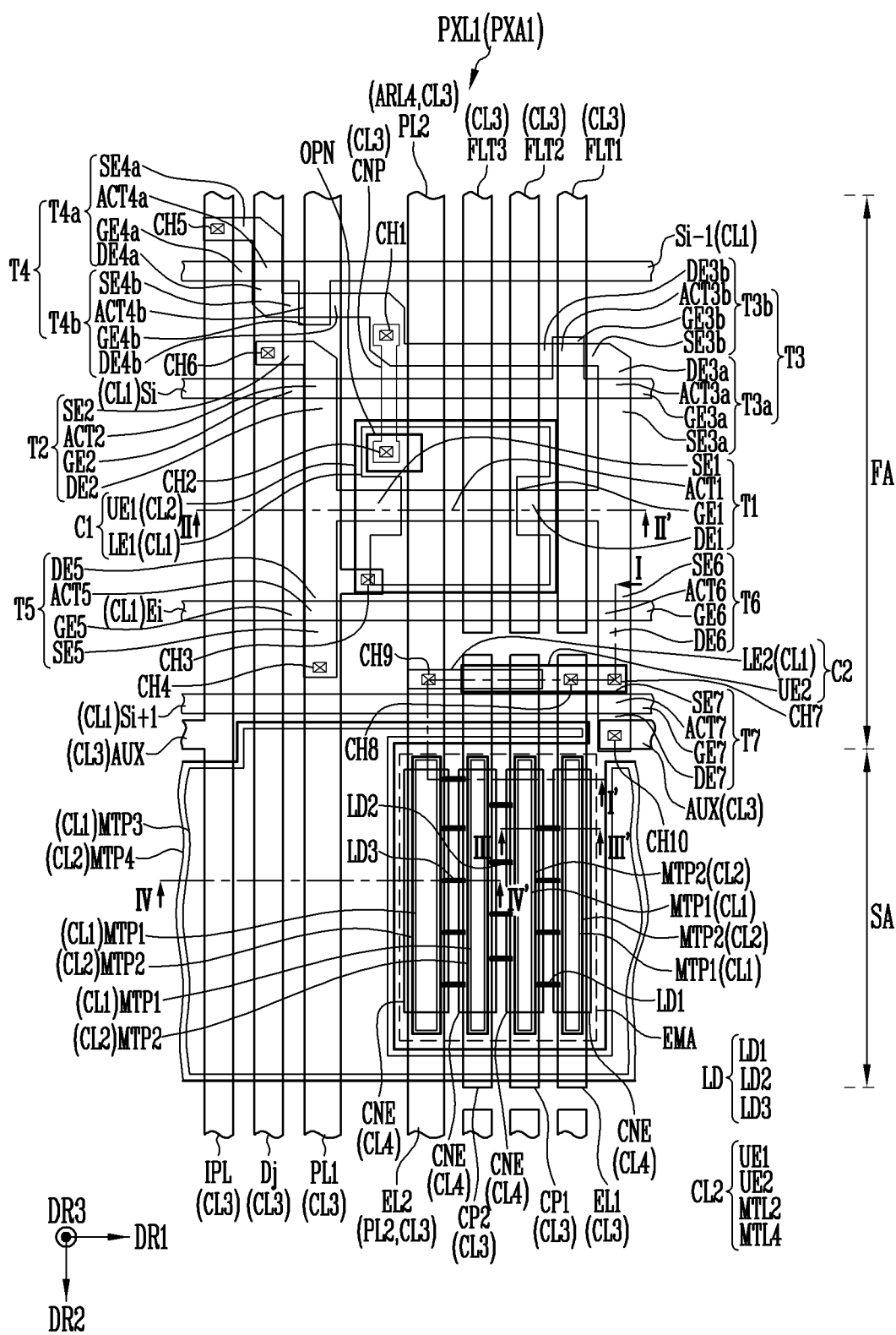
Figure 16E:
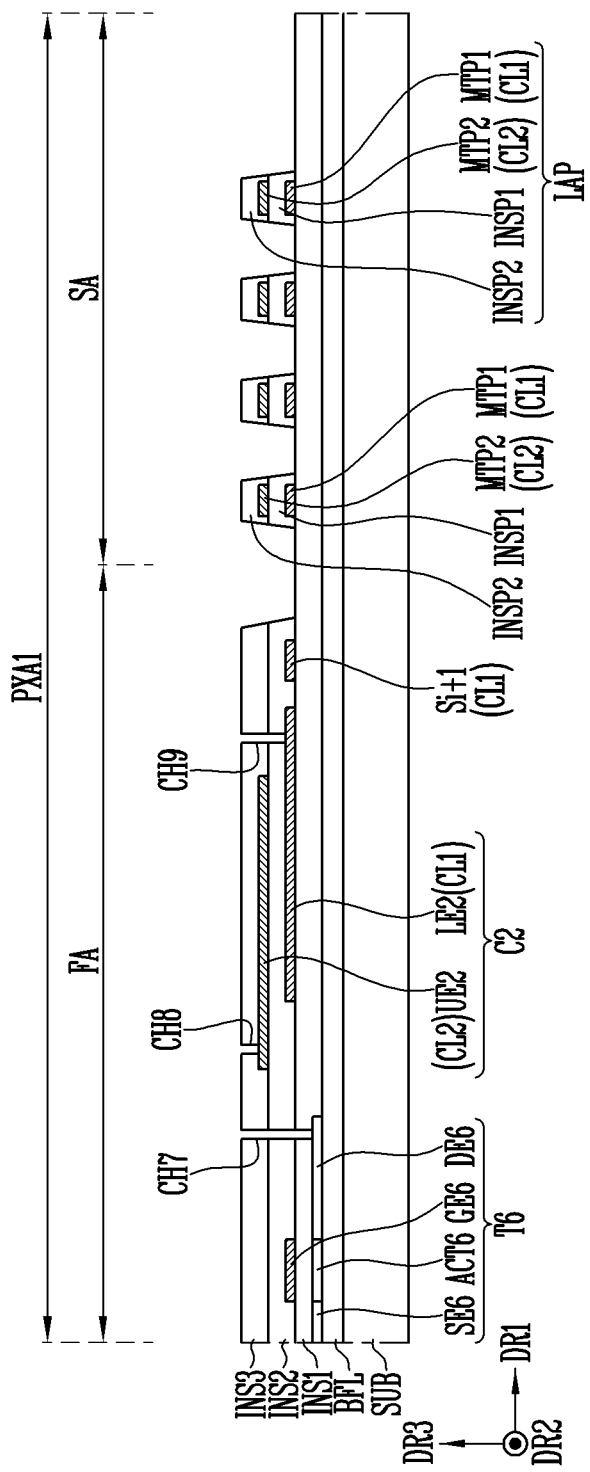
Figure 16F:
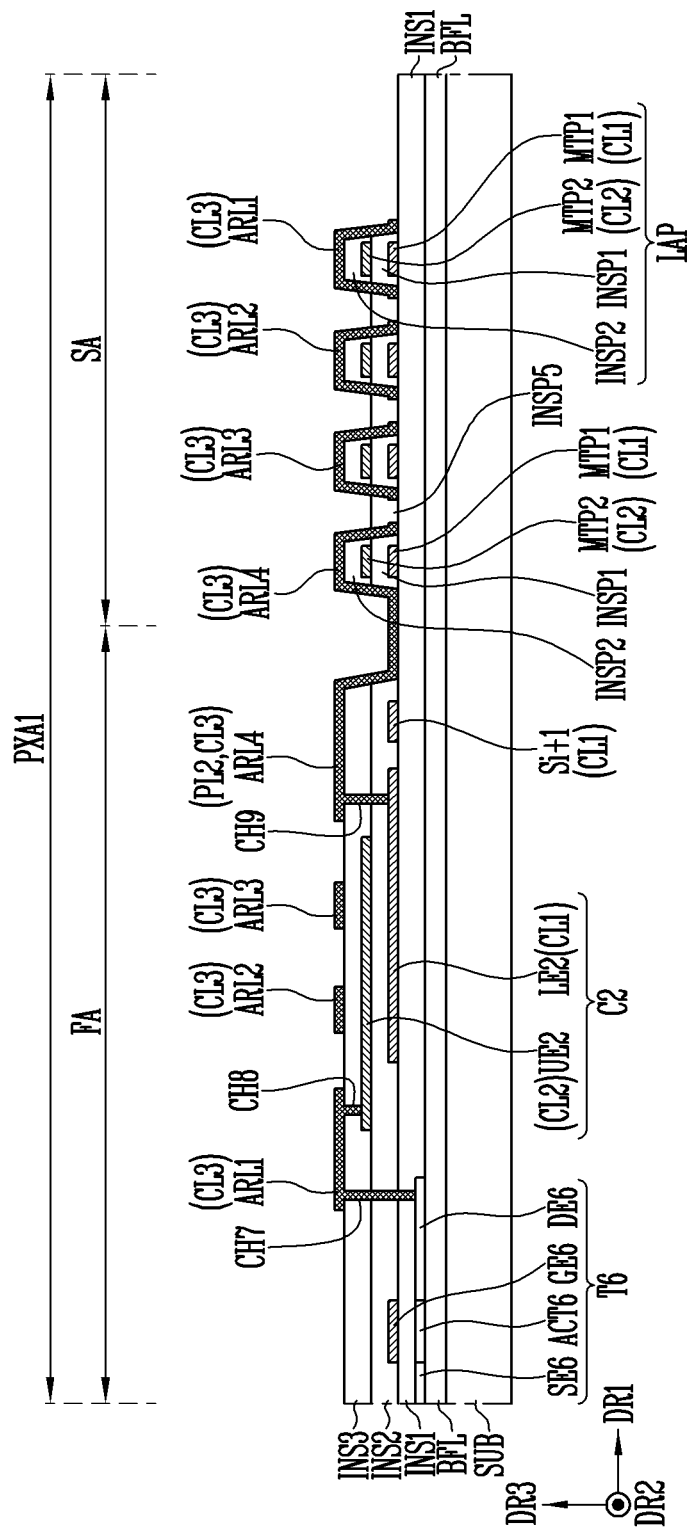
Figure 16G:
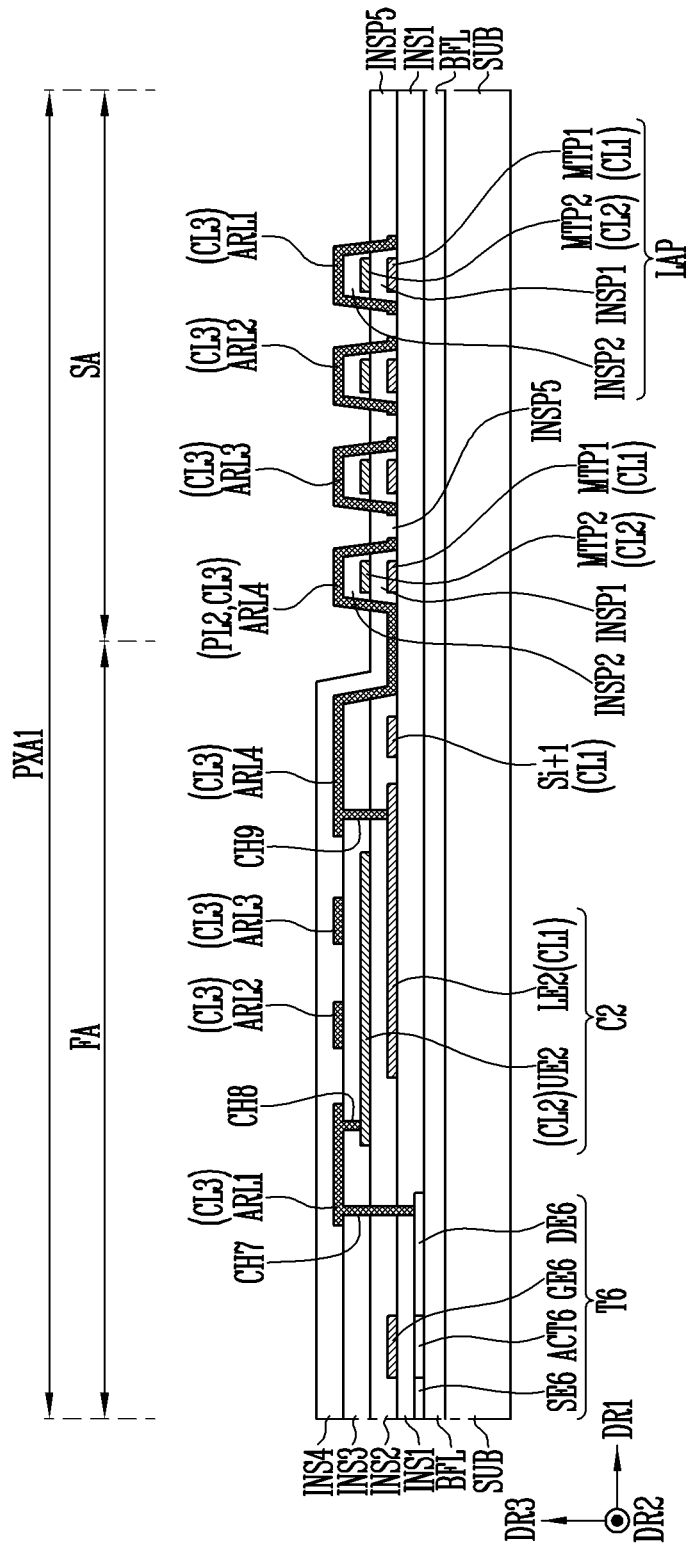
Figure 16H:
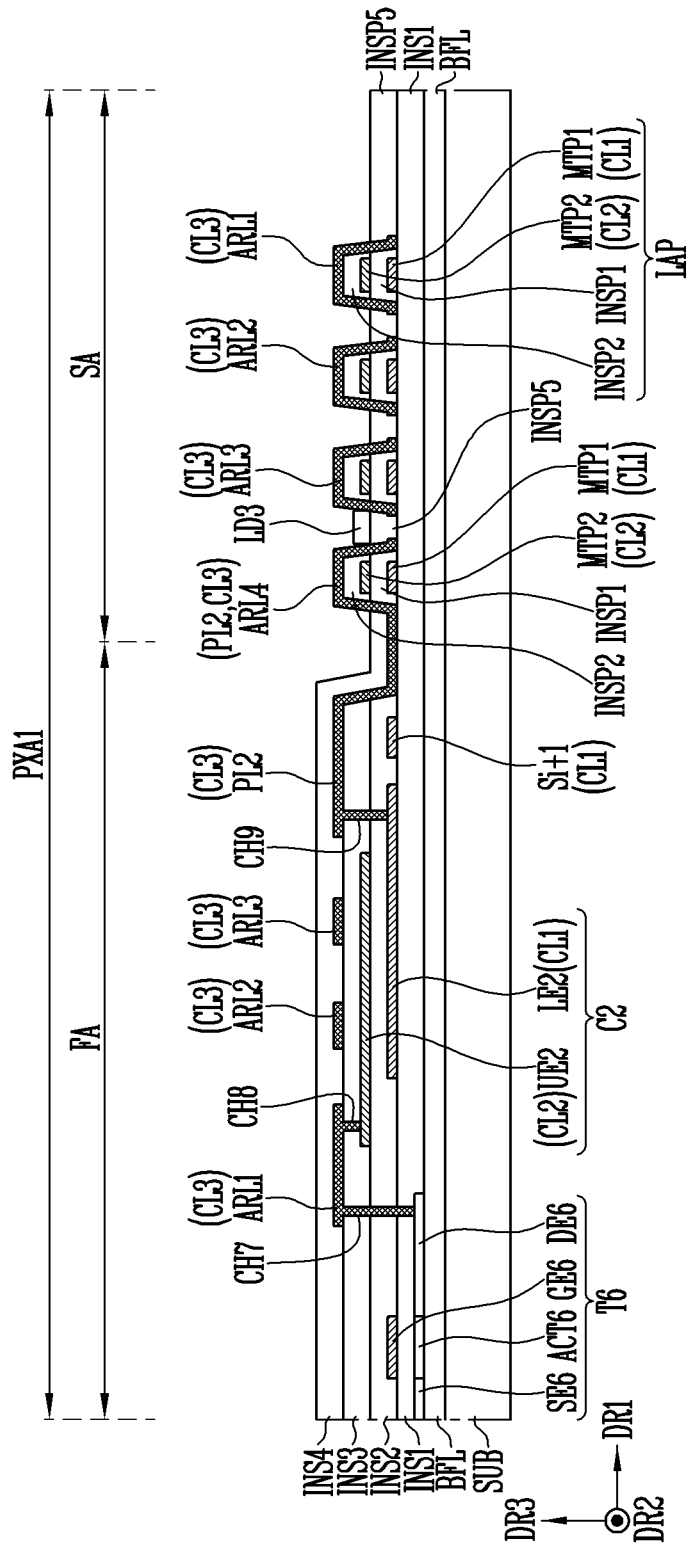
Figure 16I:
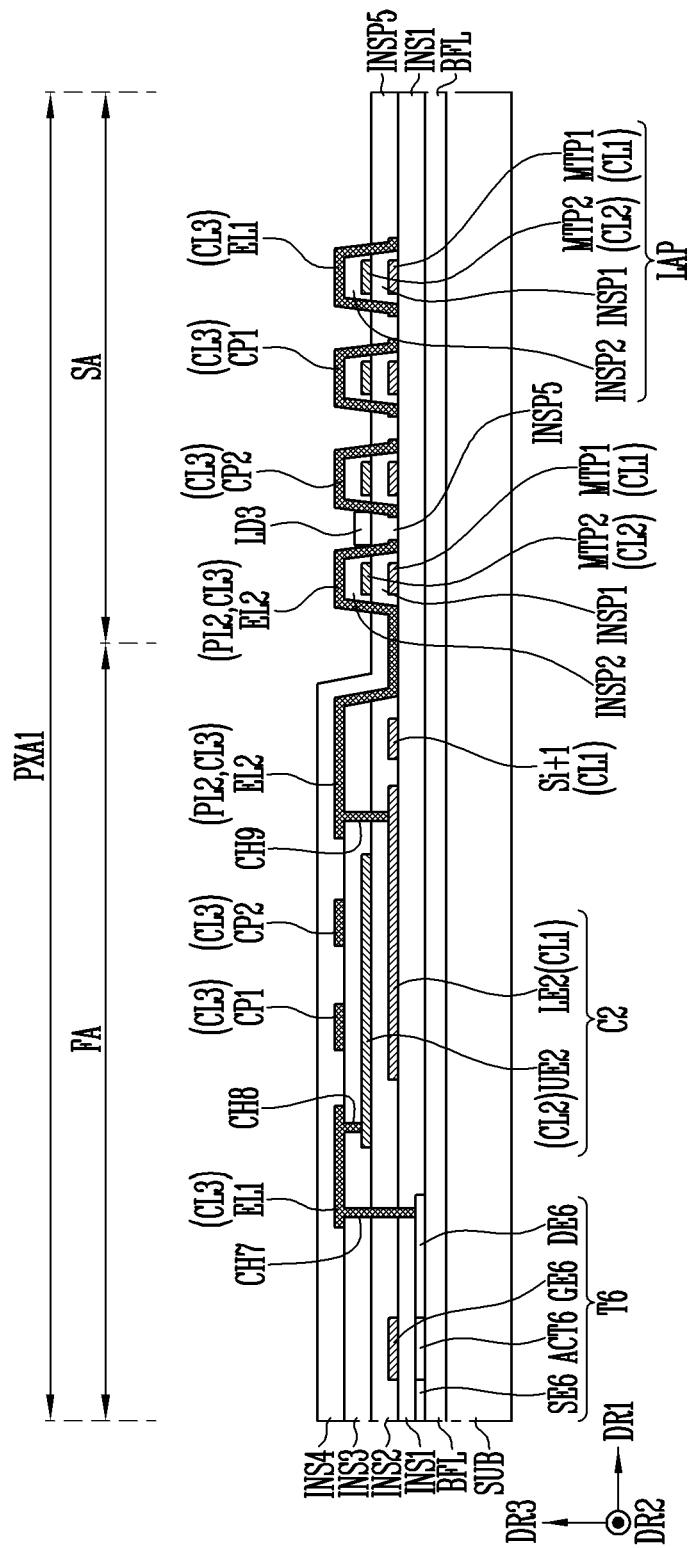
Figure 16J:
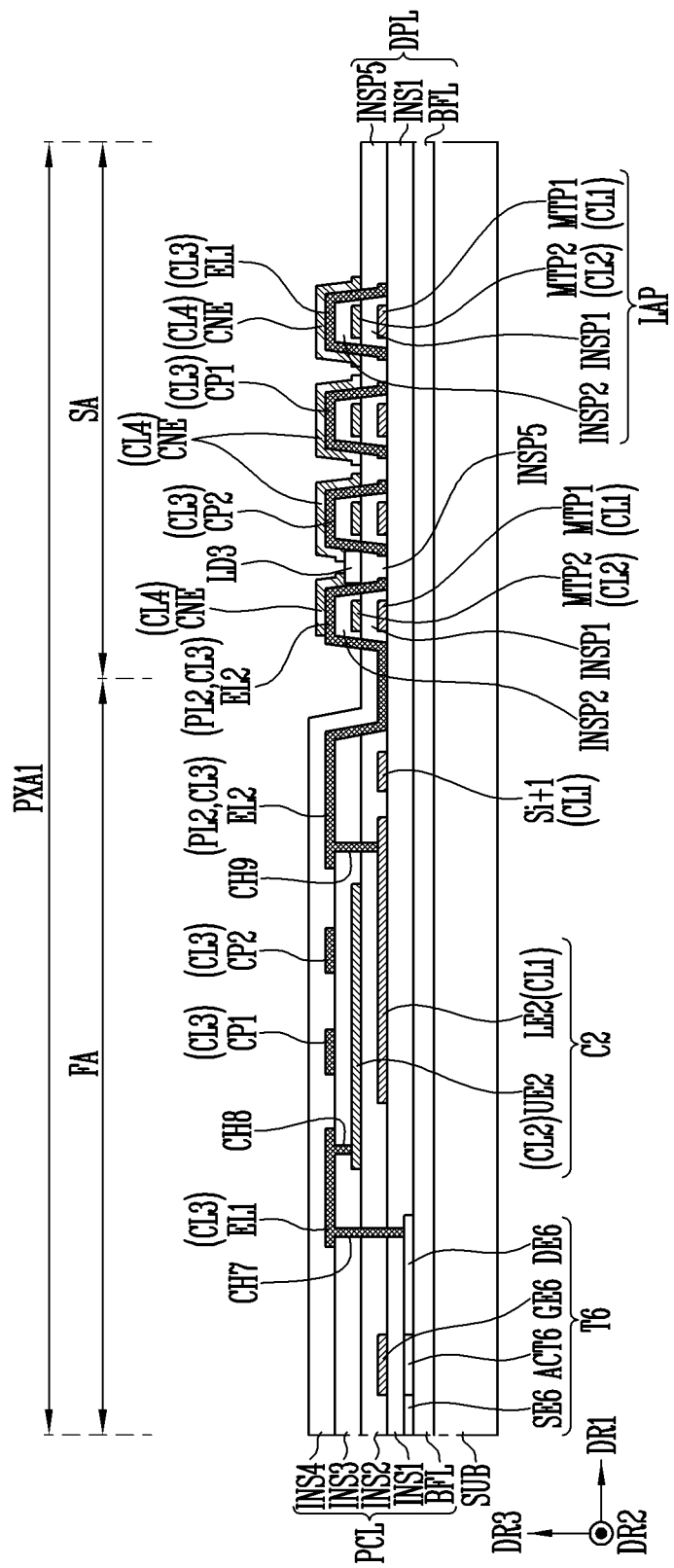
Figure 16K:
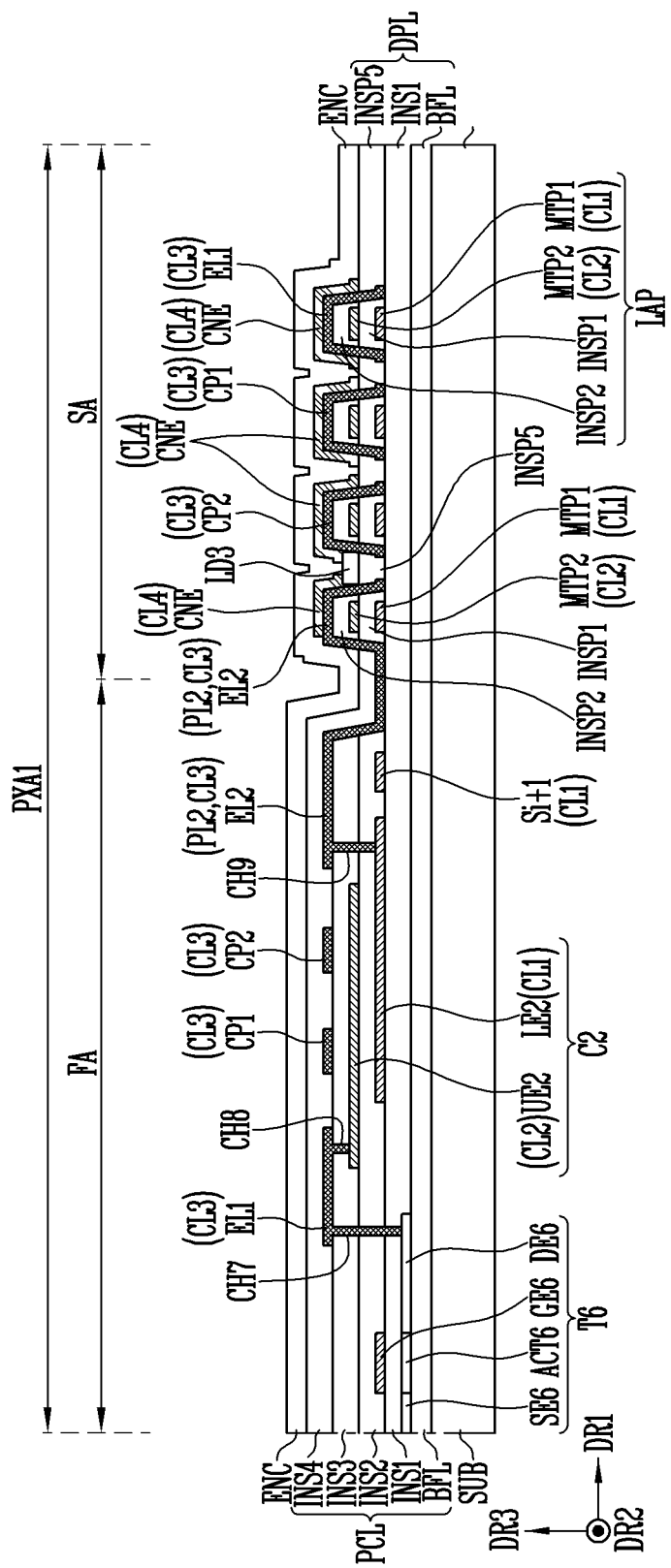

FIG. 7 is a plan view illustrating an enlargement of portion EA of FIG. 5A according to an embodiment. FIG. 8 is a plan view schematically illustrating a first pixel of FIG. 7 according to an embodiment. FIG. 9 is a sectional view taken along sectional line I-I' of FIG. 8 according to an embodiment. F FIG. 10 is a sectional view taken along sectional line II-IF of FIG. 8 according to an embodiment. FIG. 11 is a sectional diagram taken along sectional line of FIG. 8 according to an embodiment. FIG. 12 illustrates an modified version of a stacking pattern of FIG. 11 and is a sectional view corresponding to sectional line of FIG. 8 according to an embodiment. FIG. 13 illustrates an insulating pattern disposed on a light emitting element of FIG. 11 and is a sectional view corresponding to sectional line of FIG. 8 according to an embodiment. FIG. 14 is a sectional view taken along sectional line IV-IV' of FIG. 8 according to an embodiment.

First to fourth pixels PXL1, PXL2, PXL3, and PXL4 illustrated in FIG. 7 and the first pixel PXL1 illustrated in FIG. 8 each may be any one of the pixels illustrated in FIGS. 6A to 6E. For example, the first to fourth pixels PXL1, PXL2, PXL3, and PXL4 illustrated in FIG. 7 and the first pixel PXL1 illustrated in FIG. 8 each may be the pixel illustrated in FIG. 6E.

For the sake of explanation, based on the four pixels PXL1, PXL2, PXL3, and PXL4 disposed on intersections of a j-th pixel column, a j+1-th pixel column, an i-th pixel row, and an i+1-th pixel row in portion EA, FIG. 7 illustrates scan lines Si−1, Si, Si+1, and Si+2, emission control lines Ei and Ei+1, data lines Dj and Dj+1, an initialization power line IPL, and first and second power supply lines PL1 and PL2 that are coupled to the four pixels PXL1, PXL2, PXL3, and PXL4.

With regard to lines provided for the four pixels PXL1, PXL2, PXL3, and PXL4 of FIG. 7, for the sake of explanation, a scan line provided on an i−1-th row among the scan lines Si−1, Si, Si+1, and Si+2 to which scan signals are to be applied will be referred to as "i−1-th scan line Si−1," a scan line provided on an i-th row will be referred to as "i-th scan line Si," a scan line provided on an i+1-th row will be referred to as "i+1-th scan line Si+1," and a scan line provided on an i+2-th row will be referred to as "i+2-th scan line Si+2." Furthermore, an emission control line provided on the i-th row among the emission control lines Ei and Ei+1 to which emission control signals are to be applied will be referred to as "i-th emission control line Ei," and an emission control line provided on the i+1-th row will be referred to as "i+1-th emission control line Ei+1." A data line provided on a j-th column among the data lines Dj and Dj+1 to which data signals are to be applied will be referred to as "j-th data line Dj," and a data line provided on a j+1-th column will be referred to as "j+1-th data line Dj+1."

Although FIGS. 7 to 14 simply illustrate the structure of a pixel PXL, e.g., illustrating that each electrode is formed of a single electrode layer and each insulating layer is formed of a single insulating layer, embodiments are not limited thereto.

In addition, in the description of various embodiments, "components are provided and/or formed on the same layer" may mean that the components are formed through the same process, and "components are provided and/or formed on different layers" may mean that the components are formed through different processes.

Referring to FIGS. 1A to 5B, 6E, and 7 to 14, the display device may include a substrate SUB, a line unit, and at least one pixel PXL.

The substrate SUB may include transparent insulating material to allow light transmission. The substrate SUB may be a rigid substrate or a flexible substrate. Material applied to the substrate SUB may have resistance (e.g., thermal resistance) to high treatment temperatures during a process of fabricating the display device. The substrate SUB may include a display area DA including at least one pixel area PXA in which the pixel PXL is disposed, and a non-display area NDA disposed around the display area DA.

In an embodiment, pixels PXL may be arranged in the display area DA in a matrix shape and/or a stripe shape along a plurality of pixel rows extending in a first direction DR1 and a plurality of pixel columns extending a second direction DR2 intersecting the first direction DR1, but embodiments are not limited thereto. In an embodiment, the pixels PXL may be disposed in the display area DA on the substrate SUB in various arrangement manners.

The pixels PXL may include a first pixel PXL1, a second pixel PXL2, a third pixel PXL3, and a fourth pixel PXL4. In following embodiments, the term "pixel PXL" or "pixels PXL" will be used to collectively designate any one pixel or two or more pixels among the first pixel PXL1, the second pixel PXL2, the third pixel PXL3, and the fourth pixel PXL4.

The first pixel PXL1 may be a pixel disposed on an intersection of the i-th pixel row and the j-th pixel column. The second pixel PXL2 may be a pixel disposed on an intersection of the i-th pixel row and the j+1-th pixel column. The third pixel PXL3 may be a pixel disposed on an intersection of the i+1-th pixel row and the j-th pixel column. The fourth pixel PXL4 may be a pixel disposed on an intersection of the i+1-th pixel row and the j+1-th pixel column. In an embodiment, each of the first to fourth pixels PXL1 to PXL4 may be a red pixel, a green pixel, or a blue pixel, but embodiments are not limited thereto.

In the display area DA of the substrate SUB, an area in which the first pixel PXL1 disposed may be a first pixel area PXA1, an area in which the second pixel PXL2 is disposed may be a second pixel area PXA2, an area in which the third pixel PXL3 is disposed may be a third pixel area PXA3, and an area in which the fourth pixel PXL4 is disposed may be a fourth pixel area PXA4.

The first pixel PXL1 may be electrically coupled to each of the scan lines Si−1, Si, and Si+1, the j-th data line Dj, the i-th emission control line Ei, the initialization power supply line IPL, and the first and second power supply lines PL1 and PL2 that are disposed in the first pixel area PXA1. The second pixel PXL2 may be electrically coupled to each of the scan lines Si−1, Si, and Si+1, the j+1-th data line Dj+1, the i-th emission control line Ei, the initialization power supply line IPL, and the first and second power supply lines PL1 and PL2 that are disposed in the second pixel area PXA2. The third pixel PXL3 may be electrically coupled to each of the scan lines Si, Si+1, and Si+2, the j-th data line Dj, the i+1-th emission control line Ei+1, the initialization power supply line IPL, and the first and second power supply lines PL1 and PL2 that are disposed in the third pixel area PXA3. The fourth pixel PXL4 may be electrically coupled to each of the scan lines Si, Si+1, and Si+2, the j+1-th data line Dj+1, the i+1-th emission control line Ei+1, the initialization power supply line IPL, and the first and second power supply lines PL1 and PL2 that are disposed in the fourth pixel area PXA4.

The scan lines Si−1, Si, Si+1, and Si+2 may extend in the first direction DR1 on the substrate SUB and may be provided for the first to fourth pixels PXL1 to PXL4. The scan lines Si−1, Si, Si+1, and Si+2 may include the i−1-th scan line Si−1, the i-th scan line Si, the i+1-th scan line Si+1, and the i+2-th scan line Si+2 that are successively arranged in the second direction DR2. The i−1-th scan line Si−1, the i-th scan line Si, and the i+1-th scan line Si+1 among the scan lines Si−1, Si, Si+1, and Si+2 may be coupled to each of the first and second pixels PXL1 and PXL2 that are disposed on the i-th pixel row. The i-th scan line Si, the i+1-th scan line Si+1, and the i+2-th scan line Si+2 among the scan lines Si−1, Si, Si+1, and Si+2 may be coupled to each of the third and fourth pixels PXL3 and PXL4 that are disposed on the i+1-th pixel row.

Scan signals may be applied to the corresponding scan lines Si−1, Si, Si+1, and Si+2. For example, an i−1-th scan signal may be applied to the i−1-th scan line Si−1, an i-th scan signal may be applied to the i-th scan line Si, an i+1-th scan signal may be applied to the i+1-th scan line Si+1, and an i+2-th scan signal may be applied to the i+2-th scan line Si+2.

In an embodiment, each of the scan lines Si−1, Si, Si+1, and Si+2 may be a first conductive layer CL1, which is provided and/or formed on a first insulating layer INS1. Here, the first insulating layer INS1 may be an inorganic insulating layer including an inorganic material, but embodiments are not limited thereto. In an embodiment, the first insulating layer INS1 may be formed of an organic insulating layer including an organic material.

The emission control lines Ei and Ei+1 may extend on the substrate SUB in the first direction DR1 and be provided for the corresponding pixels PXL. The emission control lines Ei and Ei+1 may include the i-th emission control line Ei and the i+1-th emission control line Ei+1 that are successively arranged in the second direction DR2. The i-th emission control line Ei may be coupled to pixels PXL, e.g., the first and second pixels PXL1 and PXL2, provided on the i-th pixel row. The i+1-th emission control line Ei+1 may be coupled to pixels PXL, e.g., the third and fourth pixels PXL3 and PXL4, provided on the i+1-th pixel row.

An emission control signal may be applied to each of the emission control lines Ei and Ei+1. For example, an i-th emission control signal may be applied to the i-th emission control line Ei, and an i+1-th emission control signal may be applied to the i+1-th emission control line Ei+1.

In an embodiment, the emission control lines Ei and Ei+1 may be provided in the same layer as the scan lines Si−1, Si, Si+1, and Si+2, and may include the same material as that of the scan lines Si−1, Si, Si+1, and Si+2. For example, each of the emission control lines Ei and Ei+1 may be a first conductive layer CL1 provided and/or formed on the first insulating layer INS1.

The data lines Dj and Dj+1 may extend in the second direction DR2. The data lines Dj and Dj+1 may include the j-th data line Dj and the j+1-th data line Dj+1 that are successively arranged in the first direction DR1. The j-th data line Dj may be coupled to pixels PXL, e.g., the first and third pixels PXL1 and PXL3, disposed on (or in) the j-th pixel column. The j+1-th data line Dj+1 may be coupled to pixels PXL, e.g., the second and fourth pixels PXL2 and PXL4, disposed on the j+1-th pixel column. Data signals may be applied to the corresponding data lines Dj and Dj+1.

In an embodiment, each of the data lines Dj and Dj+1 may be a third conductive layer CL3 provided and/or formed on a third insulating layer INS3. The third insulating layer INS3 may be an inorganic insulating layer including an inorganic material or an organic insulating layer including an organic material.

The initialization power supply line IPL may extend in the second direction DR2 and may be disposed at a position spaced apart from each of the data lines Dj and Dj+1. For example, the initialization power supply line IPL disposed on the j-th pixel column may extend in a direction parallel to the direction in which the j-th data line Dj extends, and may be electrically and/or physically separated from the j-th data line Dj. The initialization power supply line IPL that is disposed on the j+1-th pixel column may extend in a direction parallel to the direction in which the j+1-th data line Dj+1 extends, and may be electrically and/or physically separated from the j+1-th data line Dj+1.

In an embodiment, the initialization power supply line IPL may be provided in the same layer the data lines Dj and Dj+1, and may include the same material as that of the data lines Dj and Dj+1. For example, the initialization power supply line IPL may be a third conductive layer CL3 provided and/or formed on the third insulating layer INS3. However, embodiments are not limited thereto. In some embodiments, the initialization power supply line IPL may be a second conductive layer CL2 provided and/or formed on a second insulating layer INS2.

The first power supply line PL1 may extend in the second direction DR2 and may be disposed at a position spaced apart from each of the data lines Dj and Dj+1. For example, the first power supply line PL1 disposed on the j-th pixel column may extend in a direction parallel to the direction in which the j-th data line Dj extends, and may be electrically and/or physically separated from the j-th data line Dj. The first power supply line PL1 disposed on the j+1-th pixel column may extend in a direction parallel to the direction in which the j+1-th data line Dj+1 extends, and may be electrically and/or physically separated from the j+1-th data line Dj+1. The first driving power supply VDD may be applied to the first power supply line PL1.

In an embodiment, the first power supply line PL1 may be provided in the same layer as the data lines Dj and Dj+1 and the initialization power supply line IPL. For example, the first power supply line PL1 may be a third conductive layer CL3 provided and/or formed on the third insulating layer INS3.

The second power supply line PL2 may extend in the second direction DR2 and may be disposed at a position spaced apart from each of the data lines Dj and Dj+1. For example, the second power supply line PL2 disposed on the j-th pixel column may extend in a direction parallel to the direction in which the j-th data line Dj extends, and may be electrically and/or physically separated from the j-th data line Dj. The second power supply line PL2 disposed on the j+1-th pixel column may extend in a direction parallel to the direction in which the j+1-th data line Dj+1 extends, and may be electrically and/or physically separated from the j+1-th data line Dj+1.

In an embodiment, the second power supply line PL2 may be provided in the same layer as the data lines Dj and Dj+1, the initialization power supply line IPL, and the first power supply line PL1, and may include the same material as that of the data lines Dj and Dj+1, the initialization power supply line IPL, and the first power supply line PL1. For example, the second power supply line PL2 may be a third conductive layer CL3 provided and/or formed on the third insulating layer INS3. The second driving power supply VSS may be applied to the second power supply line PL2.

In an embodiment, each of the first to fourth pixel areas PXA1 and PXA4 may include an emission area EMA from which light is emitted, and a peripheral area which encloses the emission area EMA. Here, the term "peripheral area" may include a non-emission area from which no light is emitted.

A display element part DPL in which a plurality of light emitting elements LD are provided may be disposed in the emission area EMA of each of the first to fourth pixel areas PXA1 to PXA4. A pixel circuit part PCL in which circuit elements for driving the light emitting elements LD are provided may be disposed in the peripheral area of each of the first to fourth pixel areas PXA1 to PXA4.

The first to fourth pixels PXL1 to PXL4 may have a substantially identical or similar structure. Hereinafter, for the sake of explanation, the first pixel PXL1 that is disposed on the i-th pixel row and the j-th pixel column among the first to fourth pixels PXL1 to PXL4 will be representatively described, and a detailed description of the second to fourth pixels PXL2 to PXL4 will be omitted.

The first pixel area PXA1 in which the first pixel PXL1 is provided may include a first area FA and a second area SA that are divided in one direction. The substrate SUB and the pixel circuit part PCL including a pixel circuit 144 may be positioned in the first area FA. The substrate SUB and the display element part DPL including the light emitting elements LD may be positioned in the second area SA. In an embodiment, the emission area EMA of the first pixel area PXA1 may be included in the second area SA.

The pixel circuit part PCL may include a buffer layer BFL provided on the substrate SUB, and the pixel circuit 144 provided and/or formed on the buffer layer BFL. In an embodiment, the pixel circuit 144 may include first to seventh transistors T1 to T7 and first and second capacitors C1 and C2.

The buffer layer BFL may prevent impurities from being diffused into each of the first to seventh transistors T1 to T7. The buffer layer BFL may be provided in a single layer structure or a multi-layer structure having at least two or more layers. In the case where the buffer layer BFL has a multi-layer structure, the respective layers may be formed of the same material or different materials. The buffer layer BFL may be omitted depending on the material of the substrate SUB or processing conditions.

The first transistor T1 may include a first gate electrode GE1, a first active pattern ACT1, a first source electrode SE1, a first drain electrode DE1, and a conductive pattern CNP.

The first gate electrode GE1 may be electrically coupled with a 3b-th drain electrode DE3b of a 3b-th transistor T3b and a 4b-th drain electrode DE4b of the 4b-th transistor T4b.

A first end of the conductive pattern CNP may be coupled to the 3b-th drain electrode DE3b and the 4b-th drain electrode DE4b through a first contact hole CH1 passing through the first to third insulating layers INS1 to INS3. A second end of the conductive pattern CNP may be electrically coupled with the first gate electrode GE1 through a second contact hole CH2 that successively passes through the second and third insulating layers INS2 and INS3. In an embodiment, the conductive pattern CNP may be a third conductive layer CL3 provided and/or formed on the third insulating layer INS3.

Each of the first active pattern ACT1, the first source electrode SE1, and the first drain electrode DE1 may be formed of an undoped semiconductor layer or a semiconductor layer doped with an impurity. For example, each of the first source electrode SE1 and the first drain electrode DE1 may be formed of a semiconductor layer doped with an impurity. The first active pattern ACT1 may be formed of an undoped semiconductor layer.

The first active pattern ACT1 may have a bar shape extending in a predetermined direction, and may be bent at least one or more times along its longitudinal extension direction. The first active pattern ACT1 may overlap with the first gate electrode GE1 in a plan view. Since the first active pattern ACT1 is relatively long, a channel area of the first transistor T1 may also be relatively long. Thus, a driving range of a gate voltage to be applied to the first transistor T1 may be increased. Consequently, the gray scale of light emitted from the light emitting elements LD may be precisely controlled.

The first source electrode SE1 may be coupled to a first end of the first active pattern ACT1. The first source electrode SE1 may be coupled with a second drain electrode DE2 of the second transistor T2 and a fifth drain electrode DE5 of the fifth transistor T5. The first drain electrode DE1 may be coupled to a second end of the first active pattern ACT1. The first drain electrode DE1 may be coupled with a 3a-th source electrode SE3a of a 3a-th transistor T3a and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be provided integrally with the i-th scan line Si, and thus, coupled with the i-th scan line Si. In the case where the second gate electrode GE2 and the i-th scan line Si are integrally provided, the second gate electrode GE2 may be provided as a part of the i-th scan line Si or formed in a shape protruding from the i-th scan line Si.

Each of the second active pattern ACT2, the second source electrode SE2, and the second drain electrode DE2 may be formed of an undoped semiconductor layer or a semiconductor layer doped with an impurity. For example, each of the second source electrode SE2 and the second drain electrode DE2 may be formed of a semiconductor layer doped with an impurity. The second active pattern ACT2 may be formed of an undoped semiconductor layer.

The second active pattern ACT2 may overlap with the second gate electrode GE2.

A first end of the second source electrode SE2 may be coupled to the second active pattern ACT2, and a second end of the second source electrode SE2 may be coupled to the j-th data line Dj through a sixth contact hole CH6 that successively passes through the first to third insulating layers INS1 to INS3. In an embodiment, the second insulating layer INS2 may include an inorganic insulating layer including an inorganic material, or an organic insulating layer including an organic material. The second insulating layer INS2 may be provided between the first and third insulating layers INS1 and INS3, and include a material equal to or different from that of the first and second insulating layers INS1 and INS3.

A first end of the second drain electrode DE2 may be coupled with the second active pattern ACT2. A second end of the second drain electrode DE2 may be coupled with the first source electrode SE1 of the first transistor T1 and the fifth drain electrode DE5 of the fifth transistor T5.

The third transistor T3 may have a double gate structure to prevent (or mitigate) current leakage. For example, the third transistor T3 may include the 3a-th transistor T3a and the 3b-th transistor T3b.

The 3a-th transistor T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3b, a 3b-th source electrode SE3b, and a 3b-th drain electrode DE3b.

Each of the 3a-th and 3b-th gate electrodes GE3a and GE3b may be provided integrally with the i-th scan line Si, and thus, coupled with the i-th scan line Si. In the case where the 3a-th and 3b-th gate electrodes GE3a and GE3b and the i-th scan line Si are integrally provided, each of the 3a-th and 3b-th gate electrodes GE3a and GE3b may be provided as a part of the i-th scan line Si or formed in (or as) a shape protruding from the i-th scan line Si.

Each of the 3a-th and 3b-th active patterns ACT3a and ACT3b, the 3a-th and 3b-th source electrodes SE3a and SE3b, and the 3a-th and 3b-th drain electrodes DE3a and DE3b may be formed of a semiconductor layer doped with an impurity or an undoped semiconductor layer. Each of the 3a-th and 3b-th source electrodes SE3a and SE3b and the 3a-th and 3b-th drain electrodes DE3a and DE3b may be formed of a semiconductor layer doped with an impurity. Each of the 3a-th and 3b-th active patterns ACT3a and ACT3b may be formed of an undoped semiconductor layer. The 3a-th active pattern ACT3a may overlap with the 3a-th gate electrode GE3a. The 3b-th active pattern ACT3b may overlap with the 3b-th gate electrode GE3b.

A first end of the 3a-th source electrode SE3a may be coupled to the 3a-th active pattern ACT3a, and a second end of the 3a-th source electrode SE3a may be coupled to the first drain electrode DE1 of the first transistor T1. A first end of the 3a-th drain electrode DE3a may be coupled to the 3a-th active pattern ACT3a, and a second end of the 3a-th drain electrode DE3a may be coupled to the 3b-th source electrode SE3b of the 3b-th transistor T3b.

A first end of the 3b-th drain electrode DE3b may be coupled to the 3b-th active pattern ACT3b, and a second end of the 3b-th source electrode SE3b may be coupled to the 3a-th drain electrode DE3a of the 3a-th transistor T3a. A first end of the 3b-th drain electrode DE3b may be coupled to the 3b-th active pattern ACT3b. A second end of the 3b-th drain electrode DE3b may be coupled to the 4b-th drain electrode DE4b of the 4b-th transistor T4b and the first gate electrode GE1 of the first transistor T1 through the first and second contact holes CH1 and CH2 and the conductive pattern CNP.

The fourth transistor T4 may have a double gate structure to prevent (or mitigate) current leakage in the same manner as that of the third transistor T3. For example, the fourth transistor T4 may include a 4a-th transistor T4a and the 4b-th transistor T4b.

The 4a-th transistor T4a may include a 4a-th gate electrode GE4a, a 4a-th active pattern ACT4a, a 4a-th source electrode SE4a, and a 4a-th drain electrode DE4a. The 4b-th transistor T4*b* may include a 4b-th gate electrode GE4*b*, a 4b-th active pattern ACT4*b*, a 4b-th source electrode SE4*b*, and the 4b-th drain electrode DE4*b*.

Each of the 4a-th and 4b-th gate electrodes GE4*a* and GE4*b* may be provided integrally with the i–1-th scan line Si–1, and thus, coupled with the i–1-th scan line Si–1. In the case where the 4a-th and 4b-th gate electrodes GE4*a* and GE4*b* and the i–1-th scan line Si–1 are integrally provided, each of the 4a-th and 4b-th gate electrodes GE4*a* and GE4*b* may be provided as a part of the i–4-th scan line Si–1 or formed in (or as) a shape protruding from the i–1-th scan line Si–1.

Each of the 4a-th and 4b-th active patterns ACT4*a* and ACT4*b*, the 4a-th and 4b-th source electrodes SE4*a* and SE4*b*, and the 4a-th and 4b-th drain electrodes DE4*a* and DE4*b* may be formed of a semiconductor layer doped with an impurity or an undoped semiconductor layer. Each of the 4a-th and 4b-th source electrodes SE4*a* and SE4*b* and the 4a-th and 4b-th drain electrodes DE4*a* and DE4*b* may be formed of a semiconductor layer doped with an impurity. Each of the 4a-th and 4b-th active patterns ACT4*a* and ACT4*b* may be formed of an undoped semiconductor layer. The 4a-th active pattern ACT4*a* may overlap with the 4a-th gate electrode GE4*a*. The 4b-th active pattern ACT4*b* may overlap with the 4b-th gate electrode GE4*b*.

A first end of the 4a-th source electrode SE4*a* may be coupled to the 4a-th active pattern ACT4*a*, and a second end of the 4a-th source electrode SE4*a* may be coupled to the initialization power supply line IPL through a fifth contact hole CH5 that successively passes through the first to third insulating layers INS1 to INS3. A first end of the 4a-th drain electrode DE4*a* may be coupled to the 4a-th active pattern ACT4*a*, and a second end of the 4a-th drain electrode DE4*a* may be coupled to the 4b-th source electrode SE4*b* of the 4b-th transistor T4*b*.

A first end of the 4b-th source electrode SE4*b* may be coupled to the 4b-th active pattern ACT4*b*, and a second end of the 4b-th source electrode SE4*b* may be coupled to the 4a-th drain electrode DE4*a* of the 4a-th transistor T4*a*. A first end of the 4b-th drain electrode DE4*b* may be coupled to the 4b-th active pattern ACT4*b*, and a second end of the 4b-th drain electrode DE4*b* may be coupled to the 3b-th drain electrode DE3*b* of the 3b-th transistor T3*b*. Further, the second end of the 4b-th drain electrode DE4*b* may be coupled to the first gate electrode GE1 of the first transistor T1 through the first and second contact holes CH1 and CH2 and the conductive pattern CNP.

The fifth transistor T5 may include a fifth gate electrode GE5, a fifth active pattern ACT5, a fifth source electrode SE5, and a fifth drain electrode DE5.

The fifth gate electrode GE5 may be provided integrally with the i-th emission control line Ei, and thus, coupled with the i-th emission control line Ei. In the case where the fifth gate electrode GE5 and the i-th emission control line Ei are integrally provided, the fifth gate electrode GE5 may be provided as a part of the i-th emission control line Ei or formed in (or as) a shape protruding from the i-th emission control line Ei.

Each of the fifth active pattern ACT5, the fifth source electrode SE5, and the fifth drain electrode DE5 may be formed of an undoped semiconductor layer or a semiconductor layer doped with an impurity. For example, each of the fifth source electrode SE5 and the fifth drain electrode DE5 may be formed of a semiconductor layer doped with an impurity. The fifth active pattern ACT5 may be formed of an undoped semiconductor layer.

The fifth active pattern ACT5 may overlap with the fifth gate electrode GE5.

A first end of the fifth source electrode SE5 may be coupled to the fifth active pattern ACT5. A second end of the fifth source electrode SE5 may be coupled to the first power supply line PL1 through a fourth contact hole CH4 that successively passes through the first to third insulating layers INS1 to INS3.

A first end of the fifth drain electrode DE5 may be coupled with the fifth active pattern ACT5. A second end of the fifth drain electrode DE5 may be coupled with the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be provided integrally with the i-th emission control line Ei, and thus, coupled with the i-th emission control line Ei. In the case where the sixth gate electrode GE6 and the i-th emission control line Ei are integrally provided, the sixth gate electrode GE6 may be provided as a part of the i-th emission control line Ei or formed in (or as) a shape protruding from the i-th emission control line Ei.

Each of the sixth active pattern ACT6, the sixth source electrode SE6, and the sixth drain electrode DE6 may be formed of an undoped semiconductor layer or a semiconductor layer doped with an impurity. For example, each of the sixth source electrode SE6 and the sixth drain electrode DE6 may be formed of a semiconductor layer doped with an impurity. The sixth active pattern ACT6 may be formed of an undoped semiconductor layer.

The sixth active pattern ACT6 may overlap with the sixth gate electrode GE6.

A first end of the sixth source electrode SE6 may be coupled to the sixth active pattern ACT6. A second end of the sixth source electrode SE6 may be coupled with the first drain electrode DE1 of the first transistor T1 and the 3a-th source electrode SE3*a* of the 3a-th transistor T3*a*.

A first end of the sixth drain electrode DE6 may be coupled to the sixth active pattern ACT6. A second end of the sixth drain electrode DE6 may be coupled to the first electrode EL1 through a seventh contact hole CH7 that successively passes through the first to third insulating layers INS1 to INS3.

The first electrode EL1 of the emission unit EMU may be coupled to the sixth drain electrode DE6 of the sixth transistor T6 through the seventh contact hole CH7. The first electrode EL1 may be coupled to a seventh source electrode SE7 of the seventh transistor T7 through the seventh contact hole CH7. In an embodiment, the first electrode EL1 may be provided in the same layer as the j-th data line Dj, and may include the same material as that of the j-th data line Dj. For example, the first electrode EL1 may be formed of a third conductive layer CL3 provided and/or formed on the third insulating layer INS3. The first electrode EL1 may be an anode electrode included in the emission unit EMU of the first pixel PXL1.

The seventh transistor T7 may include a seventh gate electrode GE7, a seventh active pattern ACT7, the seventh source electrode SE7, and the seventh drain electrode DE7.

The seventh gate electrode GE7 may be provided integrally with the i+1-th scan line Si+1, and thus, coupled with the i+1-th scan line Si+1. In the case where the seventh gate electrode GE7 and the i+1-th scan line Si+1 are integrally provided, the seventh gate electrode GE7 may be provided as a part of the i+1-th scan line Si+1 or formed in (or as) a shape protruding from the i+1-th scan line Si+1.

Each of the seventh active pattern ACT7, the seventh source electrode SE7, and the seventh drain electrode DE7 may be formed of an undoped semiconductor layer or a semiconductor layer doped with an impurity. For example, each of the seventh source electrode SE7 and the seventh drain electrode DE7 may be formed of a semiconductor layer doped with an impurity. The seventh active pattern ACT7 may be formed of an undoped semiconductor layer.

The seventh active pattern ACT7 may overlap with the seventh gate electrode GE7.

A first end of the seventh source electrode SE7 may be coupled to the seventh active pattern ACT7, and a second end of the seventh source electrode SE7 may be coupled to the sixth drain electrode DE6 of the sixth transistor T6 through the seventh contact hole CH7 and the first electrode EL1.

A first end of the seventh drain electrode DE7 may be coupled to the seventh active pattern ACT7, and a second end of the seventh drain electrode DE7 may be coupled to an auxiliary connection line AUX through a tenth contact hole CH10 that successively passes through the first to third insulating layers INS1 to INS3.

The auxiliary connection line AUX may be coupled to the seventh drain electrode DE7 of the seventh transistor T7 through the tenth contact hole CH10. The auxiliary connection line AUX may be coupled, through the tenth contact hole CH10, to the initialization power supply line IPL that is disposed on the second pixel area PXA2 of the second pixel PXL2 disposed on (or in) the same pixel row as that of the first pixel PXL1. The seventh drain electrode DE7 of the seventh transistor T7 may be coupled with the initialization power supply line IPL by the auxiliary connection line AUX.

As described above, the seventh drain electrode DE7 of the seventh transistor T7 may be coupled to the 4a-th source electrode SE4a of the 4a-th transistor T4a of the second pixel PXL2 through the auxiliary connection line AUX and the initialization power supply line IPL of the second pixel PXL2

In an embodiment, the auxiliary connection line AUX of the first pixel PXL1 may be provided integrally with the initialization power line IPL of the second pixel PXL2, and thus, coupled to the initialization power line IPL. In the case where the auxiliary connection line AUX of the first pixel PXL1 and the initialization power line IPL of the second pixel PXL2 are integrally provided, the auxiliary connection line AUX of the first pixel PXL1 may be provided as a part of the initialization power line IPL of the second pixel PXL2. In other words, the auxiliary connection line AUX of each pixel PXL may be provided integrally with the initialization power supply line IPL that is disposed on (or in) the same pixel row as that of the corresponding pixel PXL and is disposed in a pixel PXL immediately adjacent to the corresponding pixel PXL.

If the auxiliary connection line AUX of the first pixel PXL1 is provided integrally with the initialization power supply line IPL of the second pixel PXL2, the auxiliary connection line AUX may be provided in the same layer as the initialization power supply line IPL, and may include the same material as the initialization power supply line IPL. For example, the auxiliary connection line AUX of the first pixel PXL1 may be formed of a third conductive layer CL3 provided and/or formed on the third insulating layer INS3.

The first capacitor C1 may include a first lower electrode LE1 and a first upper electrode UE1.

The first lower electrode LE1 may be provided integrally with the first gate electrode GE1 of the first transistor T1, and thus, coupled with the first gate electrode GE1. In the case where the first lower electrode LE1 is provided integrally with the first gate electrode GE1, the first lower electrode LE1 may be regarded as being a part of the first gate electrode GE1 or the first gate electrode GE1 may be regarded as being a part of the first lower electrode LE1.

In an embodiment, the first lower electrode LE1 may be provided in the same layer as the scan lines Si−1, Si, and Si+1, and may include the same material as that of the scan lines Si−1, Si, and Si+1. For example, the first lower electrode LE1 may be formed of a first conductive layer CL1 provided and/or formed on the first insulating layer INS1.

The first upper electrode UE1 may overlap with the first lower electrode LE1 and cover the first lower electrode LE1. The capacitance of the first capacitor C1 may be increased by increasing the area of the overlapped portion between the first upper electrode UE1 and the first lower electrode LE1. The first upper electrode UE1 may be electrically coupled to the first power supply line PL1 through a third contact hole CH3 passing through the third insulating layer INS3. Therefore, the first driving power supply VDD applied to the first power supply line PL1 may be transmitted to the first upper electrode UE1. The first upper electrode UE1 may include an opening OPN corresponding to an area having the second contact hole CH2 formed to couple the first gate electrode GE1 of the first transistor T1 with the conductive pattern CNP.

In an embodiment, the first upper electrode UE1 may be a second conductive layer CL2 that is provided and/or formed on the second insulating layer INS2.

The second capacitor C2 may include a second lower electrode LE2 and a second upper electrode UE2.

The second lower electrode LE2 may be located between the i-th emission control line Ei and the i+1-th scan line Si+1 in a plan view, and may be provided and/formed in the same layer as the first lower electrode LE1. The second lower electrode LE2 may be coupled to the second power supply line PL2 through a ninth contact hole CH9 that successively passes through the second and third insulating layers INS2 and INS3. Therefore, the second driving power supply VSS applied to the second power supply line PL2 may be transmitted to the second lower electrode LE2.

In an embodiment, the second lower electrode LE2 may be provided in the same layer as the scan lines Si−1, Si, and Si+1, and may include the same material as that of the scan lines Si−1, Si, and Si+1. For example, the second lower electrode LE2 may be formed of a first conductive layer CL1 provided and/or formed on the first insulating layer INS1.

The second upper electrode UE2 may overlap with the second lower electrode LE2 and cover the second lower electrode LE2. The capacitance of the second capacitor C2 may be increased by increasing the area of the overlapped portion between the second upper electrode UE2 and the second lower electrode LE2. The second upper electrode UE2 may be electrically coupled to the first electrode EL1 through an eighth contact hole CH8 passing through the third insulating layer INS3. Thereby, a signal (or a voltage) applied to the first electrode EL1 may be transmitted to the second upper electrode UE2.

In an embodiment, the second upper electrode UE2 may be provided in the same layer as the first upper electrode UE1, and may include the same material as that of the first upper electrode UE1. For example, the second upper electrode UE2 may be formed of a second conductive layer CL2 provided and/or formed on the second insulating layer INS2.

As described above, the first lower electrode LE1 and the first upper electrode UE1 may form the first capacitor C1 with the second insulating layer INS2 interposed therebetween. The second lower electrode LE2 and the second upper electrode UE2 may form the second capacitor C2 with the second insulating layer INS2 interposed therebetween.

The pixel circuit part PCL may further include a fourth insulating layer INS4 for covering the pixel circuit 144 having the above-mentioned configuration. The fourth insulating layer INS4 may be an organic insulating layer including an organic material or an inorganic insulating layer including an inorganic material. In an embodiment, the fourth insulating layer INS4 may be an organic insulating layer.

First to third floating electrodes FLT1 to FLT3 and a fourth arrangement electrode ARL4 may be disposed in the first area FA of the first pixel area PXA1. Each of the first to third floating electrodes FLT1 to FLT3 and the fourth arrangement electrode ARL4 may be formed of a third conductive layer CL3 provided and/or formed on the third insulating layer INS3. The first floating electrode FLT1 may be provided on (or in) the same column as that of the first electrode EL1 disposed in the emission area EMA of the first pixel area PXA1, and may be spaced apart from the first electrode EL1 by a predetermined distance. The second floating electrode FLT2 may be provided on (or in) the same column as that of the first connection electrode CP1 disposed in the emission area EMA of the first pixel area PXA1, and may be spaced apart from the first connection electrode CP1 by a predetermined distance. The third floating electrode FLT3 may be provided on (or in) the same column as that of the second connection electrode CP2 disposed in the emission area EMA of the first pixel area PXA1, and may be spaced apart from the second connection electrode CP2 by a predetermined distance. The fourth arrangement electrode ARL4 that is the second power supply line PL2 may be provided integrally with the second electrode EL2 disposed in the emission area EMA of the first pixel PXL1, and may be electrically coupled with the second electrode EL2.

In an embodiment, each of the first to third floating electrodes FLT1 to FLT3 may float, i.e., be electrically isolated.

The display element part DPL may include a stacked pattern LAP, first and second electrodes EL1 and EL2, first and second connection electrodes CP1 and CP2, light emitting elements LD, and a contact electrode CNE that are provided in the emission area EMA. Furthermore, the display element part DPL may include a bank BNK provided in a peripheral area disposed around the emission area EMA.

The stacked pattern LAP may be a support member for supporting the first and second electrodes EL1 and EL2 and the first and second connection electrodes CP1 and CP2 to change respective surface profiles of the first and second electrodes EL1 and EL2 and the first and second connection electrodes EL1 and EL2 so that light emitted from the light emitting elements LD may be more reliably advanced in an image display direction of the display device, e.g., in the third direction DR3.

The stacked pattern LAP may be provided in a multi-layer structure including at least one insulating layer and at least one conductive layer that are provided and/or formed on the buffer layer BFL. For example, the stacked pattern LAP may be provided in a multi-layer structure in which a first metal pattern MTP1, a first insulating pattern INSP1, a second metal pattern MTP2, and a second insulting pattern INSP2 are successively stacked.

The first metal pattern MTP1 may be formed of a first conductive layer CL1 provided and/or formed on the first insulating layer INS1. In an embodiment, the first metal pattern MTP1 may be provided in the same layer as the scan lines Si−1, Si, and Si+1 and the first and second lower electrodes LE1 and LE2, and may include the same material as that of the scan lines Si−1, Si, and Si+1 and the first and second lower electrodes LE1 and LE2.

The first insulating pattern INSP1 may be provided on the first metal pattern MTP1 and may enclose the first metal pattern MTP1. For example, the first insulating pattern INSP1 may be an independent insulating pattern that encloses only the first metal pattern MTP1. In an embodiment, the first insulating pattern INSP1 included in the stacked pattern LAP may be a component corresponding to the second insulating layer INS2 of the pixel circuit part PCL.

The second metal pattern MTP2 may be formed of a second conductive layer CL2 provided and/or formed on the first insulating pattern INSP1. In an embodiment, the second metal pattern MTP2 may be provided in the same layer as the first and second upper electrodes UE1 and UE2, and may include the same material as that of the first and second upper electrodes UE1 and UE2.

The second insulating pattern INSP2 may be provided on the second metal pattern MTP2 and may enclose the second metal pattern MTP2. For example, the second insulating pattern INSP2 may be an independent insulating pattern that encloses only the second metal pattern MTP2. In an embodiment, the second insulating pattern INSP2 included in the stacked pattern LAP may be a component corresponding to the third insulating layer INS3 of the pixel circuit part PCL.

As described above, the stacked pattern LAP including the first metal pattern MTP1, the first insulating pattern INSP1, the second metal pattern MTP2, and the second insulating pattern INSP2 may have a shape protruding upward from one surface (e.g., an upper surface) of the first insulating layer INS1. The stacked pattern LAP may have a trapezoidal cross-section in which the width of the stacked pattern LAP is reduced from the one surface of the first insulating layer INS1 upward. In a sectional view, adjacent stacked patterns LAP may be disposed on the same plane over the buffer layer BFL, and may have the same height.

As described, the stacked pattern LAP has been illustrated as having a four-layer structure in which the first metal pattern MTP1, the first insulating pattern INSP1, the second metal pattern MTP2, and the second insulating pattern INSP2 are successively stacked, but embodiments are not limited thereto. In an embodiment, the stacked pattern LAP may have a multi-layer structure including at least two or more metal patterns and at least three or more insulating patterns or a multi-layer structure including a semiconductor layer.

For example, as illustrated in FIG. 12, the stacked pattern LAP may be provided in a multi-layer structure in which a first auxiliary pattern MTP_a, a sub-insulating pattern INSP_S, a first metal pattern MTP1, a first insulating pattern INSP1, a second metal pattern MTP2, and a second insulating pattern INSP2 are successively stacked.

The first auxiliary pattern MTP_a may be formed of a semiconductor layer provided and/or formed over the buffer layer BFL. In an embodiment, the first auxiliary pattern MTP_a may be provided in the same layer as the semiconductor layer included in the pixel circuit part PCL, and may include the same material as that of the semiconductor layer. For example, the first auxiliary pattern MTP_a may be provided in the same layer as the first to seventh active patterns ACT1 to ACT7, and may include the same material as that of the first to seventh active patterns ACT1 to ACT7. In an embodiment, the first auxiliary pattern MTP_a may be provided in the same layer as the source electrodes SE1, SE2, SE3a, SE3b, SE4a, SE4b, SE5, SE6, and SE7 and the drain electrodes DE1, DE2, DE3a, DE3b, DE4a, DE4b, DE5, DE6, and DE7, and may include the same material as that of the source electrodes SE1, SE2, SE3a, SE3b, SE4a, SE4b, SE5, SE6, and SE7 and the drain electrodes DE1, DE2, DE3a, DE3b, DE4a, DE4b, DE5, DE6, and DE7.

The sub-insulating pattern INSP_S may be provided on the first auxiliary pattern MTP_a and may enclose the first auxiliary pattern MTP_a. For example, the sub-insulating pattern INSP_S may be an independent insulating pattern that encloses only the first auxiliary pattern MTP_a. In an embodiment, the sub-insulating pattern INSP_S included in the stacked pattern LAP may be a component corresponding to the first insulating layer INS1 included in the pixel circuit part PCL.

The first metal pattern MTP1 may be formed of a first conductive layer CL1 provided and/or formed on the sub-insulating layer INSP_S.

The first insulating pattern INSP1 may be provided on the first metal pattern MTP1 and may enclose the first metal pattern MTP1.

The second metal pattern MTP2 may be formed of a second conductive layer CL2 provided and/or formed on the first insulating pattern INSP1.

The second insulating pattern INSP2 may be provided on the second metal pattern MTP2 and may enclose the second metal pattern MTP2.

As described above, the stacked pattern LAP including the first auxiliary pattern MTP_a, the sub-insulating pattern INSP_S, the first metal pattern MTP1, the first insulating pattern INSP1, the second metal pattern MTP2, and the second insulating pattern INSP2 may have a shape protruding upward from one surface (e.g., an upper surface) of the buffer layer BFL.

The display element part DPL of the first pixel PXL1 may include a bank BNK disposed on a peripheral area of the first pixel area PXA1.

The bank BNK may be a structure that defines (or separates) the respective emission areas EMA of the first pixel PXL1 and pixels PXL, e.g., the second pixel PXL2 and the third pixel PXL3, disposed adjacent to the first pixel PXL1. For example, the bank BNK may be a pixel define (or definition) layer. The bank BNK may include at least two or more conductive layers and at least two or more insulating layers, thus preventing (or mitigating) light from leaking between the first pixel PXL1 and the pixels adjacent thereto.

In an embodiment, the bank BNK may include at least two or more insulating layers and at least two or more conductive layers that are provided and/or formed on the first insulating layer INS1. For example, the bank BNK may be provided in a multi-layer structure in which a third metal pattern MTP3, a third insulating pattern INSP3, a fourth metal pattern MTP4, a fourth insulating pattern INSP4, and a fifth insulating pattern INSP5 are successively stacked. Furthermore, the bank BNK may further include a fifth metal pattern MTP5 provided and/or formed between the fourth insulating pattern INSP4 and the fifth insulating pattern INSP5.

The bank BNK may be divided into a first bank area BA1 and a second bank area BA2 depending on whether the fifth metal pattern MTP5 is included in the stacked multi-layer structure. For example, the first bank area BA1 may mean an area of the bank BNK which does not include the fifth metal pattern MTP5. The second bank area BA2 may mean an area of the bank BNK which includes the fifth metal pattern MTP5.

For example, the first bank area BA1 may be an area of the bank BNK that has a multi-layer structure in which the third metal pattern MTP3, the third insulating pattern INSP3, the fourth metal pattern MTP4, the fourth insulating pattern INSP4, and the fifth insulating pattern INSP5 are successively stacked. For example, the second bank area BA2 may be an area of the bank BNK that has a multi-layer structure in which the third metal pattern MTP3, the third insulating pattern INSP3, the fourth metal pattern MTP4, the fourth insulating pattern INSP4, the fifth metal pattern MTP5, and the fifth insulating pattern INSP5 are successively stacked.

The third metal pattern MTP3 may be formed of a first conductive layer CL1 provided and/or formed on the first insulating layer INS1. In an embodiment, the third metal pattern MTP3 may be provided in the same layer as the scan lines Si−1, Si, and Si+1, the first and second lower electrodes LE1 and LE2, and the first metal pattern MTP1, and may include the same material as that of the scan lines Si−1, Si, and Si+1, the first and second lower electrodes LE1 and LE2, and the first metal pattern MTP1.

The third insulating pattern INSP3 may be provided on the third metal pattern MTP3 and configured to enclose the third metal pattern MTP3. For example, the third insulating pattern INSP3 may be an independent insulating pattern that encloses only the third metal pattern MTP3. In an embodiment, the third insulating pattern INSP3 may be a component corresponding to the second insulating layer INS2 included in the pixel circuit part PCL. Furthermore, the third insulating pattern INSP3 may be a component corresponding to the first insulating pattern INSP1 included in the stacked pattern LAP. In other words, the third insulating pattern INSP3 included in the bank BNK may be provided in the same layer both as the first insulating pattern INSP1 included in the stacked pattern LAP and as the second insulating layer INS2 included in the pixel circuit part PCL, and may include the same material as that of the first insulating pattern INSP1 and the second insulating layer INS2.

The fourth metal pattern MTP4 may be formed of a second conductive layer CL2 provided and/or formed on the third insulating pattern INSP3. In an embodiment, the fourth metal pattern MTP4 may be provided in the same layer as the first and second upper electrodes UE1 and UE2 and the second metal pattern MTP2, and may include the same material as that of the first and second upper electrodes UE1 and UE2 and the second metal pattern MTP2.

The fourth insulating pattern INSP4 may be provided on the fourth metal pattern MTP4 and may enclose the fourth metal pattern MTP4. For example, the fourth insulating pattern INSP4 may be an independent insulating pattern that encloses only the fourth metal pattern MTP4. In an embodiment, the fourth insulating pattern INSP4 may be a component corresponding to the third insulating layer INS3 included in the pixel circuit part PCL. Furthermore, the fourth insulating pattern INSP4 may be a component corresponding to the second insulating pattern INSP2 included in the stacked pattern LAP. In other words, the fourth insulating pattern INSP4 included in the bank BNK may be provided in the same layer both as the second insulating pattern INSP2 included in the stacked pattern LAP and as the third insulating layer INS3 included in the pixel circuit part PCL, and may include the same material as that of the second insulating pattern INSP2 and the third insulating layer INS3.

The fifth metal pattern MTP5 may be formed of a third conductive layer CL3 provided and/or formed on the fourth insulating pattern INSP4. In an embodiment, the fifth metal pattern MTP5 may include signal lines that extend from the first area FA of the first pixel area PXA1 and cross the second area SA. For example, the fifth metal pattern MTP5 may include the initialization power supply line IPL, the j-th data line Dj, and the first power supply line PL1.

The fifth insulating pattern INSP5 may be provided on each of the fifth metal pattern MTP5 and the fourth insulating pattern INSP4 and may enclose the fifth metal pattern MTP5 and the fourth insulating pattern INSP4. In an embodiment, the fifth insulating pattern INSP5 may be a component corresponding to the fourth insulating layer INS4 included in the pixel circuit part PCL. The fifth insulating pattern INSP5 may be provided in the same layer as the fourth insulating layer INS4 included in the pixel circuit part PCL, and may include the same material as that of the fourth insulating layer INS4.

As described above, the bank BNK including the third metal pattern MTP3, the third insulating pattern INSP3, the fourth metal pattern MTP4, the fourth insulating pattern INSP4, and the fifth insulating pattern INSP5 or including the third metal pattern MTP3, the third insulating pattern INSP3, the fourth metal pattern MTP4, the fourth insulating pattern INSP4, the fifth metal pattern MTP5, and the fifth insulating pattern INSP5 may have a shape protruding upward (e.g., in the third direction DR3) a predetermined height (or thickness) from one surface (e.g., the upper surface) of the first insulating layer INS1.

In an embodiment, the bank BNK may include at least one light shielding material and/or reflective material, thus preventing (or mitigating) light from leaking between the first pixel PXL1 and the pixels PXL adjacent thereto.

In an embodiment, at least one layer of the bank BNK disposed in the peripheral area of the first pixel area PXA1 and at least one layer of the stacked pattern LAP disposed in the emission area EMA of the first pixel area PXA1 may have the same material. Furthermore, the bank BNK and the stacked pattern LAP may include at least one layer formed through the same process.

The first and second electrodes EL1 and EL2 may be disposed at positions spaced apart from each other in the emission area EMA. The first connection electrode CP1 and the second connection electrode CP2 may be disposed between the first electrode EL1 and the second electrode EL2. For example, the first connection electrode CP1 may be disposed between the first electrode EL1 and the second connection electrode CP2. The second connection electrode CP2 may be disposed between the first connection electrode CP1 and the second electrode EL2. In a plan view, the first electrode EL1, the first connection electrode CP1, the second connection electrode CP2, and the second electrode EL2 may be disposed at positions spaced apart from each other.

In an embodiment, the first electrode EL1 and the first connection electrode CP1 may be spaced apart from each other by a predetermined distance. The first connection electrode CP1 and the second connection electrode CP2 may be spaced apart from each other by a predetermined distance. The second connection electrode CP2 and the second electrode EL2 may be spaced apart from each other by a predetermined distance. In the emission area EMA of the first pixel PXL1, the distance between the first electrode EL1 and the first connection electrode CP1, the distance between the first connection electrode CP1 and the second connection electrode CP2, and the distance between the second connection electrode CP2 and the second electrode EL2 may be the same as each other. Therefore, the light emitting elements LD may be more uniformly arranged in the emission area EMA of the first pixel PXL1. However, embodiments are not limited thereto. In an embodiment, the distance between the first electrode EL1 and the first connection electrode CP1, the distance between the first connection electrode CP1 and the second connection electrode CP2, and the distance between the second connection electrode CP2 and the second electrode EL2 may differ from each other or at least one of the others.

The first electrode EL1, the first connection electrode CP1, the second connection electrode CP2, and the second electrode EL2 may be provided and/or formed on the stacked pattern LAP, and thus, each may have a surface profile corresponding to the shape of the stacked pattern LAP. For example, the first and second electrodes EL1 and EL2 and the first and second connection electrodes CP1 and CP2 each may include a protrusion part corresponding to the stacked pattern LAP and a planar part corresponding to the first insulating layer INS1. The first electrode EL1, the first connection electrode CP1, the second connection electrode CP2, and the second electrode EL2 may be formed of material having a predetermined reflectivity to allow light emitted from each of the light emitting elements LD to move in the image display direction of the display device.

Each of the first electrode EL1, the first connection electrode CP1, the second connection electrode CP, and the second electrode EL2 may be formed of conductive material having a predetermined reflectivity. The conductive material may include opaque metal that has an advantage in reflecting, in the image display direction of the display device, light emitted from the light emitting elements LD. The opaque metal may include, for example, at least one of Ag, Mg, Al, Pt, Pd, Au, Ni, Nd, Ir, Cr, Ti, and an alloy of at least two of these materials. In an embodiment, each of the first electrode EL1, the first connection electrode CP1, the second connection electrode CP2, and the second electrode EL2 may include a transparent conductive material. The transparent conductive material may include a conductive oxide, such as at least one of indium tin oxide (ITO), indium zinc oxide (IZO), zinc oxide (ZnO), and indium tin zinc oxide (ITZO), or a conductive polymer, such as poly(3,4-ethylenedioxythiophene) (PEDOT). In the case where each of the first electrode EL1, the first connection electrode CP1, the second connection electrode CP2, and the second electrode EL2 includes a transparent conductive material, a separate conductive layer made of opaque metal for reflecting light emitted from the light emitting elements LD in the image display direction of the display device may be included in each of the first electrode EL1, the first connection electrode CP1, the second connection electrode CP2, and the second electrode EL2. However, the material for each of the first electrode EL1, the first connection electrode CP1, the second connection electrode CP2, and the second electrode EL2 is not limited to the above-mentioned materials.

Furthermore, although each of the first electrode EL1, the first connection electrode CP1, the second connection electrode CP2, and the second electrode EL2 may be provided and/or formed in a single layer structure, embodiments are not limited thereto. In an embodiment, each of the first electrode EL1, the first connection electrode CP1, the second connection electrode CP2, and the second electrode EL2 may be provided and/or formed in a multi-layer structure in which layers made of at least two or more materials among metals, alloys, conductive oxide, and conductive polymers are stacked. Each of the first electrode EL1, the first connection electrode CP1, the second connection electrode CP2, and the second electrode EL2 may be formed of multilayers having at least two or more layers so as to minimize (or at least reduce) distortion that may occur due to a signal delay when signals (or voltages) are transmitted to opposite ends of each of the light emitting elements LD. For example, each of the first electrode EL1, the first connection electrode CP1, the second connection electrode CP2, and the second electrode EL2 may have a multi-layer structure in which layers are stacked in a sequence of ITO/Ag/ITO.

In an embodiment, each of the first electrode EL1, the first connection electrode CP1, the second connection electrode CP2, and the second electrode EL2 may be formed of a third conductive layer CL3. Each of the first electrode EL1, the first connection electrode CP1, the second connection electrode CP2, and the second electrode EL2 may be formed of a third conductive layer CL3 may be provided in the same layer as the j-th data line Dj, the initialization power supply line IPL, and the first power supply line PL1, and may include the same material as that of the j-th data line Dj, the initialization power supply line IPL, and the first power supply line PL1.

As described above, since each of the first electrode EL1, the first connection electrode CP1, the second connection electrode CP2, and the second electrode EL2 has a surface profile corresponding to the shape of the stacked pattern LAP disposed thereunder, light emitted from each of the light emitting elements LD may be reflected by the first electrode EL1, the first connection electrode CP1, the second connection electrode CP2, and the second electrode EL2, and thus, may be more reliably advanced in the image display direction of the display device. The output efficiency of light emitted from each of the light emitting elements LD may be further enhanced.

In an embodiment, each of the stacked pattern LAP, the first electrode EL1, the first connection pattern CP1, the second connection pattern CP2, and the second electrode EL2 may function as a reflective member for guiding light emitted from the light emitting elements LD in a desired direction, thus enhancing the optical efficiency of the display device. In other words, each of the stacked pattern LAP, the first electrode EL1, the first connection pattern CP1, the second connection pattern CP2, and the second electrode EL2 may function as a reflective member for enabling light emitted from the light emitting elements LD to be advanced in the image display direction of the display device, thus enhancing the light output efficiency of the display device.

In the emission area EMA of the first pixel PXL1, a plurality of light emitting elements LD are arranged and/or provided between the first electrode EL1 and the first connection electrode CP1, between the first connection electrode CP1 and the second connection electrode CP2, and between the second connection electrode CP2 and the second electrode EL2. In the emission area EMA, the first electrode EL1, the first connection electrode CP1, the second connection electrode CP2, the second electrode EL2, and the light emitting elements LD may form the emission unit EMU of the first pixel PXL1.

The first electrode EL1 included in the emission unit EMU of the first pixel PXL1 may be an anode electrode, and the second electrode EL2 may be a cathode electrode.

The first electrode EL1 may be electrically coupled to the pixel circuit part PCL through the seventh contact hole CH7. For example, the first electrode EL1 may be coupled to the sixth drain electrode DE6 of the sixth transistor T6 of the pixel circuit part PCL through the seventh contact hole CH7. Thereby, a signal (or a voltage) applied to the sixth transistor T6 may be transmitted to the first electrode EL1. Furthermore, the first electrode EL1 may be electrically coupled to the second upper electrode UE2 through the eighth contact hole CH8. Thereby, a signal (or a voltage) transmitted to the first electrode EL1 may be transmitted to the second upper electrode UE2.

In an embodiment, the second electrode EL2 may be provided integrally with the second power supply line PL2 crossing the first area FA and the second area SA of the first pixel area PXA1, and thus, coupled to the second power supply line PL2. In the case where the second electrode EL2 and the second power supply line PL2 are integrally provided, the second electrode EL2 may be regarded as being a part of the second power supply line PL2, or the second power supply line PL2 may be regarded as being a part of the second electrode EL2. As described above, since the second electrode EL2 is provided integrally with the second power supply line PL2, the second driving power supply VDD applied to the second power supply line PL2 may be transmitted to the second electrode EL2.

In the foregoing, each of the light emitting elements LD may be formed of a light emitting element that is made of material having an inorganic crystal structure and has a subminiature size, e.g., ranging from a nanoscale to a microscale. For example, each of the light emitting elements LD may be a subminiature light emitting element fabricated by an etching method or a growth method. The type, the size, the shape, etc. of the light emitting elements LD may be changed in various ways. Although at least two to several tens of light emitting elements LD may be arranged and/or provided in the emission area EMA of the first pixel PXL1, the number of light emitting elements LD is not limited thereto. In an embodiment, the number of light emitting elements LD in the emission area EMA of the first pixel PXL1 may be changed in various ways.

The light emitting elements LD may be provided in a diffused form in a solution and then supplied to the emission area EMA of the first pixel PXL1. In an embodiment, the light emitting elements LD may be supplied to the emission area EMA by an inkjet printing method, a slit coating method, or other various methods. For example, the light emitting elements LD may be mixed with a volatile solvent and then supplied to the emission area EMA by an inkjet printing method or a slit coating method. Here, if corresponding align signals (or align voltages) are respectively applied to the first electrode EL1, the first connection electrode CP1, the second connection electrode CP2, and the second electrode EL2 that are disposed in the emission area EMA, electric fields may be respectively formed between the first electrode EL1 and the first connection electrode CP1, between the first connection electrode CP1 and the second connection electrode CP2, and between the second connection electrode CP2 and the second electrode EL2. Hence, light emitting elements LD may be aligned between the first electrode EL1 and the first connection electrode CP1, between the first connection electrode CP1 and the second connection electrode CP2, and between the second connection electrode CP2 and the second electrode EL2. After the light emitting elements LD have been aligned, the solvent may be removed by volatilization or other methods. As a result, the light emitting elements LD may be aligned and/or provided in the emission area EMA of the first pixel PXL.

The light emitting elements LD may include first light emitting elements LD1 arranged between the first electrode EL1 and the first connection electrode CP1, second light emitting elements LD2 arranged between the first connection electrode CP1 and the second connection electrode CP2, and third light emitting elements LD3 arranged between the second connection electrode CP2 and the second electrode EL2.

Before the light emitting elements LD are arranged in the emission area EMA of the first pixel PXL1, the first electrode EL1 may be provided integrally with the first floating electrode FLT1, and thus, coupled to the first floating electrode FLT1. In the case where the first electrode EL1 and the first floating electrode FLT1 are integrally provided, the first electrode EL1 may be regarded as being a part of the first floating electrode FLT1, or the first floating electrode FLT1 may be regarded as being a part of the first electrode EL1. The first electrode EL1 and the first floating electrode FLT1 that are integrally provided and coupled to each other before the light emitting elements LD are arranged may function as arrangement electrodes.

After the light emitting elements LD have been arranged, the first electrode EL1 and the first floating electrode FLT1 that are integrally provided may be electrically and/or physically separated from each other. Thereby, the first floating electrode FLT1 that is disposed in the first area FA of the first pixel area PXA1 of the first pixel PXL1 may be spaced apart from the first electrode EL1 disposed in the emission area EMA of the first pixel area PXA1. After the light emitting elements LD have been arranged, the first electrode EL1 may function as a driving electrode for driving the light emitting elements LD. For example, the first electrode EL1 may function as an anode electrode of the emission unit EMU of the first pixel PXL1 after the arrangement of the light emitting elements LD. Furthermore, after the arrangement of the light emitting elements LD, the first floating electrode FLT1 may float, i.e., be electrically isolated.

Before the light emitting elements LD are arranged in the emission area EMA of the first pixel PXL1, the first connection electrode CP1 may be provided integrally with the second floating electrode FLT2, and thus, coupled to the second floating electrode FLT2. In the case where the first connection pattern CP1 and second floating electrode FLT2 are integrally provided, the first connection pattern CP1 may be regarded as being a part of the second floating electrode FLT2, or the second floating electrode FLT2 may be regarded as a part of the first connection pattern CP1. The first connection electrode CP1 and the second floating electrode FLT2 that are integrally provided and coupled to each other before the light emitting elements LD are arranged may function as arrangement electrodes.

After the light emitting elements LD have been arranged, the first connection electrode CP1 and the second floating electrode FTL2 that are integrally provided may be electrically and/or physically separated from each other. Thereby, the second floating electrode FLT2 that is disposed in the first area FA of the first pixel area PXA1 of the first pixel PXL1 may be spaced apart from the first connection electrode CP1 disposed in the emission area EMA of the first pixel area PXA1. After the arrangement of the light emitting elements LD, the first connection electrode CP1 may become, between the first electrode EL1 and the second electrode EL2, a path for the driving current flowing from the first electrode EL1 to the second electrode EL2. Furthermore, after the arrangement of the light emitting elements LD, the second floating electrode FLT2 may float, i.e., be electrically isolated.

Before the light emitting elements LD are arranged in the emission area EMA of the first pixel PXL1, the second connection electrode CP2 may be provided integrally with the third floating electrode FLT3, and thus, coupled to the third floating electrode FLT3. In the case where the second connection electrode CP2 and the third floating electrode FLT3 are integrally provided, the second connection electrode CP2 may be regarded as being a part of the third floating electrode FLT3, or the third floating electrode FLT3 may be regarded as being a part of the second connection electrode CP2. The second connection electrode CP2 and the third floating electrode FLT3 that are integrally provided and coupled to each other before the light emitting elements LD are arranged may function as arrangement electrodes.

After the light emitting elements LD have been arranged, the second connection electrode CP2 and the third floating electrode FTL3 that are integrally provided may be electrically and/or physically separated from each other. Thereby, the third floating electrode FLT3 that is disposed in the first area FA of the first pixel area PXA1 of the first pixel PXL1 may be spaced apart from the second connection electrode CP2 disposed in the emission area EMA of the first pixel area PXA1. After the arrangement of the light emitting elements LD, the second connection electrode CP2 may become a path for the driving current flowing from the first electrode EL1 to the second electrode EL2. Furthermore, after the arrangement of the light emitting elements LD, the third floating electrode FLT3 may float, i.e., be electrically isolated.

Regardless of before or after the light emitting elements LD are arranged in the emission area EMA of the first pixel PXL1, the second electrode EL2 may be provided integrally with the fourth arrangement electrode ARL4, and thus, coupled to the fourth arrangement electrode ARL4. The fourth arrangement electrode ARL4 may be a second power supply line PL2 to which the second driving power supply VSS is to be applied. After the light emitting elements LD have been arranged, the second electrode EL2 and the fourth arrangement electrode ARL4 may function as a driving electrode for driving the light emitting elements LD. For example, the second electrode EL2 and the fourth arrangement electrode ARL4 may function as a cathode electrode of the emission unit EMU of the first pixel PXL1 after the arrangement of the light emitting elements LD.

In the emission area EMA of the first pixel PXL1, the first electrode EL1 and the first connection electrode CP1 may a serial stage (hereinafter, referred to as "first serial stage") along with first light emitting elements LD1 coupled in parallel therebetween. In the emission area EMA of the first pixel PXL1, the first connection electrode CP1 and the first connection electrode CP2 may be another serial stage (hereinafter, referred to as "second serial stage") along with second light emitting elements LD2 coupled in parallel therebetween. In the emission area EMA of the first pixel PXL1, the second connection electrode CP2 and the second electrode EL2 may be another serial stage (hereinafter, referred to as "third serial stage") along with third light emitting elements LD3 coupled in parallel therebetween.

In an embodiment, the first to third serial stages may be disposed in the emission area EMA of the first pixel PXL1. The first to third serial stages may form the emission unit EMU of the corresponding pixel PXL1.

Each of the light emitting elements LD may include a first end electrically coupled to one of two electrodes spaced apart from each other by a predetermined distance, and a second end electrically coupled to the other electrode. The first end of each of the light emitting elements LD may be directly coupled to one of the two electrodes disposed adjacent to each other with a predetermined distance therebetween, or may be coupled to the one electrode through a contact electrode CNE. Furthermore, the second end of each of the light emitting elements LD may be directly coupled to the other electrode of the two adjacent electrodes, or may be coupled to the electrode through another contact electrode CNE.

The light emitting elements LD may be provided and/or arranged on the fifth insulating pattern INSP5 in the emission area EMA of the first pixel PXL1. In an embodiment, the fifth insulating pattern INSP5 may be a component corresponding to the fourth insulating layer INS4 included in the pixel circuit part PCL. Furthermore, the fifth insulating pattern INSP5 provided in the emission area EMA may have the same configuration as that of the fifth insulating pattern INSP5 included in the bank BNK.

The fifth insulating pattern INSP5 may be formed and/or provided under the light emitting elements LD arranged and/or provided between two electrodes spaced apart from each other by a predetermined distance in the emission area EMA. The fifth insulating pattern INSP5 may fill space between the light emitting elements LD and the first insulating layer INS1, and thus, stably support the light emitting elements LD and prevent the light emitting elements LD from being removed from the first insulating layer INS1. For example, the fifth insulating pattern INSP5 may be formed and/or provided under the light emitting elements LD arranged between the first electrode EL1 and the first connection electrode CP1. Furthermore, the fifth insulating pattern INSP5 may be formed and/or provided under the light emitting elements LD arranged between the first connection electrode CP1 and the second connection electrode CP2. In addition, the fifth insulating pattern INSP5 may be formed and/or provided under the light emitting elements LD arranged between the second connection electrode CP2 and the second electrode EL2.

In the emission area EMA of the first pixel PXL1, the fifth insulating pattern INSP5 may expose an area of one of two electrodes spaced apart from each other by a predetermined distance, and cover a remaining area other than the exposed area to protect the remaining area. Furthermore, the fifth insulating pattern INSP5 may expose an area of the other electrode of two electrodes spaced apart from each other by a predetermined distance, and cover a remaining area other than the exposed area to protect the remaining area.

The fifth insulating pattern INSP5 may be an organic insulating layer including an organic material. The organic insulating layer may include, for example, at least one of a polyacrylate resin, epoxy resin, phenolic resin, polyamide resin, polyimide resin, unsaturated polyester resin, polyphenylene ether resin, polyphenylene sulfide resin, and benzocyclobutene resin.

In an embodiment, such as illustrated in FIG. 13, an auxiliary insulating pattern INSP_a may be provided and/or formed on each of the light emitting elements LD. The auxiliary insulating pattern INSP_a may be provided and/or formed on each of the light emitting elements LD to cover the light emitting element LD such that the opposite ends of the light emitting element LD are exposed to the outside. The auxiliary insulating pattern INSP_a may be provided as an independent insulating pattern in the emission area EMA, but embodiments are not limited thereto. After the arrangement of the light emitting elements LD in the emission area EMA have been completed, the auxiliary insulating pattern INSP_a is formed on each light emitting element LD so that the light emitting element LD may be prevented from being removed from the arranged position.

A contact electrode CNE may be provided on each of the first electrode EL1, the first connection electrode CP1, the second connection electrode CP2, and the second electrode EL2.

The contact electrode CNE may be formed of various transparent conductive materials. For example, the contact electrode CNE may include at least one of various conductive materials, e.g., ITO, IZO, and ITZO, and may be substantially transparent or semi-transparent to satisfy a predetermined transmittance. However, the material of the contact electrode CNE is not limited to those of the foregoing embodiments. In some embodiments, the contact electrode CNE may be formed of various opaque conductive materials.

The contact electrode CNE (hereinafter referred to as "first contact electrode") that is formed on the first electrode EL1 may electrically and/or physically couple the first electrode EL1 with one of the opposite ends of each of the first light emitting elements LD1. The first contact electrode CNE may overlap both with one of the opposite ends of each of the first light emitting elements LD1 and with the first electrode EL1. In addition, the first contact electrode CNE may overlap with the stacked pattern LAP disposed under the first electrode EL1, and thus, cover the stacked pattern LAP.

The contact electrode CNE (hereinafter referred to as "second contact electrode") that is formed on the first connection electrode CP1 may electrically and/or physically couple one side of the first connection electrode CP1 with a remaining one of the opposite ends of each of the first light emitting elements LD1. The second contact electrode CNE may electrically and/or physically couple the other side of the first connection electrode CP1 with one of the opposite ends of each of the second light emitting elements LD2. The second contact electrode CNE may overlap with the remaining one of the opposite ends of the corresponding first light emitting element LD1, the one of the opposite ends of each of the second light emitting elements LD2, and the first connection electrode CP1. In addition, the second contact electrode CNE may overlap with the stacked pattern LAP disposed under the first connection electrode CP1, and thus, cover the stacked pattern LAP.

The contact electrode CNE (hereinafter referred to as "third contact electrode") that is formed on the second connection electrode CP2 may electrically and/or physically couple one side of the second connection electrode CP2 with a remaining one of the opposite ends of each of the second light emitting elements LD2. The third contact electrode CNE may electrically and/or physically couple the other side of the second connection electrode CP2 with one of the opposite ends of each of the third light emitting elements LD3. The third contact electrode CNE may overlap with the remaining one of the opposite ends of each of the second light emitting elements LD2, the one of the opposite ends of each of the third light emitting elements LD3, and the second connection electrode CP2. In addition, the third contact electrode CNE may overlap with the stacked pattern LAP disposed under the second connection electrode CP2, and thus, cover the stacked pattern LAP.

The contact electrode CNE (hereinafter referred to as "fourth contact electrode") that is on the second electrode EL2 may electrically and/or physically couple the second electrode EL2 with a remaining one of the opposite ends of each of the third light emitting elements LD3. The fourth contact electrode CNE may overlap both with the remaining one of the opposite ends of each of the third light emitting elements LD3 and with the second electrode EL2. In addition, the fourth contact electrode CNE may overlap with the stacked pattern LAP disposed under the second electrode EL2, and thus, cover the stacked pattern LAP.

The first contact electrode CNE, the second contact electrode CNE, the third contact electrode CNE, and the fourth contact electrode CNE may extend in the second direction DR2 and be disposed in the emission area EMA of the first pixel PXL1. Each of the first contact electrode CNE, the second contact electrode CNE, the third contact electrode CNE, and the fourth contact electrode CNE may be spaced apart from an adjacent contact electrode CNE, and thus, electrically and/or physically separate from the adjacent contact electrode CNE. The first contact electrode CNE, the second contact electrode CNE, the third contact electrode CNE, and the fourth contact electrode CNE may be provided and/or formed in the same layer and include the same material. In an embodiment, each of the first contact electrode CNE, the second contact electrode CNE, the third contact electrode CNE, and the fourth contact electrode CNE may be formed of a fourth conductive layer CL4.

Each of the first contact electrode CNE, the second contact electrode CNE, the third contact electrode CNE, and the fourth contact electrode CNE may have a bar shape extending in the second direction DR2, but embodiments are not limited thereto, and for example, it may be changed in various shapes so long as it can reliably electrically and/or physically couple one electrode disposed thereunder with one of the opposite ends of each of the light emitting elements LD.

An encapsulation layer ENC may be provided and/or formed on the first contact electrode CNE, the second contact electrode CNE, the third contact electrode CNE, and the fourth contact electrode CNE. The encapsulation layer ENC may be a protective member for covering the pixel circuit part PCL and the display element part DPL. The encapsulation layer ENC may be an inorganic insulating layer including inorganic material or an organic insulating layer including an organic material. For example, the encapsulation layer ENC may have a structure formed by alternately stacking at least one or more inorganic layers and at least one or more organic layers.

In an embodiment, the first electrode EL1 of a pair of electrodes, e.g., the first electrode EL1 and the first connection electrode CP1, constituting the first serial stage of the emission unit EMU of the first pixel PXL1 may be electrically coupled with the first transistor T1 of the pixel circuit 144 through the seventh contact hole CH7 and the sixth transistor T6 of the pixel circuit 144.

In the case where driving current flows from the first power supply line PL1 to the second power supply line PL2 via the pixel circuit 144 by the first transistor T1 included in the pixel circuit 144 of the first pixel PXL1, the driving current may be supplied to the emission unit EMU of the first pixel PXL1 through the sixth transistor T6 and the seventh contact hole CH7. For example, driving current may be supplied to the first electrode EL1 through the seventh contact hole CH7. The driving current may flow to the first connection electrode CP1 via the first light emitting elements LD1. Therefore, each of the first light emitting elements LD1 may emit light at a luminance corresponding to distributed current. Driving current flowing through the first connection electrode CP1 may flow to the second connection electrode CP2 via the second light emitting elements LD2. Hence, each of the second light emitting elements LD2 may emit light at a luminance corresponding to distributed current. Driving current flowing through the second connection electrode CP2 may flow to the second electrode EL2 via the third light emitting elements LD3. Hence, each of the third light emitting elements LD3 may emit light at a luminance corresponding to distributed current.

As described above, each of the pixel circuit part PCL and the display element part DPL of the first pixel PXL1 may be provided in a multi-layer structure including at least one or more conductive layers and at least one or more insulating layers that are provided and/or formed on one surface of the substrate SUB. At least one layer of the pixel circuit part PCL and at least one layer of the display element unit PDL may be provided in the same layer, and may have the same material.

In an embodiment, since the pixel circuit part PCL and the display element part DPL of each of the pixels PXL are disposed on the same surface of the substrate SUB, the display device may have a slim structure having a reduced thickness compared to that of a conventional display device in which the display element part DPL is disposed on the pixel circuit part PCL.

According to the foregoing embodiments, the components included in the pixel circuit part PCL and the components included in the display element part DPL are formed through the same process. Therefore, the number of masks may be reduced compared to that of a conventional display device in which the pixel circuit part PCL and the display element part DPL are formed through respective separate processes. Consequently, the process of fabricating the display device may be facilitated. In the case where the display device fabricating process is facilitated, the production cost of the display device may also be reduced.

Furthermore, according to the foregoing embodiments, light emitting elements LD are intensively disposed and arranged in a desired area, e.g., the second area SA in which the display element part DPL of the first pixel area PXA1 of the first pixel PXL1 is disposed. Hence, arrangement distribution of the light emitting elements LD in the first pixel PXL1 and arrangement distribution of light emitting elements LD in adjacent pixels PXL may be uniform. In the case where the arrangement distribution of light emitting elements LD in each pixel PXL uniform, the display device may have uniform light emitting distribution in the overall display area.

Moreover, according to the foregoing embodiments, since the light emitting elements LD are intensively disposed and arranged in the desired area, the problem of contact failure between each of the light emitting elements LD and electrodes to be electrically coupled to the light emitting element LD may be prevented or mitigated. Here, the electrodes to be electrically coupled to the light emitting element LD may include the first and second electrodes EL1 and EL2, the first and second connection electrodes CP1 and CP2, and the contact electrode CNE.

FIGS. 15A to 15G are schematic plan views of the first pixel of FIG. 8 at various stages of manufacture according to some embodiments. FIGS. 16A to 16K are sectional views of the first pixel of FIG. 9 at various stages of manufacture according to some embodiments.

Hereinafter, a method of fabricating the first pixel illustrated in FIGS. 8 and 9 according to an embodiment will be described with reference to FIGS. 15A to 15G and FIGS. 16A to 16K.

Referring to FIGS. 1A to 4B, 5A, 5B, 6E, 8 to 14, 15A, and 16A, the substrate SUB is provided.

The buffer layer BFL is formed on the substrate SUB. In some embodiments, the buffer layer BFL may be omitted.

The semiconductor layer SML is formed on the buffer layer BFL. The semiconductor layer SML may be an undoped semiconductor layer. In an embodiment, although the semiconductor layer SML may be provided on only the first area FA included in the first pixel area PXA1 of the first pixel PXL1, embodiments are not limited thereto. In some embodiments, the semiconductor layer SML may also be provided on the second area SA included in the first pixel area PXA1.

The semiconductor layer SML may be formed of silicon (Si), e.g., amorphous silicon (a-Si), or may be formed of poly-silicon (p-Si). In the case where the semiconductor layer SML is formed of amorphous silicon (a-Si), a crystallization process using a laser may be further performed.

In an embodiment, the semiconductor layer SML may be formed of semiconductor oxide including a two-component compound ($AB_x$), a three-component compound ($AB_xC_y$), a four-component compound ($AB_xC_yD_z$), etc., containing at least one of indium, zinc, tin, gallium, titanium, aluminum, hafnium, zirconium, magnesium, and so forth. These components may be independently used or may be used in combination with each other.

Referring to FIGS. 1A to 4B, 5A, 5B, 6E, 8 to 14, 15B, 16A, and 16B, the first insulating layer INS1 is formed on the overall surface of the substrate SUB including the semiconductor layer SML.

Thereafter, the first conductive layer CL1 of the pixel circuit part PCL and the first conductive layer CL1 of the display element part DPL are formed on the first insulating layer INS1. The first conductive layer CL1 of the pixel circuit part PCL and the first conductive layer CL1 of the display element part DPL are provided in the same layer, include the same material, and are formed through the same process.

In an embodiment, the first conductive layer CL1 of the pixel circuit part PCL may include the i−1-th scan line Si−1, the i-th scan line Si, the i+1-th scan line Si+1, the i-th emission control line Ei, and the first and second lower electrodes LE1 and LE2. The first conductive layer CL1 of the display element part DPL may include the first metal pattern MTP1 and the third metal pattern MTP3.

Subsequently, the semiconductor layer SML is doped with an impurity using the first conductive layer CL1 of the pixel circuit part PCL as a mask. Thereby, areas of the semiconductor layer SML doped with the impurity may become the respective source electrodes SE1, SE2, SE3a, SE3b, SE4a, SE4b, SE5, SE6, and SE7 and the respective drain electrodes DE1, DE2, DE3a, DE3b, DE4a, DE4b, DE5, DE6, and DE7 of the first to seventh transistors T1 to T7.

Simultaneously, the other areas of the semiconductor layer SML that overlap with the first conductive layer CL1 of the pixel circuit part PCL, and thus, are not doped with the impurity may become the respective active patterns ACT1, ACT2, ACT3a, ACT3b, ACT4a, ACT4b, ACT5, ACT6, and ACT7 of the first to seventh transistors T1 to T7.

In an embodiment, an area of the first lower electrode LE1 that overlaps with the first active pattern ACT1 may become the first gate electrode GE1. An area of the i-th scan line Si that overlaps with the second active pattern ACT2 may become the second gate electrode GE2. An area of the i-th scan line Si that overlaps with the 3a-th active pattern ACT3a may become the 3a-th gate electrode GE3a. An area of the i-th scan line Si that overlaps with the 3b-th active pattern ACT3b may become the 3b-th gate electrode GE3b. Furthermore, an area of the i−1-th scan line Si−1 that overlaps with the 4a-th active pattern ACT4a may become the 4a-th gate electrode GE4a. An area of the i−1-th scan line Si−1 that overlaps with the 4b-th active pattern ACT4b may become the 4b-th gate electrode GE4b. An area of the i-th emission control line Ei that overlaps with the fifth active pattern ACT5 may become the fifth gate electrode GE5. An area of the i-th emission control line Ei that overlaps with the sixth active pattern ACT6 may become the sixth gate electrode GE6. An area of the i+1-th scan line Si+1 that overlaps with the seventh active pattern ACT7 may become the seventh gate electrode GE7.

Referring to FIGS. 1A to 4B, 5A, 5B, 6E, 8 to 14, and 16A to 16C, the second insulating layer INS2 is formed on the first conductive layer CL1 of the pixel circuit part PCL, and the first insulating pattern INSP1 and the third insulating pattern INSP3 are formed on the first conductive layer CL2 of the display element part DPL.

The second insulting layer INS2 of the pixel circuit part PCL and the first and third insulating patterns INSP1 and INSP3 of the display element part DPL may be provided in the same layer, include the same material, and formed through the same process.

The first insulating pattern INSP1 of the display element part DPL may be provided on the first metal pattern MTP1, and thus, cover the first metal pattern MTP1. The third insulating pattern INSP3 of the display element part DPL may be provided on the third metal pattern MTP3, and thus, cover the third metal pattern MTP3.

Referring to FIGS. 1A to 4B, 5A, 5B, 6E, 8 to 14, 15C, and 16A to 16D, the second conductive layer CL2 is formed on the second insulating layer INS2 of the pixel circuit part PCL, and the second conductive layer CL2 is formed on each of the first and third insulating patterns INSP1 and INSP3 of the display element part DPL.

The second conductive layer CL2 of the pixel circuit part PCL and the second conductive layer CL2 of the display element part DPL may be provided in the same layer, include the same material, and formed through the same process.

In an embodiment, the second conductive layer CL2 of the pixel circuit part PCL may include the first upper electrode UE1 and the second upper electrode UE2. The second conductive layer CL2 of the display element part DPL may include the second metal pattern MTP2 and the fourth metal pattern MTP4.

The first upper electrode UE1 may include the opening OPN. The first upper electrode UE1 may overlap with the first lower electrode LE1 with the second insulating layer INS2 interposed therebetween, and may form the first capacitor C1 along with the first lower electrode LE1. The second upper electrode UE2 may overlap with the second lower electrode LE2 with the second insulating layer INS2 interposed therebetween, and may form the second capacitor C2 along with the second lower electrode LE2.

The second metal pattern MTP2 may be provided on the first metal pattern MTP1 with the first insulating pattern INSP1 interposed therebetween, and thus, overlap with the first metal pattern MTP1. The fourth metal pattern MTP4 may be provided on the third metal pattern MTP3 with the third insulating pattern INSP3 interposed therebetween, and thus, overlap with the third metal pattern MTP3.

Next, referring to FIGS. 1A to 4B, 5A, 5B, 6E, 8 to 14, and 16A to 16E, the third insulating layer INS3 is formed on the second conductive layer CL2 of the pixel circuit part PCL, and the second and fourth insulating patterns INSP2 and INSP4 are formed on the second conductive layer CL2 of the display element part DPL.

The third insulting layer INS3 of the pixel circuit part PCL and the second and fourth insulating patterns INSP2 and INSP4 of the display element part DPL may be provided in the same layer, include the same material, and formed through the same process.

The third insulating layer INS3 of the pixel circuit part PCL may cover the second conductive layer CL2 disposed under the third insulating layer INS3.

The second insulating pattern INSP2 of the display element part DPL may be provided on the second metal pattern MTP2, and thus, cover the second metal pattern MTP2. Furthermore, the fourth insulating pattern INSP4 of the display element part DPL may be provided on the fourth metal pattern MTP4, and thus, cover the fourth metal pattern MTP4.

In an embodiment, the display element part DPL may include the stacked pattern LAP having a multi-layer structure in which the first metal pattern MTP1, the first insulating pattern INSP1, the second metal pattern MTP2, and the second insulating pattern INSP2 are successively stacked on a surface of the first metal pattern MTP1.

Thereafter, the first to tenth contact holes CH1 to CH10 are formed in the first pixel area PXA1 of the first pixel PXL1.

Next, referring to FIGS. 1A to 4B, 5A, 5B, 6E, 8 to 14, 15D, and 16A to 16F, the third conductive layer CL3 is formed on the third insulating layer INS3 of the pixel circuit part PCL, and the third conductive layer CL3 is formed on each of the second and fourth insulating patterns INSP2 and INSP4 of the display element part DPL.

The third conductive layer CL3 of the pixel circuit part PCL and the third conductive layer CL3 of the display element part DPL may be provided in the same layer, include the same material, and formed through the same process.

In an embodiment, the third conductive layer CL3 of the pixel circuit part PCL may include the initialization power supply line IPL, the j-th data line Dj, the auxiliary connection line AUX, the first power supply line PL1, and the conductive pattern CNP. The third conductive layer CL3 of the display element part DPL may include first to fourth arrangement electrodes ARL1 to ARL4 and the fifth metal pattern MTP5

In an embodiment, the first to fourth arrangement electrodes ARL1 to ARL4 included in the third conductive layer CL3 of the display element part DPL may be provided over both the first area FA and the second area SA of the first pixel area PXA1. Hence, the first to fourth arrangement electrodes ARL1 to ARL4 of the display element part DPL may overlap with some components, e.g., the first and third transistors T1 and T3, the first and second capacitors C1 and C2, the scan lines Si−1, Si, and Si+1, and the i-th emission control line Ei, included in the pixel circuit part PCL.

The fifth metal pattern MTP5 included in the third conductive layer CL3 of the display element part DPL may be a part of the initialization power supply line IPL of the pixel circuit part PCL, a part of the j-th data line Dj, or a part of the first power supply line PL1. The fourth arrangement electrode ARL4 included in the third conductive layer CL3 of the display element part DPL may be the second power supply line PL2 to which the second driving power supply VSS is to be applied.

Each of the first to fourth arrangement electrodes ARL1 to ARL4 included in the third conductive layer CL3 of the display element part DPL may be formed on the corresponding stacked pattern LAP.

Next, referring to FIGS. 1A to 4B, 5A, 5B, 6E, 8 to 14, and 16A to 16G, the fourth insulating layer INS4 is formed in the pixel circuit part PCL, and the fifth insulating pattern INSP5 is formed in the display element part DPL.

The fourth insulating layer INS4 of the pixel circuit part PCL and the fifth insulating pattern INSP5 of the display element part DPL may be provided in the same layer, include the same material, and formed through the same process.

The fifth insulating pattern INSP5 of the display element part DPL may be formed in a space formed between two adjacent arrangement electrodes of the first to fourth arrangement electrodes ARL1 to ARL4. Furthermore, the fifth insulating pattern INSP5 of the display element part DPL may be formed on the fourth insulating pattern INSP4 and the fifth metal pattern MTP5 to cover the fourth insulating pattern INSP4 and the fifth metal pattern MTP5.

In an embodiment, the display element part DPL may include a bank BNK having a multi-layer structure in which the third metal pattern MTP3, the third insulating pattern INSP3, the fourth metal pattern MTP4, the fourth insulating pattern INSP4, and the fifth insulating pattern INSP5 are successively stacked, or a multi-layer structure in which the third metal pattern MTP3, the third insulating pattern INSP3, the fourth metal pattern MTP4, the fourth insulating pattern INSP4, the fifth metal pattern MTP5, and the fifth insulating pattern INSP5 are successively stacked.

Next, referring to FIGS. 1A to 4B, 5A, 5B, 6E, 8 to 14, 15E, and 16A to 16H, arrangement signals (or arrangement voltages) are respectively applied to the first to fourth arrangement electrodes ARL1 to ARL4 so that an electric field is formed between two adjacent arrangement electrodes. For example, in the case where AC power or DC power having a predetermined voltage and period is repeatedly applied several times to each of the first to fourth arrangement electrodes ARL1 to ARL4, an electric field may be formed between two adjacent arrangement electrodes among the first to fourth arrangement electrodes ARL1 to ARL4, the electric field corresponding to a difference between respective potentials of the two adjacent arrangement electrodes.

While the electric fields are formed between the first arrangement electrode ARL1 and the second arrangement electrode ARL2, between the second arrangement electrode ARL2 and the third arrangement electrode ARL3, and between the third arrangement electrode ARL3 and the fourth arrangement electrode ARL4, a mixed solution including light emitting elements LD may be supplied onto the fifth insulating pattern INSP5 by an inkjet printing method or the like. For example, an inkjet nozzle may be disposed on the fifth insulating pattern INSP5, and a solvent containing a plurality of light emitting elements LD may be supplied onto the fifth insulating pattern INSP5 through the inkjet nozzle. Here, the solvent may be any one of acetone, water, alcohol, and toluene, but embodiments are not limited thereto. For example, the solvent may have the form of ink or paste. A method of supplying the light emitting elements LD is not limited to that of the foregoing embodiments. The method of supplying the light emitting elements LD may be changed in various ways.

After the supply of the light emitting elements has been completed, the solvent may be removed.

If the light emitting elements LD are supplied, self-alignment of the light emitting elements LD may be induced by the electric fields respectively formed between the first arrangement electrode ARL1 and the second arrangement electrode ARL2, between the second arrangement electrode ARL2 and the third arrangement electrode ARL3, and between the third arrangement electrode ARL3 and the fourth arrangement electrode ARL4. Hence, the light emitting elements LD may be aligned (or arranged) between the first arrangement electrode ARL1 and the second arrangement electrode ARL2, between the second arrangement electrode ARL2 and the third arrangement electrode ARL3, and between the third arrangement electrode ARL3 and the fourth arrangement electrode ARL4. The light emitting elements LD may be aligned (or arranged) on the fifth insulating pattern INSP5.

In an embodiment, the light emitting elements LD may be coupled in the same direction between two adjacent arrangement electrodes disposed adjacent to each other in the first direction DR1. In some embodiments, the light emitting elements LD may include at least one reverse light emitting element (refer to LDr of FIG. 6D) oriented in a direction opposite to the direction of the light emitting elements LD arranged in the forward direction (in the same direction), depending on the waveforms of arrangement signals (or arrangement voltages) respectively applied to the two adjacent arrangement electrodes.

Next, referring to FIGS. 1A to 4B, 5A, 5B, 6E, 8 to 14, 15F, and 16A to 16I, the first to third arrangement electrodes ARL1 and ARL3 are separated between the first pixel PXL1 and an adjacent pixel PXL by an etching method or the like using a mask so that the first pixel PXL1 may be driven independently (or individually) from the adjacent pixel PXL. The fourth arrangement electrode ARL4 is not separated through the process of separating the first to third arrangement electrodes ARL1 to ARL3, and may be coupled in common to the first pixel PXL1 and the adjacent pixel PXL disposed adjacent to the first pixel PXL1 in the second direction DR2.

In an embodiment, when the first to third arrangement electrodes ARL1 to ARL3 are separated between the first pixel PXL1 and the pixel adjacent thereto, for example, between the second area SA of the first pixel PXL1 and the first area (not illustrated) of the adjacent pixel PXL, a portion of each of the first to third arrangement electrodes ARL1 to ARL3 corresponding to the first area FA may be removed.

As a portion of the first arrangement electrode ARL1 is removed from the first area FA of the first pixel PXL1, the first floating electrode FLT1 may be disposed in the first area FA of the first pixel PXL1, and the first electrode EL1 may be disposed in the second area SA of the first pixel PXL1. The first floating electrode FLT1 and the first electrode EL1 may be disposed on (or in) the same column and spaced apart from each other. In other words, the first floating electrode FLT1 and the first electrode EL1 are electrically and physically separated from each other.

In an embodiment, after the light emitting elements LD have been arranged in the first pixel PXL1, a portion of the first arrangement electrode ARL1 is removed, whereby the first floating electrode FLT1 may be formed in the first area FA of the first pixel PXL1, and the first electrode EL1 may be formed in the second area SA of the first pixel PXL1.

As a portion of the second arrangement electrode ARL2 is removed from the first area FA of the first pixel PXL1, the second floating electrode FLT2 may be disposed in the first area FA of the first pixel PXL1, and the first connection electrode CP1 may be disposed in the second area SA of the first pixel PXL1. The second floating electrode FLT2 and the first connection electrode CP1 may be disposed on (or in) the same column and spaced apart from each other. In other words, the second floating electrode FLT2 and the first connection electrode CP1 are electrically and physically separated from each other.

In an embodiment, after the light emitting elements LD have been arranged in the first pixel PXL1, a portion of the second arrangement electrode ARL2 is removed, whereby the second floating electrode FLT2 may be formed in the first area FA of the first pixel PXL1, and the first connection electrode CP1 may be formed in the second area SA of the first pixel PXL1.

As a portion of the third arrangement electrode ARL3 is removed from the first area FA of the first pixel PXL1, the third floating electrode FLT3 may be disposed in the first area FA of the first pixel PXL1, and the second connection electrode CP2 may be disposed in the second area SA of the first pixel PXL1. The third floating electrode FLT3 and the second connection electrode CP2 may be disposed on (or in) the same column and spaced apart from each other. In other words, the third floating electrode FLT3 and the second connection electrode CP2 are electrically and physically separated from each other.

In an embodiment, after the light emitting elements LD have been arranged in the first pixel PXL1, a portion of the third arrangement electrode ARL3 is removed, whereby the third floating electrode FLT3 may be formed in the first area FA of the first pixel PXL1, and the second connection electrode CP2 may be formed in the second area SA of the first pixel PXL1.

In an embodiment, the fourth arrangement electrode ARL4 that is disposed over the first area FA and the second area SA of the first pixel PXL1 may function as the second electrode EL2 after the light emitting elements LD have been arranged.

Next, referring to FIGS. 1A to 4B, 5A, 5B, 6E, 8 to 14, 15G, and 16A to 16J, the fourth conductive layer CL4 is formed on each of the first and second electrodes EL1 and EL2 and the first and second connection electrodes CP1 and CP2 of the display element part DPL.

In an embodiment, the fourth conductive layer CL4 may include a contact electrode CNE. The contact electrode CNE may be provided and/or formed on each of the first electrode EL1, the first connection electrode CP1, the second connection electrode CP2, and the second electrode EL2.

The contact electrode CNE provided on the first electrode EL1 may be electrically and/or physically coupled to the first electrode EL1 in such a way that the contact electrode CNE directly formed on the first electrode EL1. The contact electrode CNE provided on the first connection electrode CP1 may be electrically and/or physically coupled to the first connection electrode CP1 in such a way that the contact electrode CNE is directly formed on the first connection electrode CP1. The contact electrode CNE provided on the second connection electrode CP2 may be electrically and/or physically coupled to the second connection electrode CP2 in such a way that the contact electrode CNE is directly formed on the second connection electrode CP2. The contact electrode CNE provided on the second electrode EL2 may be electrically and/or physically coupled to the second electrode EL2 in such a way that the contact electrode CNE is directly formed on the second electrode EL2.

The contact electrode CNE provided on the first electrode ELL the contact electrode CNE provided on the first connection electrode CP1, the contact electrode CNE provided on the second connection electrode CP2, and the contact electrode CNE provided on the second electrode EL2 may be formed of the same conductive material, and provided and/or formed in the same layer.

Next, referring to FIGS. 1A to 4B, 5A, 5B, 6E, 8 to 14, and 16A to 16K, the encapsulation layer ENC is formed on the fourth insulating layer INS4 of the pixel circuit part PCL and the contact electrode CNE of the display element part DPL.

The encapsulation layer ENC may include an inorganic insulating layer formed of inorganic material or an organic insulating layer formed of organic material. Although the encapsulation layer ENC may have a single layer structure as shown in the drawing, embodiments are not limited thereto. For example, the encapsulation layer ENC may have a multi-layer structure.

Figure 17:
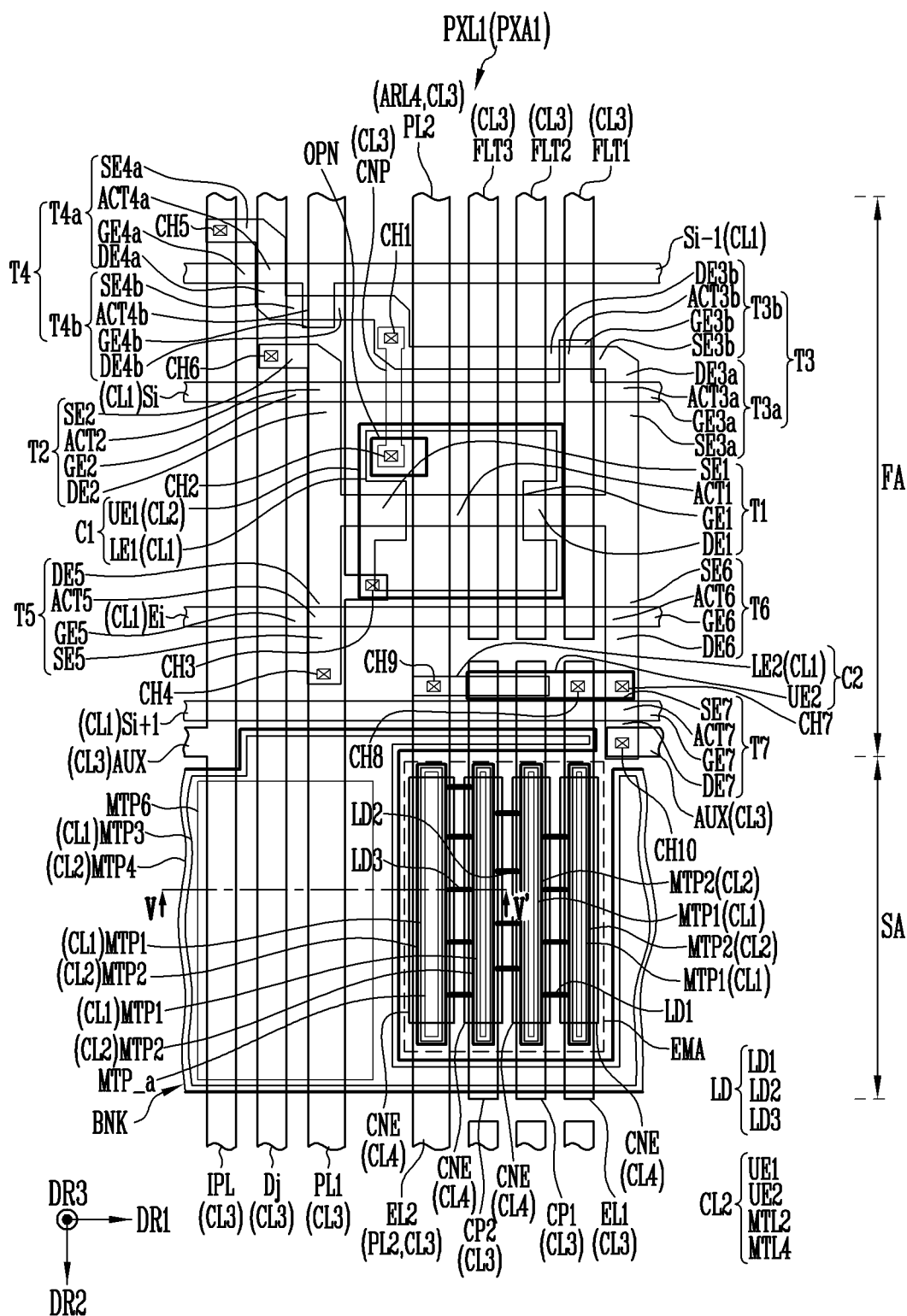
FIG. 17 is a plan view illustrating the first pixel of FIG. 7 according to an embodiment.
Figure 18:
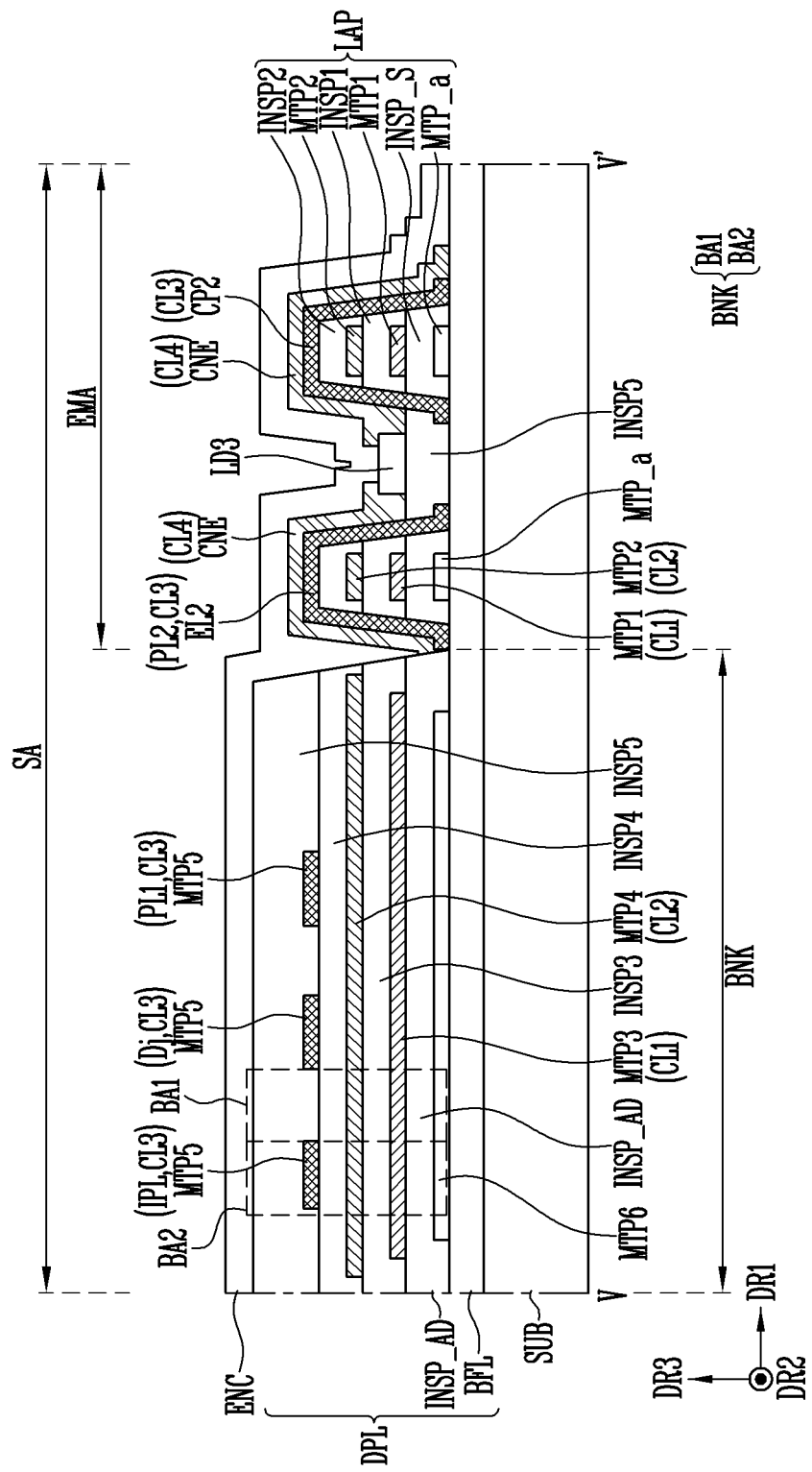
FIG. 18 is a sectional view taken along sectional line V-V' of FIG. 17 according to an embodiment.

FIG. 17 is a plan view illustrating the first pixel of FIG. 7 according to an embodiment. FIG. 18 is a sectional view taken along sectional line V-V' of FIG. 17 according to an embodiment.

The configuration of the first pixel PXL1 illustrated in FIGS. 17 and 18, other than the fact that the stacked pattern LAP further includes a first auxiliary pattern MTP_a disposed under a first metal pattern MTP1 and the bank BNK further includes a second auxiliary pattern MTP6 disposed under the third metal pattern MTP3, may be substantially equal to or similar to that of the first pixel PXL1 of FIG. 8.

Therefore, to avoid redundant explanation, the description of the first pixel PXL1 of FIGS. 17 and 18 will be focused on differences from that of the foregoing embodiments. Components that are not separately explained in the following description comply with that of the foregoing description. The same reference numeral will be used to designate the same component, and a similar reference numeral will be used to designate a similar component.

Referring to FIGS. 1A to 4B, 5A, 5B, 6E, 7, 17, and 18, the first pixel PXL1 may be a pixel disposed on an intersection of an i-th pixel row and a j-th pixel column. In a display area DA of a substrate SUB, an area in which the first pixel PXL1 is disposed may be a first pixel area PXA1. The first pixel area PXA1 may include an emission area EMA from which light is emitted, and a peripheral area which encloses the periphery of the emission area EMA and does not emit light.

The first pixel PXL1 may be electrically coupled to each of scan lines Si−1, Si, and Si+1, a j-th data line Dj, an i-th emission control line Ei, an initialization power supply line IPL, and first and second power supply lines PL1 and PL2 that are disposed in the first pixel area PXA1.

The first pixel area PXA1 in which the first pixel PXL1 is provided may include a first area FA and a second area SA that are divided in one direction. The substrate SUB and a pixel circuit part PCL, which is provided on the substrate SUB and includes a pixel circuit 144, may be disposed in the first area FA. The substrate SUB and a display element part DPL include light emitting elements LD may be disposed in the second area SA. The emission area EMA of the first pixel area PXA1 may be included in the second area SA.

The pixel circuit part PCL may include a buffer layer BFL provided on the substrate SUB, and the pixel circuit 144 provided and/or formed on the buffer layer BFL. In an embodiment, the pixel circuit 144 may include first to seventh transistors T1 to T7 and first and second capacitors C1 and C2.

The display element part DPL may include a stacked pattern LAP, first and second electrodes EL1 and EL2, first and second connection electrodes CP1 and CP2, light emitting elements LD, and a contact electrode CNE that are provided in the emission area EMA. Furthermore, the display element part DPL may include a bank BNK provided in a peripheral area disposed around the emission area EMA.

The stacked pattern LAP may be a support member for supporting the first and second electrodes EL1 and EL2 and the first and second connection electrodes CP1 and CP2 to change respective surface profiles of the first and second electrodes EL1 and EL2 and the first and second connection electrodes EL1 and EL2 so that light emitted from the light emitting elements LD may be more reliably advanced in an image display direction of the display device.

The stacked pattern LAP may be provided in a multi-layer structure including at least one insulating layer and at least one conductive layer that are provided and/or formed on the buffer layer BFL. For example, as illustrated in FIG. 18, the stacked pattern LAP may be provided in a multi-layer structure in which a first auxiliary pattern MTP_a, a sub-insulating pattern INSP_S, a first metal pattern MTP1, a first insulating pattern INSP1, a second metal pattern MTP2, and a second insulating pattern INSP2 are successively stacked on a surface (e.g., an upper surface) of the buffer layer BFL. However, embodiments are not limited thereto. In an embodiment, the stacked pattern LAP may not include the first auxiliary pattern MTP_a and the sub-insulating pattern INSP_S.

The stacked pattern LAP including the first auxiliary pattern MTP_a, the sub-insulating pattern INSP_S, the first metal pattern MTP1, the first insulating pattern INSP1, the second metal pattern MTP2, and the second insulating pattern INSP2 may have a shape protruding upward from the surface (e.g., the upper surface) of the buffer layer BFL.

The bank BNK may be a structure that defines (or separates) the first pixel PXL1 and emission areas EMA of pixels PXL adjacent to the first pixel PXL1. For example, the bank BNK may be a pixel define (or definition) layer.

The bank BNK may be disposed in the peripheral area enclosing the periphery of the emission area EMA and include at least two or more conductive layers and at least two or more insulating layers, and thus, prevent (or mitigate) light from leaking between the first pixel PXL1 and the pixels adjacent thereto.

In an embodiment, the bank BNK may include at least two or more insulating layers and at least two or more conductive layers that are provided and/or formed on the buffer layer BFL. For example, the bank BNK may be provided in a multi-layer structure in which a second auxiliary pattern MTP6, an additional insulating pattern INSP_AD, a third metal pattern MTP3, a third insulating pattern INSP3, a fourth metal pattern MTP4, a fourth insulating pattern INSP4, and a fifth insulating pattern INSP5 are successively stacked. Furthermore, the bank BNK may further include a fifth metal pattern MTP5 provided and/or formed between the fourth insulating pattern INSP4 and the fifth insulating pattern INSP5.

The bank BNK may be divided into a first bank area BA1 and a second bank area BA2 depending on whether the fifth metal pattern MTP5 is included in the stacked multi-layer structure. For example, the first bank area BA1 may mean an area of the bank BNK that does not include the fifth metal pattern MTP5. The second bank area BA2 may mean an area of the bank BNK that includes the fifth metal pattern MTP5.

For example, the first bank area BA1 may be an area of the bank BNK that has a multi-layer structure in which a second auxiliary pattern MTP6, an additional insulating pattern INSP_AD, a third metal pattern MTP3, a third insulating pattern INSP3, a fourth metal pattern MTP4, a fourth insulating pattern INSP4, and a fifth insulating pattern INSP5 are successively stacked. For example, the second bank area BA1 may be an area of the bank BNK that has a multi-layer structure in which a second auxiliary pattern MTP6, an additional insulating pattern INSP_AD, a third metal pattern MTP3, a third insulating pattern INSP3, a fourth metal pattern MTP4, a fourth insulating pattern INSP4, the fifth metal pattern MTP5, and a fifth insulating pattern INSP5 are successively stacked.

The second auxiliary pattern MTP6 may be formed of a semiconductor layer provided and/or formed over the buffer layer BFL. In an embodiment, the second auxiliary pattern MTP6 may be provided on the same layer both as the semiconductor layer included in the pixel circuit part PCL and as the first auxiliary pattern MTP_a included in the stacked pattern LAP, and may include the same material as that of the semiconductor layer and the first auxiliary pattern MTP_a.

The additional insulating pattern INSP_AD may be provided and formed on the second auxiliary pattern MTP6 and enclose the second auxiliary pattern MTP6. For example, the additional insulating pattern INSP_AD may be an independent insulating pattern that encloses only the second auxiliary pattern MTP6. In an embodiment, the additional insulating pattern INSP_AD may have the same configuration as that of the sub-insulating pattern INSP_S included in the stacked pattern LAP. The additional insulating pattern INSP_AD included in the bank BNK and the sub-insulating pattern INSP_S included in the stacked pattern LAP each may be a component corresponding to the first insulating layer (refer to INS1 of FIG. 9) included in the pixel circuit part PCL. The additional insulating pattern INSP_AD included in the bank BNK and the sub-insulating pattern INSP_S included in the stacked pattern LAP may be provided in the same layer as the first insulating layer INS1 included in the pixel circuit part PCL, include the same material as that of the first insulating layer INS1, and may be formed through the same process as that of the first insulating layer INS1.

The third metal pattern MTP3 may be formed of a first conductive layer CL1 provided and/or formed on the sub-insulating layer INSP_S. In an embodiment, the third metal pattern MTP3 may be provided on the same layer as the first metal pattern MTP1 included in the stacked pattern LAP, and may include the same material as that of the first metal pattern MTP1.

The third insulating pattern INSP3 may be provided on the third metal pattern MTP3 and configured to enclose the third metal pattern MTP3. For example, the third insulating pattern INSP3 may be an independent insulating pattern that encloses only the third metal pattern MTP3. In an embodiment, the third insulating pattern INSP3 may be provided in the same layer as the first insulating pattern INSP1 included in the stacked pattern LAP, and may include the same material as that of the first insulating pattern INSP1. The third insulating pattern INSP3 included in the bank BNK and the first insulating pattern INSP1 included in the stacked pattern LAP each may be a component corresponding to the second insulating layer (refer to INS2 of FIG. 9) included in the pixel circuit part PCL. In an embodiment, the third insulating pattern INSP3 included in the bank BNK and the first insulating pattern INSP1 included in the stacked pattern LAP may be provided in the same layer as the second insulating layer INS2 included in the pixel circuit part PCL, include the same material as that of the second insulating layer INS2, and may be formed through the same process as that of the second insulating layer INS2.

The fourth metal pattern MTP4 may be formed of a second conductive layer CL2 provided and/or formed on the third insulating pattern INSP3. In an embodiment, the fourth metal pattern MTP4 may be provided on the same layer as the second metal pattern MTP2 included in the stacked pattern LAP, and may include the same material as that of the second metal pattern MTP2.

The fourth insulating pattern INSP4 may be provided on the fourth metal pattern MTP4 and configured to enclose the fourth metal pattern MTP4. For example, the fourth insulating pattern INSP4 may be an independent insulating pattern that encloses only the fourth metal pattern MTP4. In an embodiment, the fourth insulating pattern INSP4 may be provided in the same layer as the second insulating pattern INSP2 included in the stacked pattern LAP, and may include the same material as that of the second insulating pattern INSP2. The fourth insulating pattern INSP4 included in the bank BNK and the second insulating pattern INSP2 included in the stacked pattern LAP each may be a component corresponding to the third insulating layer (refer to INS3 of FIG. 9) included in the pixel circuit part PCL. In an embodiment, the fourth insulating pattern INSP4 included in the bank BNK and the second insulating pattern INSP2 included in the stacked pattern LAP may be provided in the same layer as the third insulating layer INS3 included in the pixel circuit part PCL, include the same material as that of the third insulating layer INS3, and may be formed through the same process as that of the third insulating layer INS3.

The fifth metal pattern MTP5 may be formed of a third conductive layer CL3 provided and/or formed on the fourth insulating pattern INSP4. In an embodiment, the fifth metal pattern MTP5 may include signal lines, which extend from the first area FA of the first pixel area PXA1 and cross the second area SA. For example, the fifth metal pattern MTP5 may include the initialization power supply line IPL, the j-th data line Dj, and the first power supply line PL1.

The fifth insulating pattern INSP5 may be provided on each of the fifth metal pattern MTP5 and the fourth insulating pattern INSP4 and may enclose the fifth metal pattern MTP5 and the fourth insulating pattern INSP4. In an embodiment, the fifth insulating pattern INSP5 may be a component corresponding to the fourth insulating layer INS4 included in the pixel circuit part PCL. In an embodiment, the fifth insulating pattern INSP5 included in the bank BNK and the fourth insulating layer INS4 included in the pixel circuit part PCL may be provided in the same layer, include the same material, and may be formed through the same process.

The bank BNK having the above-mentioned configuration may have a shape protruding a predetermined height (or thickness) from the surface (e.g., the upper surface) of the buffer layer BFL in an upward direction, e.g., the third direction DR3.

In an embodiment, since the pixel circuit part PCL and the display element part DPL are disposed on the same surface of the substrate SUB, the display device may have a slim structure having a reduced thickness compared to that of a conventional display device in which the display element part DPL is disposed on the pixel circuit part PCL.

According to the foregoing embodiments, the components included in the pixel circuit part PCL and the components included in the display element part DPL are formed through the same process. Therefore, the number of masks may be reduced compared to that of a conventional display device in which the pixel circuit part PCL and the display element part DPL are formed through respectively separate processes. Consequently, the process of fabricating the display device may be facilitated. In the case where the display device fabricating process is facilitated, the production cost of the display device may also be reduced.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
a substrate comprising:
a display area comprising pixel areas, each pixel area among the pixel areas comprising a first area and a second area;
a non-display area enclosing at least one side of the display area; and
pixels disposed on the pixel areas, each pixel among the pixels comprising light emitting elements,
wherein each pixel among the pixel further comprises:
a pixel circuit part disposed on the first area, the pixel circuit part comprising at least one transistor and at least one capacitor; and
a display element part disposed on the second area, the display element part comprising an emission area configured to emit light, a first electrode disposed in the emmission area, a second electrode disposed in the emission area and spaced apart from the first electrode, and the light emitting elements disposed between the first electrode and the second electrode,
wherein each of the light emitting elements includes a first end connected to the first electrode, and a second end connected to the second electrode and not overlapping the first end in a plan view,
wherein each of the pixel circuit part and the display element part has a multi-layer structure comprising one or more conductive layers and one or more insulating layers, and
wherein at least one layer of the pixel circuit part and at least one layer of the display element part are disposed in a same layer.

2. A display device comprising:
a substrate comprising:
a display area comprising pixel areas, each pixel area among the pixel areas comprising a first area and a second area;
a non-display area enclosing at least one side of the display area; and
pixels disposed on the pixel areas, each pixel among the pixels comprising light emitting elements, wherein
each pixel among the pixels includes:
a pixel circuit part disposed on the first area, the pixel circuit part comprising at least one transistor and at least one capacitor; and
a display element part disposed on the second area, the display element part comprising an emission area configured to emit light,
each of the pixel circuit part and the display element part has a multi-layer structure comprising one or more conductive layers and one or more insulating layers,
at least one layer of the pixel circuit part and at least one layer of the display element part are disposed in a same layer,
the one or more insulating layers included in each of pixel circuit part and the display element part comprise first to fourth insulating layers sequentially stacked on the substrate; and
the one or more conductive layers included in each of pixel circuit part and the display element part comprise:
a first conductive layer disposed on the first insulating layer;
a second conductive layer disposed on the second insulating layer; and
a third conductive layer disposed on the third insulating layer.

3. The display device of claim 2, wherein the at least one transistor comprises:
an active pattern disposed on the substrate;
a gate electrode disposed on the active pattern, the first insulating layer being interposed between the gate electrode and the active pattern;
a first terminal coupled to a first end of the active pattern; and
a second terminal coupled to a second end of the active pattern, the second end being opposite the first end.

4. The display device of claim 3, wherein:
the first conductive layer of the pixel circuit part comprises a scan line configured to transmit a scan signal to the pixel, a lower electrode of the capacitor, and the gate electrode;
the second conductive layer of the pixel circuit part comprises an upper electrode overlapping with the lower electrode of the capacitor; and
the third conductive layer of the pixel circuit part comprises a data line configured to transmit a data signal to at least one pixel among the pixels.

5. The display device of claim 4, wherein the display element part comprises:
stacked patterns respectively disposed between the substrate and the first electrode and between the substrate and the second electrode; and
a contact electrode disposed on each of the first and the second electrodes.

6. The display device of claim 5, wherein the first and the second electrodes are included in the third conductive layer of the display element part and are disposed in a same layer as the data line.

7. The display device of claim 6, wherein each of the stacked patterns comprises:
a first metal pattern disposed on the first insulating layer;
the second insulating layer disposed on and covering the first metal pattern;
a second metal pattern disposed on the second insulating layer and overlapping with the first metal pattern; and
the third insulating layer disposed on and covering the second metal pattern.

8. The display device of claim 7, wherein:
each of the stacked patterns comprises a structure in which the first metal pattern, the second insulating layer, the second metal pattern, and the third insulating layer are sequentially stacked;
the first metal pattern is included in the first conductive layer of the display element part; and
the second metal pattern is included in the second conductive layer of the display element part.

9. The display device of claim 8, wherein:
the first metal pattern is provided in a same layer as the lower electrode of the capacitor, the scan line, and the gate electrode; and
the second metal pattern is provided in a same layer as the upper electrode of the capacitor.

10. The display device of claim 6, wherein:
each of the stacked patterns comprises:
a first auxiliary pattern disposed on the substrate;
the first insulating layer disposed on and covering the first auxiliary pattern;
a first metal pattern disposed on the first insulating layer;
the second insulating layer disposed on the first metal pattern and covering the first metal pattern;

a second metal pattern disposed on the second insulating layer; and the third insulating layer disposed on and covering the second metal pattern; and the first auxiliary pattern is disposed in a same layer as the active pattern.

11. The display device of claim 10, wherein each of the stacked patterns comprises a structure in which the first auxiliary pattern, the first insulating layer, the first metal pattern, the second insulating layer, the second metal pattern, and the third insulating layer are sequentially stacked.

12. The display device of claim 6, wherein:

in the pixel circuit part, the fourth insulating layer is disposed on and covers the data line; and in the display element part, the fourth insulating layer covers a side of each of the first and second electrodes.

13. The display device of claim 12, wherein each of the light emitting elements is disposed on the fourth insulating layer between the first electrode and the second electrode.

14. The display device of claim 13, wherein:

the display element part further comprises a fourth conductive layer disposed on the third conductive layer; and the fourth conductive layer comprises the contact electrode.

15. The display device of claim 14, wherein:

the display element part further comprises a bank disposed around the emission area; and the bank comprises a multi-layer structure comprising two or more conductive layers and two or more insulating layers.

16. The display device of claim 15, wherein:

the bank comprises a first bank area and a second bank area that have different stack structures;

the first bank area comprises:

a third metal pattern disposed on the first insulating layer;

the second insulating layer disposed on and covering the third metal pattern;

a fourth metal pattern disposed on the second insulating layer;

the third insulating layer disposed on and covering the fourth metal pattern; and the fourth insulating layer disposed on the third insulating layer; and the second bank area comprises:

the third metal pattern;

the second insulating layer;

the fourth metal pattern;

the third insulating layer;

the third conductive layer disposed on the third insulating layer; and the fourth insulating layer disposed on the third conductive layer.

17. The display device of claim 16, wherein:

the third metal pattern is disposed in a same layer as the first metal pattern; and the fourth metal pattern is disposed in a same layer as the second metal pattern.

18. The display device of claim 15, wherein:

the bank comprises a first bank area and a second bank area that have different stack structures;

the first bank area comprises:

a second auxiliary pattern disposed on the substrate;

the first insulating layer disposed on and covering the second auxiliary pattern;

a third metal pattern disposed on the first insulating layer;

the second insulating layer disposed on and covering the third metal pattern;

a fourth metal pattern disposed on the second insulating layer;

the third insulating layer disposed on and covering the fourth metal pattern; and the fourth insulating layer disposed on the third insulating layer; and the second bank area comprises:

the second auxiliary pattern;

the first insulating layer;

the third metal pattern;

the second insulating layer;

the fourth metal pattern;

the third insulating layer;

the third conductive layer disposed on the third insulating layer; and the fourth insulating layer disposed on the third conductive layer.

19. The display device of claim 18, wherein:

the second auxiliary pattern is disposed in a same layer as the active pattern, the third metal pattern is disposed in a same layer as the first metal pattern; and the fourth metal pattern is disposed in a same layer as the second metal pattern.

* * * * *